(12) United States Patent
Chung et al.

(10) Patent No.: US 12,745,477 B2
(45) Date of Patent: Sep. 22, 2026

(54) PIXEL WITH DUAL-PD LAYOUT

(71) Applicant: Taiwan Semiconductor Manufacturing Company, Ltd., Hsinchu (TW)

(72) Inventors: Chi-Hsien Chung, New Taipei City (TW); Tzu-Jui Wang, Fengshan City (TW); Chia-Chi Hsiao, Tianzhong Township (TW); Chen-Jong Wang, Hsin-Chu (TW); Dun-Nian Yaung, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 591 days.

(21) Appl. No.: 18/324,415

(22) Filed: May 26, 2023

(65) Prior Publication Data

US 2024/0290810 A1 Aug. 29, 2024

Related U.S. Application Data

(60) Provisional application No. 63/486,736, filed on Feb. 24, 2023.

(51) Int. Cl.
*H10F 39/00* (2025.01)
*H10F 39/18* (2025.01)

(52) U.S. Cl.
CPC ......... *H10F 39/809* (2025.01); *H10F 39/018* (2025.01); *H10F 39/18* (2025.01); *H10F 39/8023* (2025.01); *H10F 39/807* (2025.01)

(58) Field of Classification Search
CPC ...... H10F 39/809; H10F 39/018; H10F 39/18; H10F 39/8023; H10F 39/807;
(Continued)

(56) References Cited

U.S. PATENT DOCUMENTS 8,629,524 B2 1/2014 Wang et al.
8,957,358 B2 2/2015 Wan et al.
(Continued)

FOREIGN PATENT DOCUMENTS

KR 20160017623 A 2/2016

OTHER PUBLICATIONS

Zaitsu et al. "A 2-Layer Transistor Pixel Stacked CMOS Image Sensor with Oxide-Based Full Trench Isolation for Large Full Well Capacity and High Quantum Efficiency" 2022 IEEE Symposium on VLSI Technology and Circuits (VLSI Technology and Circuits), published on Jul. 22, 2022.
(Continued)

*Primary Examiner* — Tucker J Wright
(74) *Attorney, Agent, or Firm* — Eschweiler & Potashnik, LLC

(57) ABSTRACT

Various embodiments of the present disclosure are directed towards an image sensor comprising a pixel with a dual-PD layout for enhanced scaling down. The pixel spans a first integrated circuit (IC) die and a second IC die stacked with the first IC die. The pixel comprises a plurality of photodetectors in the first IC die, and further comprises a plurality of pixel transistors split amongst the first IC die and the second IC die. The plurality of photodetectors are grouped into one or more pairs, each having the dual-PD layout. A DTI structure completely and individually surrounds the plurality of photodetectors, and further extends completely through a substrate within which the plurality of photodetectors are arranged. As such, the DTI structure completely separates the plurality of photodetectors from each other.

20 Claims, 41 Drawing Sheets

(58) Field of Classification Search
CPC .. H10F 39/199; H10F 39/8053; H10F 39/811; H10F 39/813; H10F 39/802; H10F 39/014; H10F 39/182; H10F 39/8037
See application file for complete search history.

(56) References Cited

U.S. PATENT DOCUMENTS

| | | | | |
|---|---|---|---|---|
| 9,136,302 | B2 | 9/2015 | Wang et al. | |
| 10,090,349 | B2 | 10/2018 | Wan et al. | |
| 11,063,081 | B2 | 7/2021 | Sze et al. | |
| 2017/0062496 | A1* | 3/2017 | Lai | H10F 39/8053 |
| 2022/0078364 | A1 | 3/2022 | Kim et al. | |
| 2022/0271070 | A1 | 8/2022 | Nakazawa et al. | |
| 2022/0384493 | A1 | 12/2022 | Takatsuka et al. | |
| 2022/0392941 | A1 | 12/2022 | Kwon et al. | |
| 2022/0406825 | A1 | 12/2022 | Jin et al. | |
| 2023/0262362 | A1 | 8/2023 | Kitano | |

OTHER PUBLICATIONS

U.S. Appl. No. 17/837,534, filed Jun. 10, 2022.
U.S. Appl. No. 17/845,624, filed Jun. 21, 2022.
U.S. Appl. No. 17/749,457, filed May 20, 2022.

* cited by examiner

PIXEL WITH DUAL-PD LAYOUT

REFERENCE TO RELATED APPLICATION

This application claims the benefit of U.S. Provisional Application No. 63/486,736, filed on Feb. 24, 2023, the contents of which are incorporated by reference in their entirety.

BACKGROUND

Integrated circuits (ICs) with image sensors are used in a wide range of modern-day electronic devices, such as, for example, cameras, cell phones, and the like. Types of image sensors include, for example, complementary metal-oxide semiconductor (CMOS) image sensors and charge-coupled device (CCD) image sensors. Compared to CCD image sensors, CMOS image sensors are increasingly favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
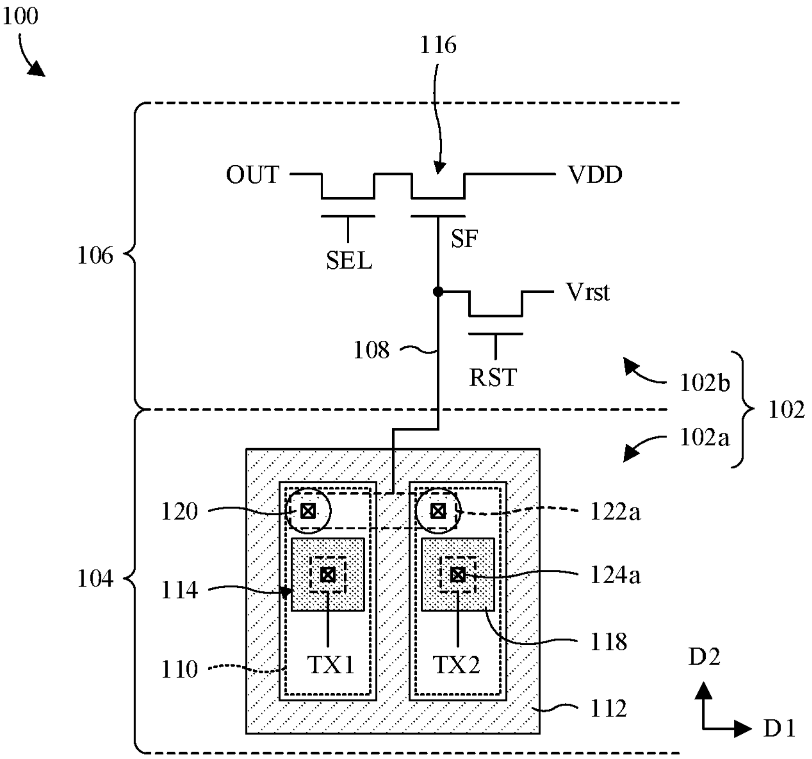
FIG. 1 illustrates a schematic view of some embodiments of an image sensor comprising a pixel that has a dual-photodetector (PD) layout and that spans a first integrated circuit (IC) die and a second IC die.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An image sensor may comprise a first integrated circuit (IC) die and a second IC die that are stacked. The first IC die accommodates a plurality of pixels, and the second IC die accommodates an application-specific IC (ASIC) electrically coupled to each pixel. Further, each of the plurality of pixels may be a dual-photodetector (PD) pixel, which comprises a pair of photodetectors and a plurality of pixel transistors. Because of the pair of photodetectors, the dual-PD pixel can detect different phases of light and can therefore be used individually for phase detection autofocus (PDAF). Because every pixel of the image sensor may be a dual-PD pixel, every pixel may be used for PDAF and may therefore aid in calculating phase differences and focus. This improves the accuracy and the speed of PDAF.

The pair of photodetectors may be separated from each other by an implant isolation region. However, the implant isolation region is large and hence consumes area that would otherwise be used by the pair of photodetectors. Further, the implant isolation region does not prevent optical crosstalk between the pair of the photodetectors. Hence, the implant isolation region may negatively impact performance of the pair of photodetectors (e.g., full well capacity (FWC) or the like). A deep trench isolation (DTI) structure may be used with implant isolation to reduce optical crosstalk. However, this consumes even more area than the implant isolation region alone. Further, the DTI structure has a cut between the pair of photodetectors to accommodate a pickup region for the implant isolation region. As such, optical crosstalk may still occur at the cut and performance may still be degraded.

Additionally, the semiconductor manufacturing industry continuously seeks to scale down image sensors to achieve lower fabrication costs, higher device integration density, higher speeds, better performance, and so on. However, the plurality of pixel transistors and overhead (e.g., isolation or the like) from the dual-PD layout consume a large amount of area that would otherwise be usable for the pair of photodetectors. Further, the plurality of pixel transistors are reaching scaling limits. Hence, it's proving difficult to continue scaling down the dual-PD pixel without sacrificing performance (e.g., FWC or the like).

Various embodiments of the present disclosure are directed towards an image sensor comprising a pixel with a dual-PD layout for enhanced scaling down of the image sensor. The pixel spans a first IC die and a second IC die stacked with the first IC die. The pixel comprises a plurality of photodetectors in the first IC die, and further comprises a plurality of pixel transistors split amongst the first IC die and the second IC die. The plurality of photodetectors are grouped into one or more pairs, each having the dual-PD layout. A DTI structure completely and individually surrounds the plurality of photodetectors, and further extends completely through a substrate within which the plurality of photodetectors are arranged. As such, the DTI structure completely separates the plurality of photodetectors from each other.

Because some of the plurality of pixel transistors are moved to the second IC die, area that would otherwise be used by these pixel transistors may be used by the plurality of photodetectors. Hence, the plurality of photodetectors may be larger than they would otherwise be, thereby allowing enhanced performance (e.g., FWC or the like) and/or enhanced scaling down of the pixel. Because the DTI structure completely separates the plurality of photodetectors from each other, optical crosstalk between the plurality of photodetectors is prevented and performance (e.g., FWC or the like) may be enhanced.

With reference to FIG. 1, a schematic view 100 of some embodiments of an image sensor is provided in which a pixel 102 has a dual-PD layout and spans a first IC die 104 and a second IC die 106. A first portion 102*a* of the pixel 102 is at the first IC die 104 and is illustrated by a top layout view, whereas a second portion 102*b* of the pixel 102 is at the second IC die 106 and is illustrated by a circuit diagram. Further, the first and second portions 102*a*, 102*b* are electrically coupled together by conductive paths 108.

The pixel 102 comprises a plurality of photodetectors 110 at the first IC die 104. For example, the pixel 102 has a total of two photodetectors 110 as illustrated, whereby the pixel 102 may also be referred to as a dual-PD pixel. Further, the pixel 102 has a horizontal orientation in that the plurality of photodetectors 110 are spaced from each other in a first dimension D1, which is orthogonal to a second dimension D2. As seen hereafter, the first dimension D1 may, for example, correspond to a row-wise dimension of a pixel array, and the second dimension D2 may, for example, correspond to a column-wise dimension of the pixel array.

Because of the plurality of photodetectors 110, the pixel 102 can be used individually for PDAF. For example, a left photodetector may measure a first phase of incident light, and a right photodetector may measure a second phase of incident light. Further, focus may be adjusted (e.g., by moving a lens and/or the like) until signals from the left and right photodetectors overlap and/or match.

A DTI structure 112 completely separates the plurality of photodetectors 110 from each other. The DTI structure 112 individually and continuously surrounds the plurality of photodetectors 110. In other words, the DTI structure 112 extends continuously in a closed path around each photodetector to individually surround that photodetector. Further, the DTI structure 112 is a full DTI structure in that the DTI structure 112 extends fully through a semiconductor substrate in which the plurality of photodetectors 110 are arranged.

Because the DTI structure 112 completely separates the plurality of photodetectors 110 from each other, the DTI structure 112 is devoid of an opening or cut between the plurality of photodetectors 110. Accordingly, the DTI structure 112 may provide perfect or near perfect electrical and/or optical isolation between the plurality of photodetectors 110. This reduces optical crosstalk between the plurality of photodetectors 110, which may, for example, enhance performance (e.g., FWC or the like) of the plurality of photodetectors 110.

The pixel 102 further comprises a plurality of first pixel transistors 114 at the first IC die 104 and a plurality of second pixel transistors 116 at the second IC die 106. The plurality of first pixel transistors 114 and the plurality of second pixel transistors 116 are configured to collectively facilitate readout of the plurality of photodetectors 110 and may be collectively referred to as the plurality of pixel transistors 114, 116.

Because the plurality of pixel transistors 114, 116 are split amongst the first IC die 104 and the second IC die 106, the first IC die 104 does not accommodate all of the plurality of pixel transistors 114, 116. Rather, the first IC die 104 only accommodates the plurality of first pixel transistors 114, and the plurality of second pixel transistors 116 are at the second IC die 106. As such, area of the first IC die 104 that would otherwise be used by the plurality of second pixel transistors 116 may be used by the plurality of photodetectors 110. This allows the plurality of photodetectors 110 to be larger than they would otherwise be, which allows enhanced performance (e.g., FWC or the like) and/or scaling down.

With continued reference to FIG. 1, the plurality of first pixel transistors 114 are individual to the plurality of photodetectors 110 and respectively border the plurality of photodetectors 110. Further, the plurality of first pixel transistors 114 comprise individual gate electrodes 118 and individual pairs of source/drain regions. Source/drain region(s) may refer to a source or a drain, individually or collectively depending upon the context.

The plurality of first pixel transistors 114 are transfer transistors and comprise a first transfer transistor TX1 and a second transfer transistor TX2. Further, the plurality of first pixel transistors 114 are configured to transfer charge that accumulate at collector regions of the plurality of photodetectors 110 to a plurality of floating diffusion nodes (FDNs) 120. The plurality of FDNs 120 are electrically coupled together and respectively define first source/drain regions of the plurality of first pixel transistors 114. The collector regions are electrically isolated from each other and respectively define second source/drain regions of the plurality of first pixel transistors 114. As seen hereafter, the collector regions and the FDNs 120 correspond to doped semiconductor regions sharing a common doping type.

A plurality of first-level wires 122*a* and a plurality of first-level vias 124*a* overlap with and are electrically coupled to the plurality of first pixel transistors 114 at the first IC die 104. When viewed in cross-section, the plurality of first-level wires 122*a* are spaced from the plurality of first pixel transistors 114. Further, the plurality of first-level vias 124*a* extend respectively from the plurality of first-level wires 122*a* respectively to the plurality of FDNs 120 and respectively to the gate electrodes 118. The plurality of first-level wires 122*a* and the plurality of first-level vias 124*a* electrically couple the plurality of FDNs 120 together, and further electrically couple the plurality of first pixel transistors 114 to the plurality of second pixel transistors 116 via the conductive paths 108. The plurality of first-level wires 122*a* and the plurality of first-level vias 124*a* may, for example, enable flexible control over the plurality of photodetectors 110 and the plurality of first pixel transistors 114.

The plurality of second pixel transistors 116 are shared amongst the plurality of photodetectors 110 and comprise a reset transistor RST, a source-follower transistor SF, and a select transistor SEL. The reset transistor RST is electrically coupled from the plurality of FDNs 120 to a terminal at which a reset voltage Vrst is applied. The reset transistor RST is configured to reset the plurality of FDNs 120 to the reset voltage Vrst by electrically coupling the plurality of FDNs 120 to the reset voltage Vrst. Further, when the plurality of first pixel transistors 114 are in ON states, this electrical coupling may reset the plurality of photodetectors 110 to a pinning voltage or may otherwise reset the plurality of photodetectors 110 to a known state.

The source-follower transistor SF is gated by charge at the plurality of FDNs 120. Further, the source-follower transistor SF and the select transistor SEL are electrically coupled in series from a terminal at which a power supply voltage VDD is applied to an output terminal OUT. The source-follower transistor SF is configured to buffer and amplify a voltage at the plurality of FDNs 120. The select transistor SEL is configured to selectively pass a buffered and amplified voltage from the source-follower transistor SF to the output terminal OUT.

The DTI structure 112 is or comprises dielectric material and, in some embodiments, comprises metal. For example, the DTI structure 112 may be wholly formed of the dielectric material. As another example, the DTI structure 112 may comprise a core of the metal lined by the dielectric material. The metal may, for example, be or comprise tungsten and/or the like. The dielectric material may, for example, be or comprise a high k dielectric material, silicon oxide (e.g., $SiO_2$), some other suitable material, or any combination of the foregoing. The dielectric material may, for example, include fixed charge (e.g., fixed negative charge or the like). The fixed charge may, for example, repel mobile charge carriers (e.g., electrons or holes) to improve electrical isolation between the plurality of photodetectors 110.

In some embodiments, the first IC die 104 is devoid of an implant isolation region separating the plurality of photodetectors 110 from each other. This may, for example, be enabled by inclusion of fixed charge in the DTI structure 112. As such, area that would otherwise be used by the implant isolation region may be used by the plurality of photodetectors 110. This allows the plurality of photodetectors 110 to be larger than they would otherwise be, which allows enhanced performance (e.g., FWC or the like) and/or scaling down.

In some embodiments, the conductive paths 108 are formed by interconnect structures of the first and second IC dies 104, 106. The interconnect structures may, for example, be or comprise alternating stacks of wires and vias. In some embodiments, an interconnect structure of the first IC die 104 comprises the plurality of first-level wires 122*a* and the plurality of first-level vias 124*a*. Further, the interconnect structures may, for example, be or comprise metal and/or the like. Accordingly, in some embodiments, the conductive paths 108 are or comprise metal. The metal may, for example, be or comprise copper, aluminum, aluminum copper, tungsten, some other suitable metal(s), or any combination of the foregoing.

In some embodiments, the pixel 102 is a complementary metal-oxide semiconductor (CMOS) active pixel sensor (APS). In some embodiments, the pixel 102 has a total number of transistors at the first IC die 104 and a total number of photodetectors at the first IC die 104 that are equal to each other. Further, in some embodiments, the pixel 102 has a total number of transistors at the second IC die 106 that is three or more.

In some embodiments, the plurality of photodetectors 110 are PIN diodes, PN diodes, or the like. In some embodiments, the plurality of pixel transistors 114, 116 are metal-oxide-semiconductor field-effector transistors (MOSFETs), fin field-effect transistors (FinFETs), gate-all-around field-effect transistors (GAA FETs), nanosheet field-effect transistors, the like, or any combination of the foregoing.

Figure 2:
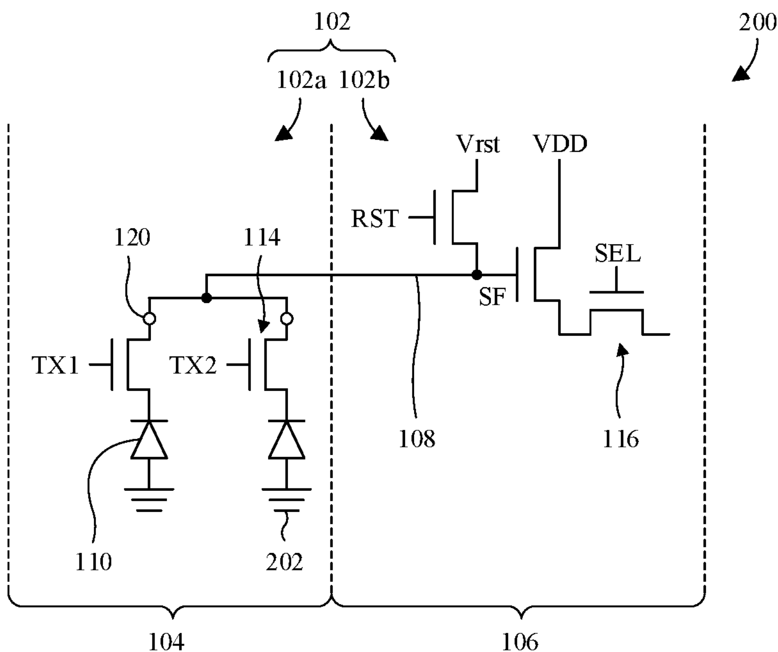
FIG. 2 illustrates a circuit diagram of some embodiments of the image sensor of FIG. 1.

With reference to FIG. 2, a circuit diagram 200 of some embodiments of the image sensor of FIG. 1 is provided. Cathodes of the plurality of photodetectors 110 are electrically coupled to source/drain regions of the plurality of first pixel transistors 114, respectively, and may, for example, be formed by collector regions of the plurality of photodetectors 110. Anodes of the plurality of photodetectors 110 are electrically coupled to terminals at which ground 202 is applied and may, for example, be formed by a well or bulk region of a semiconductor substrate within which the plurality of photodetectors 110 are arranged.

Figure 3A:
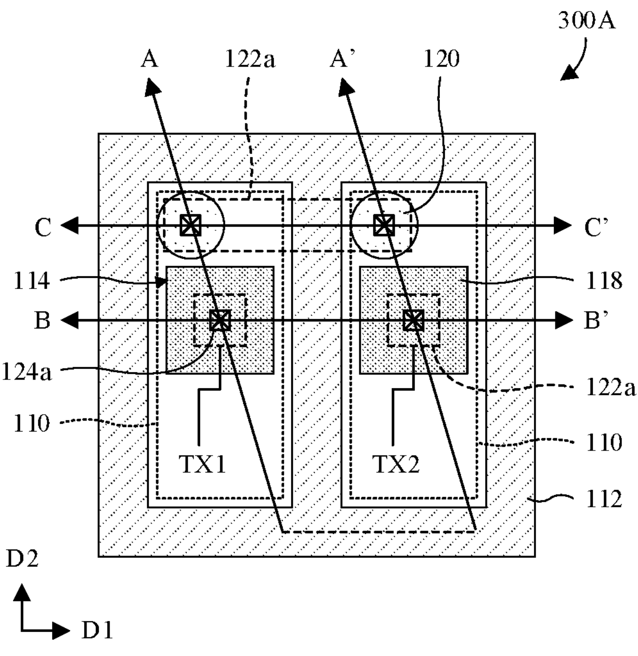
FIGS. 3A-3D illustrate various views of some embodiments of a first portion of the pixel of FIG. 1 at the first IC die.
Figure 3B:
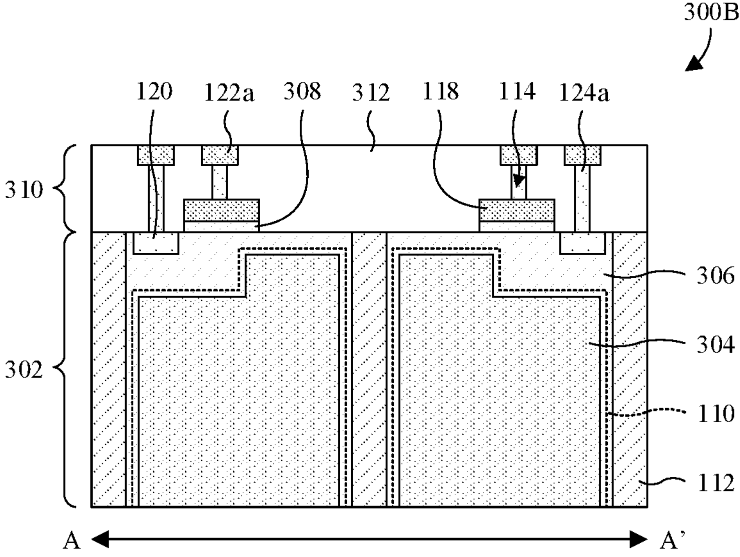
Figure 3C:
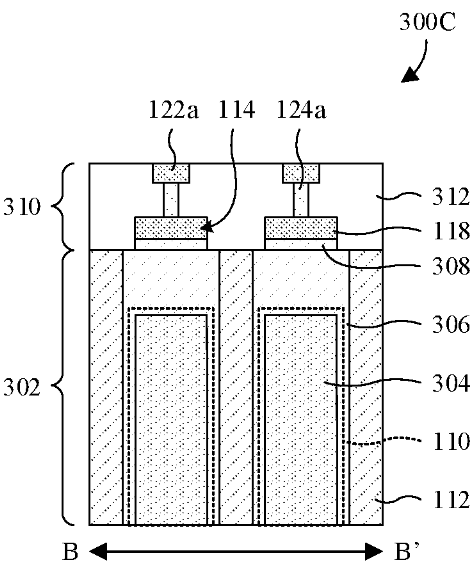
Figure 3D:
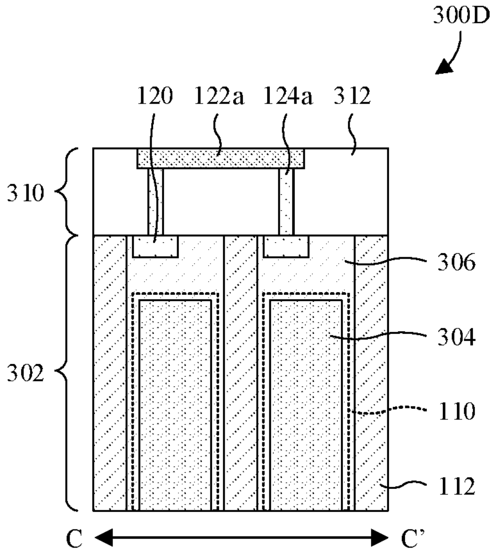

With reference to FIGS. 3A-3D, various views 300A-300D of some embodiments of the first portion 102*a* of the pixel 102 of FIG. 1 are provided. FIG. 3A illustrates a top layout view 300A, and FIGS. 3B-3D illustrate cross-sectional views 300B-300D. The cross-sectional view 300B of FIG. 3B is taken along solid portions of line A-A' in FIG. 3A, the cross-sectional view 300C of FIG. 3C is taken along line B-B' in FIG. 3A, and the cross-sectional view 300D of FIG. 3D is taken along line C-C' in FIG. 3A.

The plurality of photodetectors 110 are in a semiconductor substrate 302 and comprise individual collector regions 304 respectively underlying the plurality of first pixel transistors 114. In some embodiments, the semiconductor substrate 302 is or comprises a bulk silicon substrate, a silicon-on-insulator (SOI) substrate, or some other suitable type of semiconductor substrate. The collector regions 304 are buried in a well or bulk region 306 of the semiconductor substrate 302 and have an opposite doping type as the well or bulk region 306. For example, the collector regions 304 may be N type, and the well or bulk region 306 may be P type, or vice versa. As such, boundaries of the collector regions 304 correspond to PN junctions. During use of the plurality of photodetectors 110, charge (e.g., electrons) accumulates in the collector regions 304 in response to light on the plurality of photodetectors 110.

The DTI structure 112 individually surrounds the plurality of photodetectors 110 and extends completely through the semiconductor substrate 302. Further, the DTI structure 112 is devoid of cuts or openings. Hence, the DTI structure 112 completely separates the plurality of photodetectors 110 from each other. Further, the DTI structure 112 segments the well or bulk region 306 into a plurality of discrete segments that are completely isolated (e.g., electrically and physically) from each other. In some embodiments, the DTI structure 112 has a height throughout its entirety that is greater than a height of the semiconductor substrate 302.

The plurality of first pixel transistors 114 respectively overlie the plurality of photodetectors 110. Further, the plurality of first pixel transistors 114 comprise individual gate electrodes 118, individual gate dielectric layers 308, and individual pairs of source/drain regions. The gate electrodes 118 respectively overlie the gate dielectric layers 308 to form gate stacks. First source/drain regions of the plurality of first pixel transistors 114 are formed by the collector regions 304, which have stepped profiles stepping up on first sides respectively of the gate electrodes 118. Second source/drain regions of the plurality of first pixel transistors 114 are formed by the plurality of FDNs 120, which are on second sides of the gate electrodes 118 respectively opposite the first sides. The plurality of FDNs 120 are in the semiconductor substrate 302. Further, the plurality of FDNs 120 share a common doping type with the collector regions 304 and have an opposite doping type as the well or bulk region 306.

During use of the plurality of first pixel transistors 114, charge that accumulates in the collector regions 304 (e.g., in response to light) is selectively transferred respectively to the plurality of FDNs 120 respectively by the plurality of first pixel transistors 114. When a first transistor is in an ON state, a conductive channel forms from a corresponding collector region to a corresponding FDN. When a first transistor is in an OFF state, the corresponding collector region and the corresponding FDN are electrically isolated from each other.

An interconnect structure 310 (partially shown) overlies and electrically couples to the plurality of first pixel transistors 114. The interconnect structure 310 is in an interconnect dielectric layer 312 and comprises the plurality of first-level wires 122*a* and the plurality of first-level vias 124*a* that are stacked to form conductive paths leading from the plurality of first pixel transistors 114. Focusing on FIGS. 3A and 3D, the interconnect structure 310 electrically couples (e.g., electrically shorts), the plurality of FDNs 120 together.

Figure 4A:
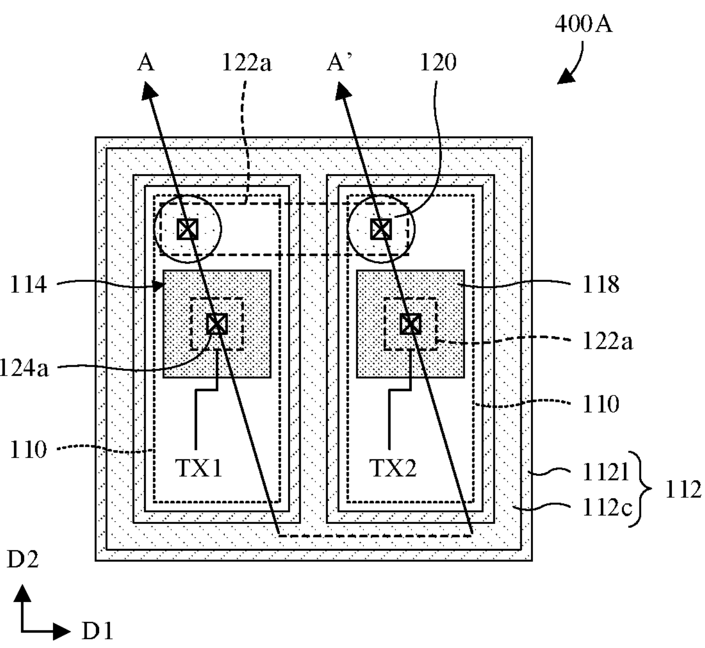
FIGS. 4A and 4B illustrate various views of some alternative embodiments of the first portion of the pixel of FIGS. 3A-3D.
Figure 4B:
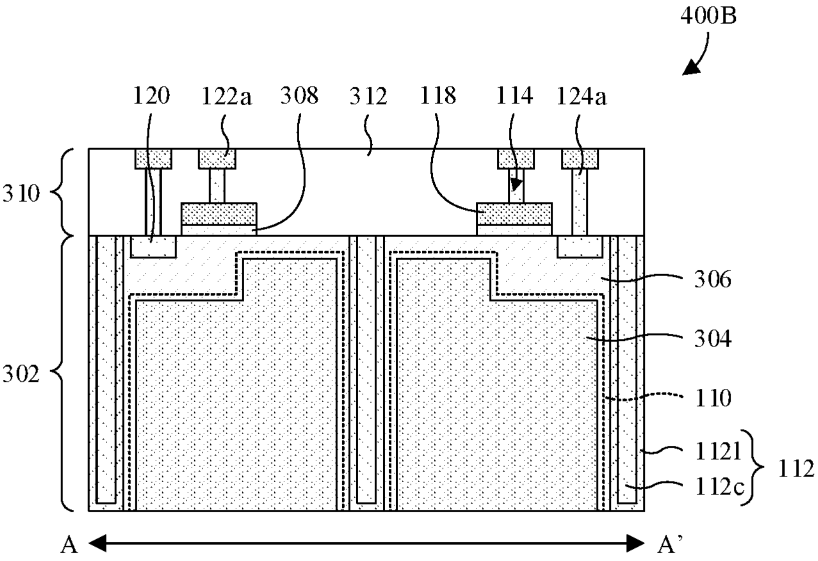

With reference to FIGS. 4A and 4B, various views 400A, 400B of some alternative embodiments of the first portion 102*a* of the pixel 102 of FIGS. 3A-3D are provided in which the DTI structure 112 comprises a metal core 112*c* and a dielectric liner 112*l*. FIG. 4A illustrates a top layout view 400A, and FIG. 4B illustrates a cross-sectional view 400B along solid portions of line A-A' in FIG. 4A. The dielectric liner 112*l* lines the metal core 112*c* to separate the metal core 112*c* from the semiconductor substrate 302. The dielectric liner 112*l* may, for example, be or comprise silicon oxide and/or some other suitable dielectrics, and the metal core 112*c* may, for example, be or comprise tungsten and/or some other suitable metals.

Figure 5A:
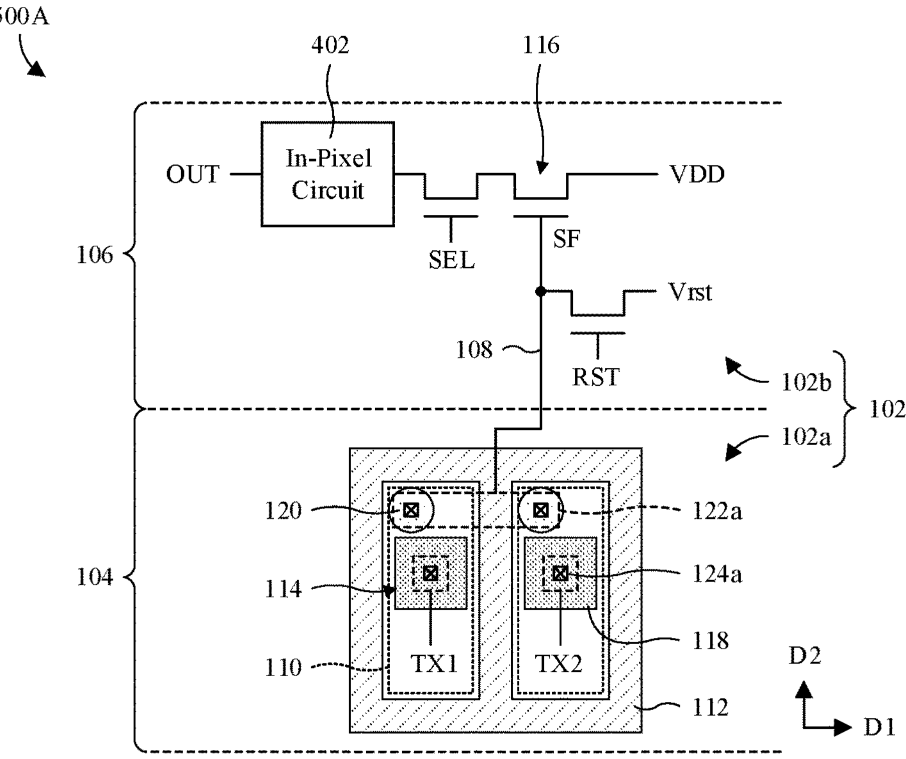
FIGS. 5A and 5B illustrate schematic views of some alternative embodiments of the image sensor of FIG. 1 in which the pixel further comprises an in-pixel circuit.
Figure 5B:
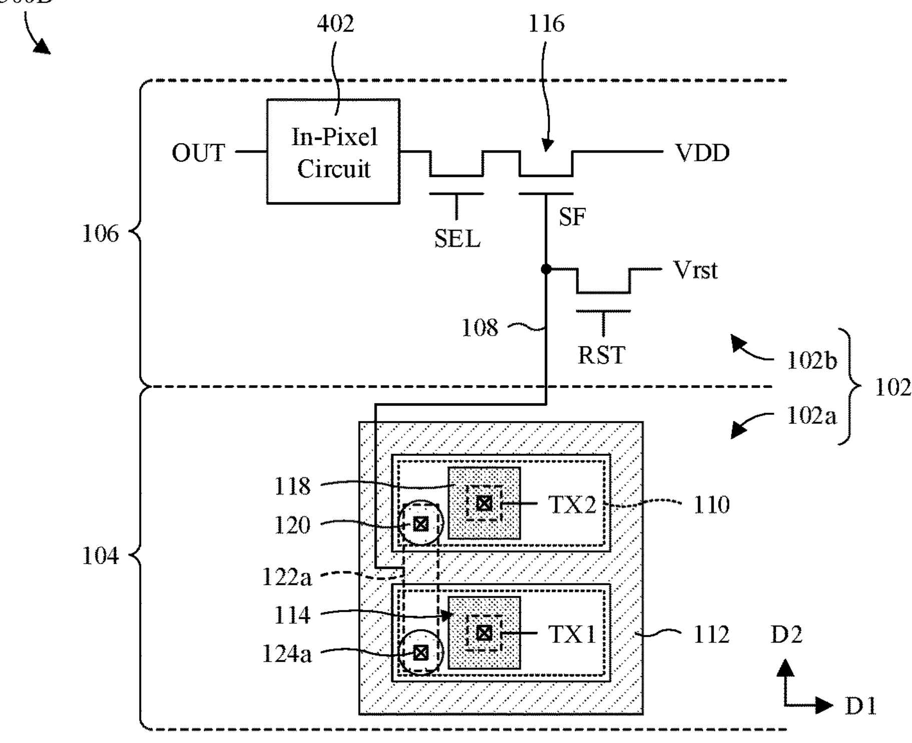

With reference to FIGS. 5A and 5B, schematic views 500A, 500B of some alternative embodiments of the image sensor of FIG. 1 are provided in which the pixel 102 further comprises an in-pixel circuit 402 at the second IC die 106. In FIG. 4A, the first portion 102*a* of the pixel 102 has a horizontal orientation as in FIG. 1. On other hand, in FIG. 4B, the first portion 102*a* of the pixel 102 instead has a vertical orientation. As such, the plurality of photodetectors 110 are spaced from each other in the second dimension D2.

When a pixel array is made up of pixels in the horizontal orientation (e.g., each pixel is as in FIG. 1 or 4A), the pixel array is readout a single row at a time according to a rolling shutter readout scheme. For example, row 1 is read out, then row 2 is read out, then row 3 is read out, and so on. On the other hand, when a pixel array is made up of pixels in the vertical orientation (e.g., each pixel is as in FIG. 4B), the pixel array is readout two adjoining rows at a time. For example, rows 1 and 2 are concurrently readout, then rows 3 and 4 are concurrently readout, then rows 5 and 6 are concurrently readout, and so on.

The in-pixel circuit 402 is electrically coupled between the select transistor SEL and the output terminal OUT and is configured to perform additional processing on a signal from the select transistor SEL before passing it to the output terminal OUT. Such additional processing may, for example, include noise filtering and/or the like. In some embodiments, the in-pixel circuit 402 is formed by some of the plurality of second pixel transistors 116.

Figure 6A:
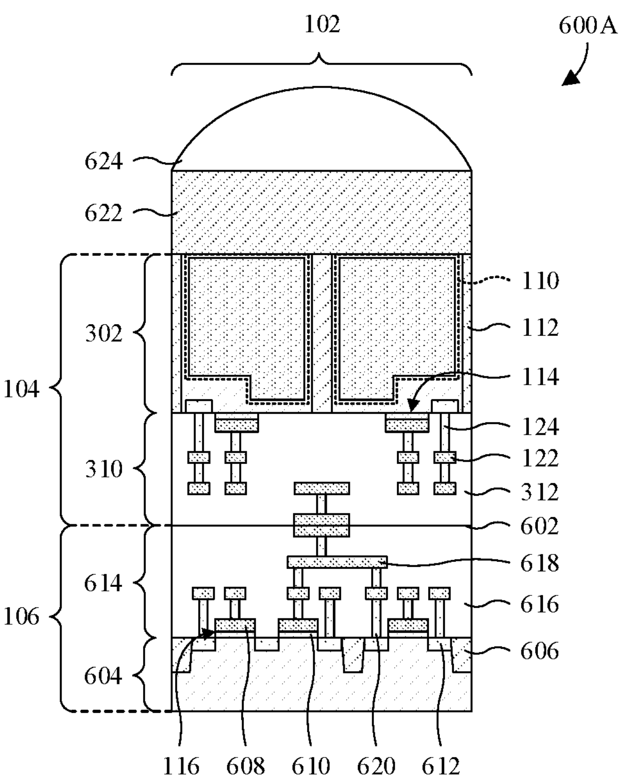
FIGS. 6A and 6B illustrate various views of some embodiments of the image sensor of FIG. 1.
Figure 6B:
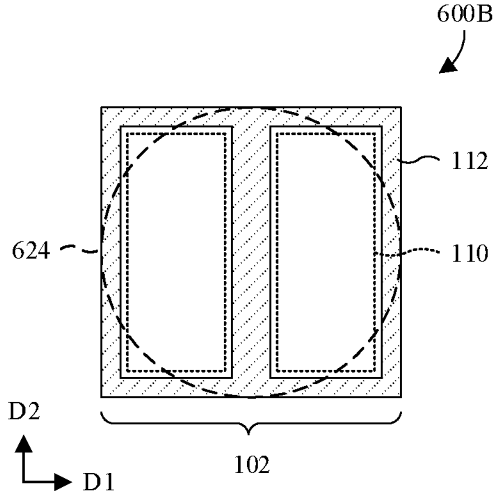

With reference to FIGS. 6A and 6B, various views 600A, 600B of some embodiments of the image sensor of FIG. 1 are provided. FIG. 6A provides a cross-sectional view 600A, and FIG. 6B provides a top layout view 600B. The first IC die 104 overlies and is bonded to the second IC die 106 at a bond interface 602. The bond interface 602 may, for example, comprise a conductor-to-conductor bond interface and a dielectric-to-dielectric bond interface. The conductor-to-conductor bond interface may, for example, be metal-to-metal or the like.

The first IC die 104 comprises the semiconductor substrate 302 (hereafter the first semiconductor substrate 302) and the interconnect structure 310 (hereafter the first interconnect structure 310). The plurality of photodetectors 110 are in the first semiconductor substrate 302, separated from each other by the DTI structure 112. The plurality of first pixel transistors 114 are on an underside of the first semiconductor substrate 302, and the first interconnect structure 310 underlies and electrically couples to the plurality of first pixel transistors 114 on the underside of the first semiconductor substrate 302. The first interconnect structure 310 is in the interconnect dielectric layer 312 (hereafter the first interconnect dielectric layer 312) and comprises a plurality of wires 122 and the plurality of vias 124.

The plurality of wires 122 and the plurality of vias 124 are grouped respectively into wire levels and via levels that are alternatively stacked to form conductive paths leading from the plurality of first pixel transistors 114 to the bond interface 602. The plurality of wires 122 comprise the first-level wires 122*a* (not specifically labeled) in preceding figures, and the plurality of vias 124 comprise the first-level vias 124*a* (not specifically labeled) in preceding figures. The plurality of wires 122 and the plurality of vias 124 may, for example, be or comprise copper, aluminum, aluminum copper, tungsten, some other suitable metal(s) and/or conductive material(s), or any combination of the foregoing.

The second IC die 106 comprises a second semiconductor substrate 604. The plurality of second pixel transistors 116 are on the second semiconductor substrate 604 and are separated from each by a shallow trench isolation (STI) structure 606. The STI structure 606 comprises a dielectric material, such as, for example, silicon oxide and/or the like. The second semiconductor substrate 604 may, for example, be or comprise a bulk silicon substrate, a SOI substrate, or some other suitable type of semiconductor substrate.

The plurality of second pixel transistors 116 comprise individual gate electrodes 608, individual gate dielectric layers 610, and individual pairs of source/drain regions 612. The gate electrodes 608 respectively overlie the gate dielectric layers 610 to form gate stacks, and the gate stacks are sandwiched between the source/drain regions.

A second interconnect structure 614 overlies and electrically couples to the plurality of second pixel transistors 116. The second interconnect structure 614 is in a second interconnect dielectric layer 616. The second interconnect structure 614 directly contacts the first interconnect structure 310 at the bond interface 602, and the second interconnect dielectric layer 616 directly contacts the first interconnect dielectric layer 312 at the bond interface 602.

The second interconnect structure 614 comprises a plurality of wires 618 and a plurality of vias 620 grouped respectively into wire levels and via levels that are alternatively stacked to form conductive paths leading from the plurality of second pixel transistors 116 to the bond interface 602. The plurality of wires 618 and the plurality of vias 620 may, for example, be or comprise copper, aluminum, aluminum copper, tungsten, some other suitable metal(s) and/or conductive material(s), or any combination of the foregoing.

A color filter 622 overlies the first semiconductor substrate 302, and a micro lens 624 overlies the color filter 622. The color filter 622 is configured to transmit first color wavelengths while blocking second color wavelengths. The micro lens 624 is configured to focus incident radiation on the plurality of photodetectors 110 to enhance quantum efficiency.

Figure 7:
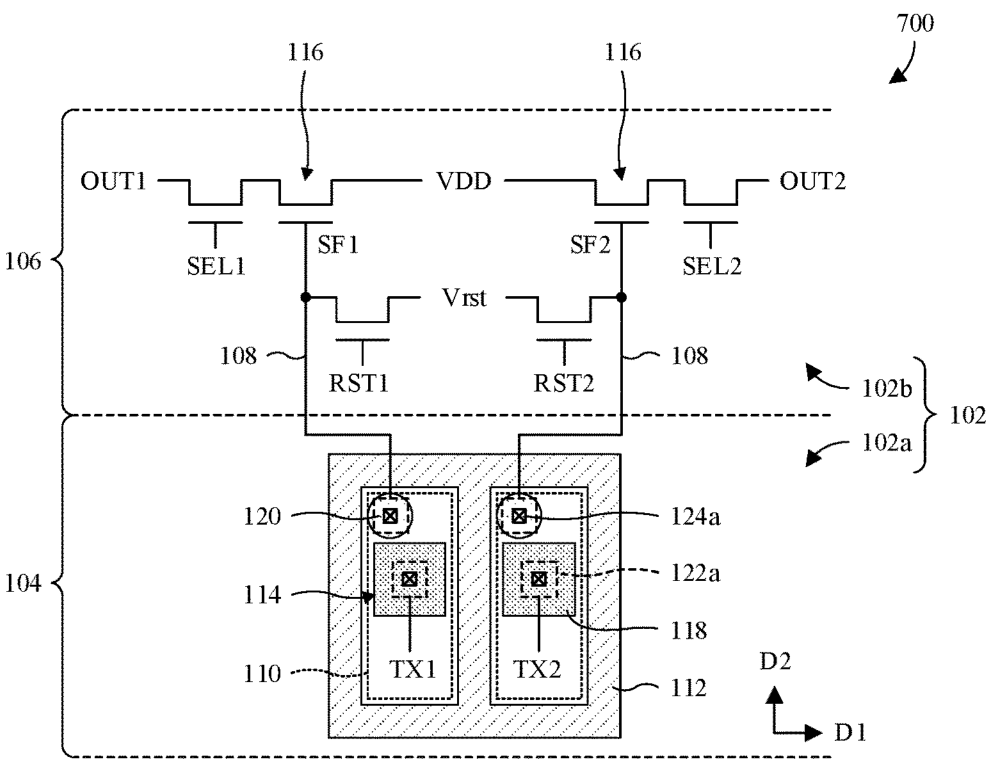
FIG. 7 illustrates a schematic view of some alternative embodiments of the image sensor of FIG. 1 in which a plurality of FDNs are isolated from each other.

With reference to FIG. 7, a schematic view 700 of some alternative embodiments of the image sensor of FIG. 1 is provided in which the plurality of FDNs 120 are electrically isolated from each other. The plurality of first-level wires 122*a* and the plurality of first-level vias 124*a* do not electrically couple the plurality of FDNs 120 together. Accordingly, the plurality of second pixel transistors 116 have separate sets of transistors respectively for the plurality of FDNs 120. A first set of transistors comprises a first reset transistor RST1, a first source-follower transistor SF1, and a first select transistor SEL1 to facilitate readout of a photodetector to a first output terminal OUT1. Further, a second set of transistors comprises a second reset transistor RST2, a second source-follower transistor SF2, and a second select transistor SEL2 to facilitate readout of a photodetector to a second output terminal OUT2.

Figure 8:
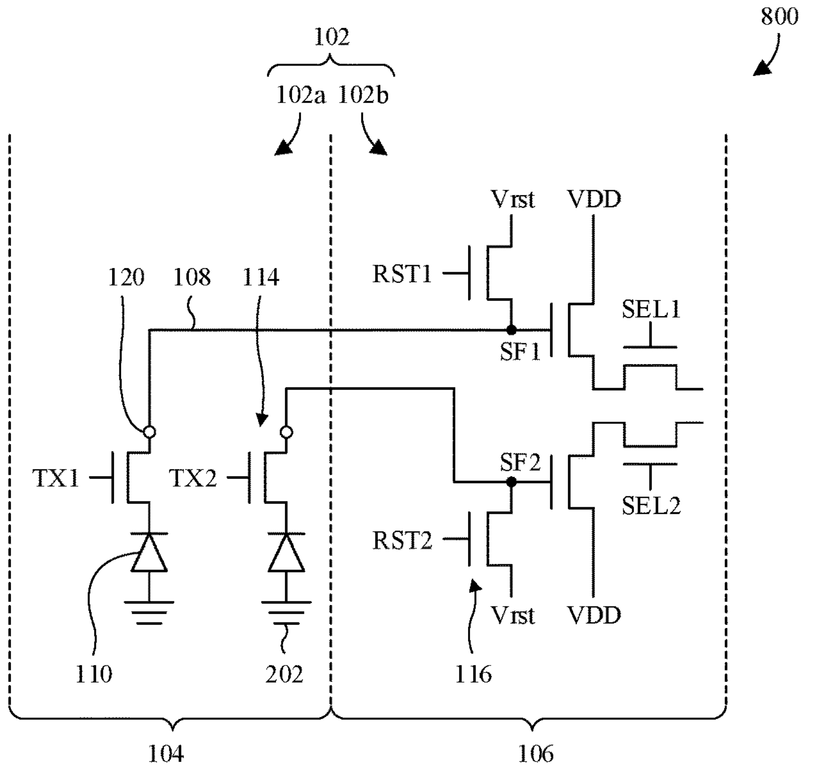
FIG. 8 illustrates a circuit diagram of some embodiments of the image sensor of FIG. 7.

With reference to FIG. 8, a circuit diagram 800 of some embodiments of the image sensor of FIG. 7 is provided.

Figure 9A:
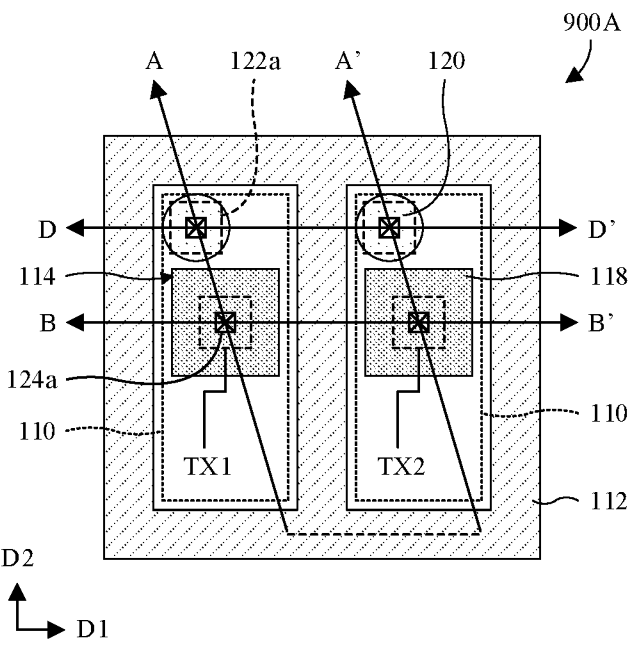
FIGS. 9A and 9B illustrate various views of some embodiments of a first portion of the pixel of FIG. 7 at the first IC die.
Figure 9B:
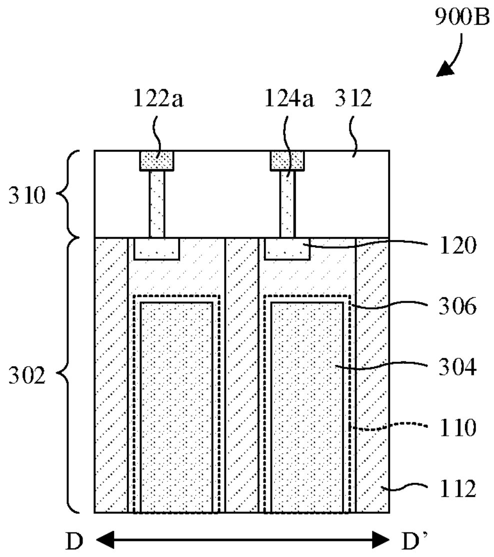

With reference to FIGS. 9A and 9B, various views 900A, 900B of some embodiments of the first portion 102*a* of the pixel 102 of FIG. 7 are provided. FIG. 9A illustrates a top layout view 900A, and FIG. 9B illustrates a cross-sectional view 900B taken along line D-D' in FIG. 9A. The cross-sectional views 300B, 300C of FIGS. 3B and 3C may, for example, be the same for the image sensor of FIG. 7, whereby FIGS. 3B and 3C may, for example, also be taken respectively along lines A-A' and B-B' in FIG. 9A.

Figure 10A:
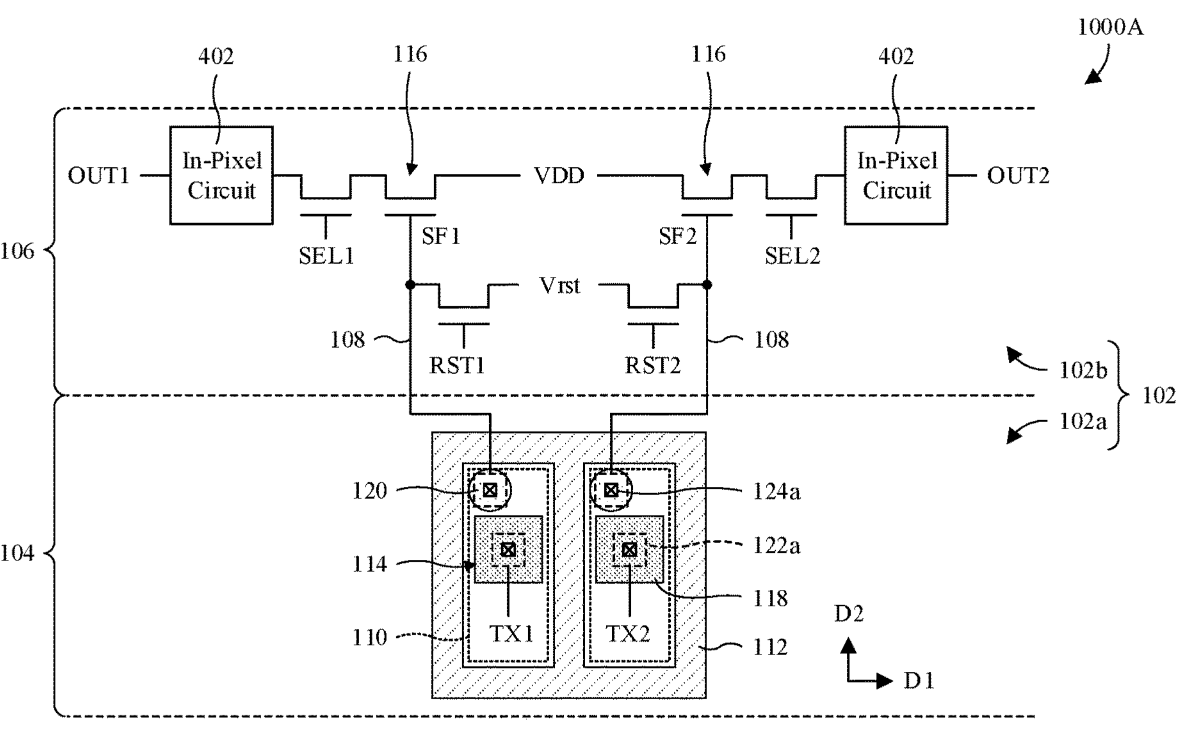
FIGS. 10A and 10B illustrate schematic views of some alternative embodiments of the image sensor of FIG. 7 in which the pixel further comprises in-pixel circuits.
Figure 10B:
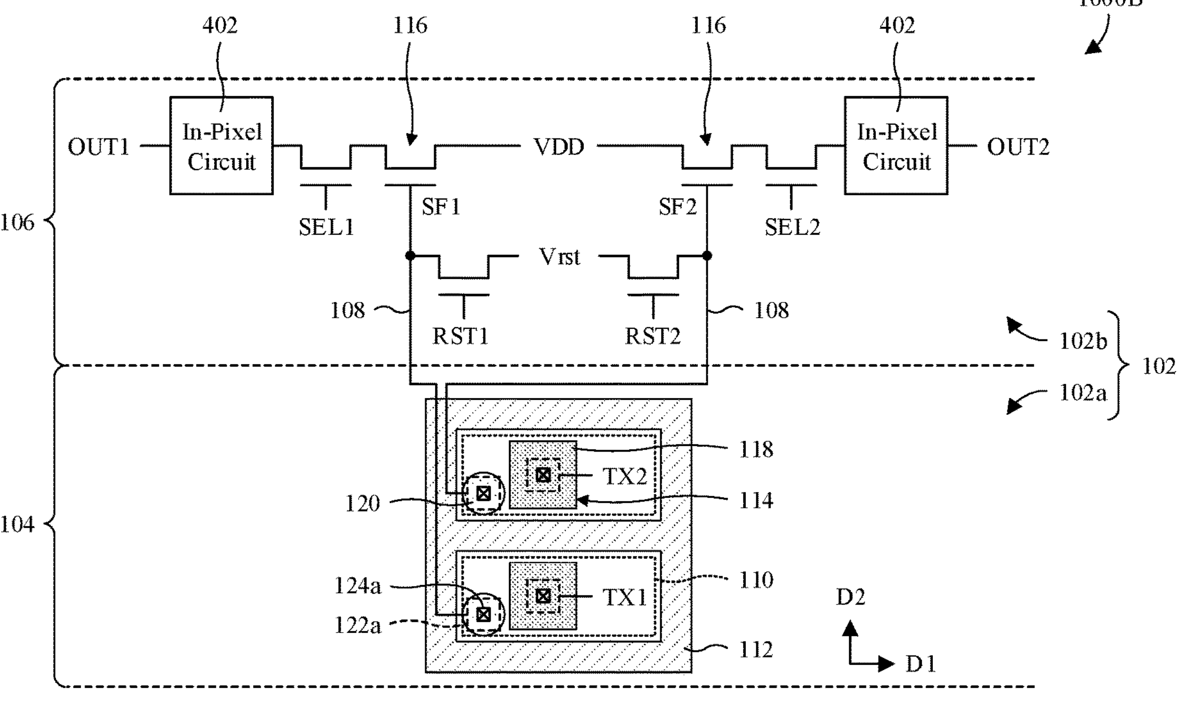

With reference to FIGS. 10A and 10B, schematic views 1000A, 1000B of some alternative embodiments of the image sensor of FIG. 7 are provided in which the pixel 102 further comprises in-pixel circuits 402 individual to the plurality of photodetectors 110 and at the second IC die 106. The in-pixel circuits 402 may, for example, be as their counterpart is described with regard to FIGS. 5A and 5B.

In FIG. 10A, the first portion 102*a* of the pixel 102 has a horizontal orientation as in FIG. 7. When a pixel array is made up of pixels in the horizontal orientation (e.g., each pixel is as in FIG. 7 or 10A), the pixel array is readout a single row at a time according to a rolling shutter readout scheme. In FIG. 10B, the first portion 102*a* of the pixel 102 instead has a vertical orientation. When a pixel array is made up of pixels in the vertical orientation (e.g., each pixel is as in FIG. 10B), the pixel array is readout two adjoining rows at a time.

Figure 11A:
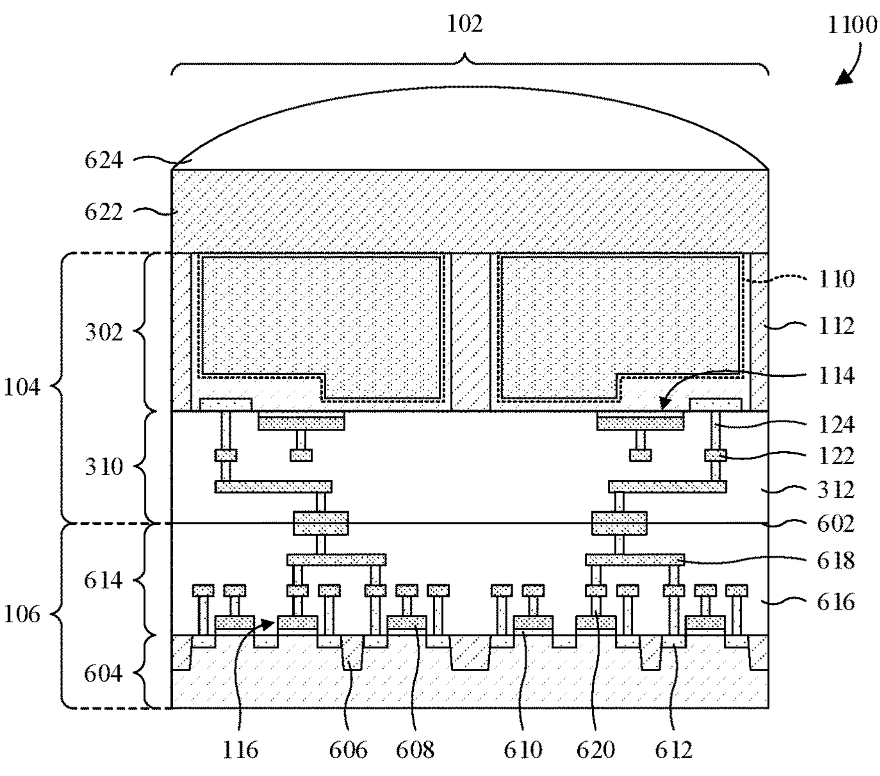
FIGS. 11A and 11B illustrate various views of some embodiments of the image sensor of FIG. 7.
Figure 11B:
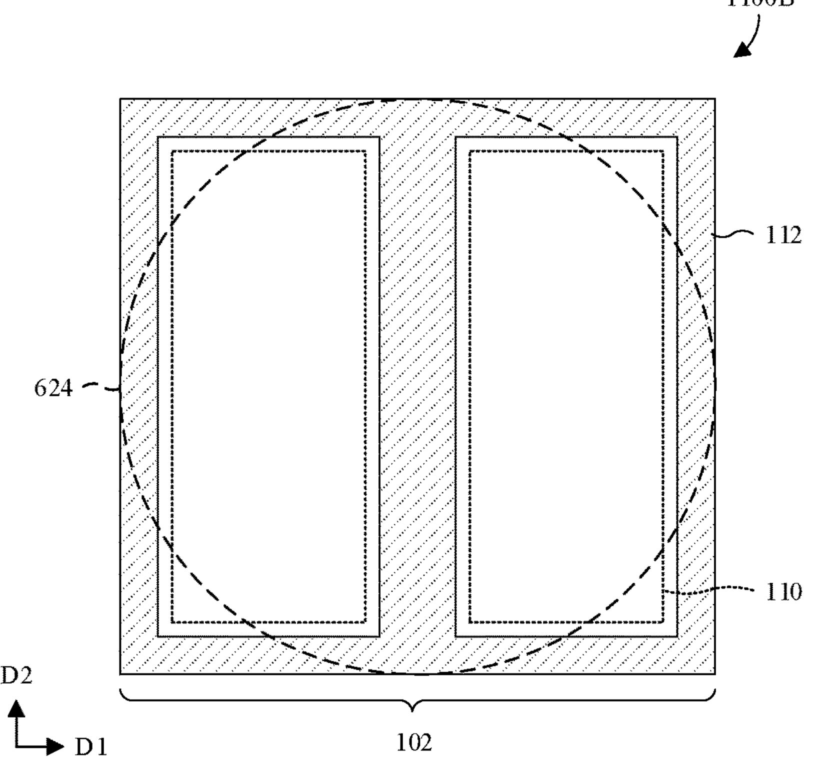

With reference to FIGS. 11A and 11B, various views 1100A, 1100B of some embodiments of the image sensor of FIG. 7 are provided. FIG. 11A provides a cross-sectional view 1100A, whereas FIG. 11B provides a top layout view 1100B. The first IC die 104 and the second IC die 106 may, for example, be as in FIGS. 6A and 6B, except that the plurality of second pixel transistors 116 have separate sets of transistors respectively for the plurality of first pixel transistors 114 (and hence respectively for the plurality of photodetectors 110).

Figure 12:
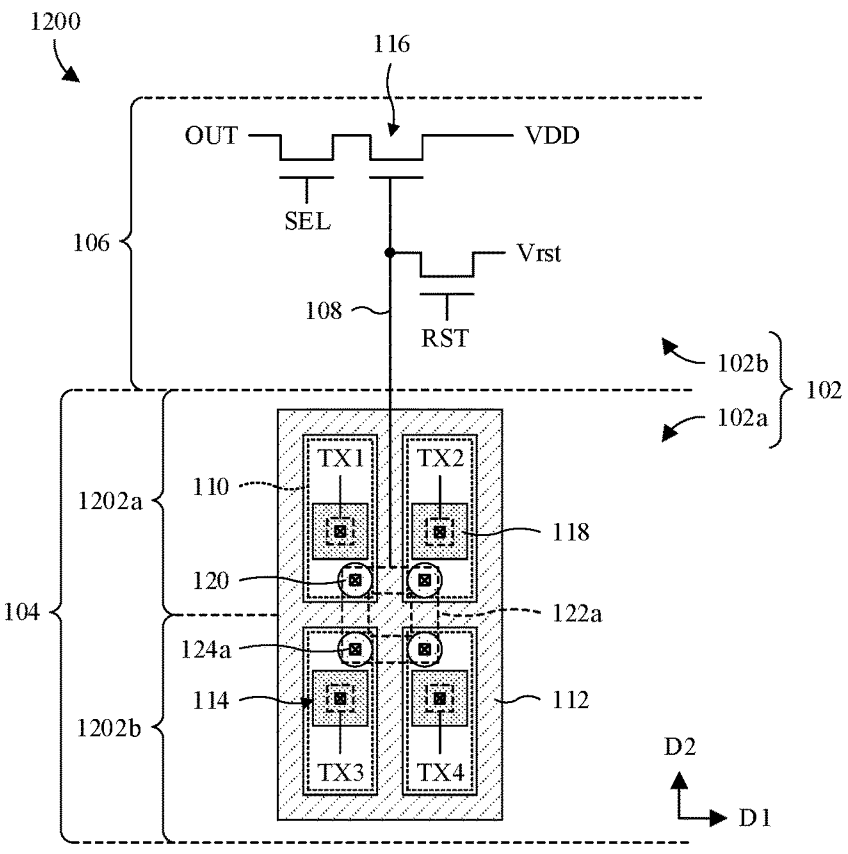
FIG. 12 illustrates a schematic view of some alternative embodiments of the image sensor of FIG. 1 in which the pixel has two more photodetectors.

With reference to FIG. 12, a schematic view 1200 of some alternative embodiments of the image sensor of FIG. 1 is provided in which the plurality of photodetectors 110 has a total of four photodetectors arranged in two rows and two columns. As a result, the pixel 102 may also be referred to as a quad-PD pixel or a multi-PD pixel.

The first row of photodetectors forms a first sub-pixel 1202*a*, and the second row of photodetectors forms a second sub-pixel 1202*b* bordering the first sub-pixel 1202*a*. The first sub-pixel 1202*a* and the second sub-pixel 1202*b* (collectively the plurality of sub-pixels 1202*a*, 1202*b*) each comprise two photodetectors arranged with a dual-PD layout similar to the pixels 102 of FIGS. 1 and 7. Accordingly, the plurality of sub-pixels 1202*a*, 1202*b* may also be referred to as dual-PD sub-pixels and the pixel 102 may be said to have a dual-PD layout.

The plurality of first pixel transistors 114 comprises a first transfer transistor TX1, a second transfer transistor TX2, a third transfer transistor TX3, and a fourth transfer transistor TX4 corresponding to and respectively bordering the plurality of photodetectors 110. The plurality of FDNs 120 comprise an FDN for each of the plurality of photodetectors 110. Further, the plurality of FDNs 120 are electrically coupled together by the plurality of first-level wires 122*a* and the plurality of first-level vias 124*a*. The plurality of second pixel transistors 116 are shared amongst the plurality of sub-pixels 1202*a*, 1202*b*.

The DTI structure 112 individually and continuously surrounds the plurality of photodetectors 110. Further, the DTI structure 112 is a full DTI structure in that the DTI structure 112 extends fully through a semiconductor substrate in which the plurality of photodetectors 110 are arranged. Accordingly, the DTI structure 112 completely separates the plurality of photodetectors 110 from each other.

Figure 13:
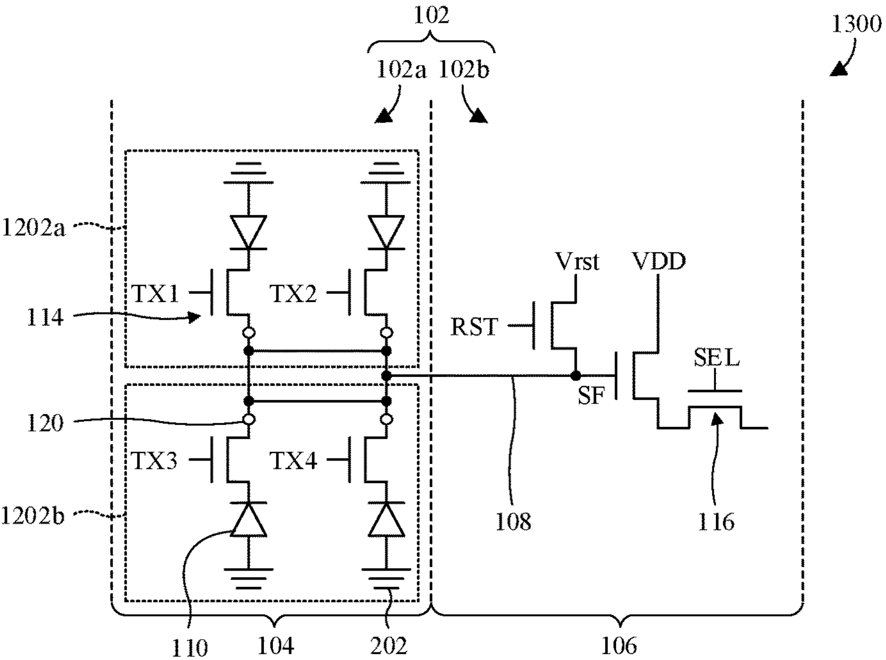
FIG. 13 illustrates a circuit diagram of some embodiments of the image sensor of FIG. 12.

With reference to FIG. 13, a circuit diagram 1300 of some embodiments of the image sensor of FIG. 12 is provided.

Figure 14A:
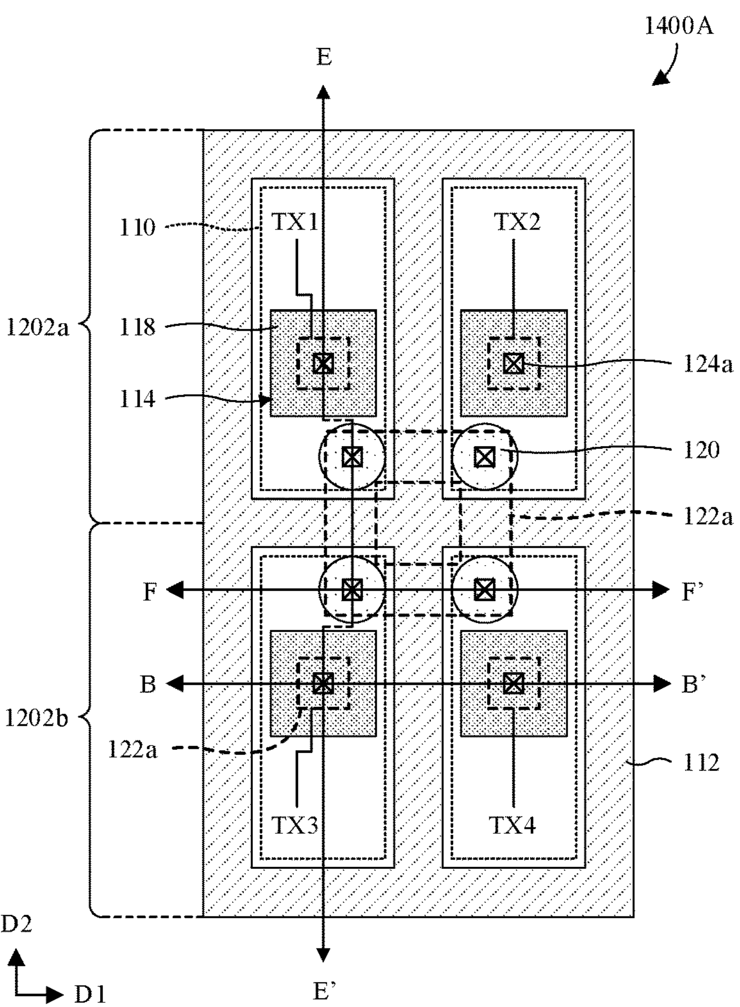
FIGS. 14A-14C illustrate various views of some embodiments of a first portion of the pixel of FIG. 12 at the first IC die.
Figure 14B:
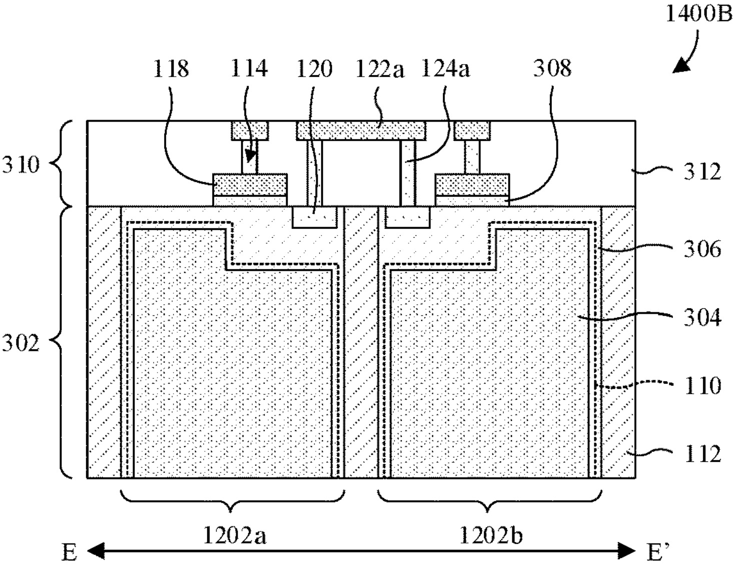
Figure 14C:
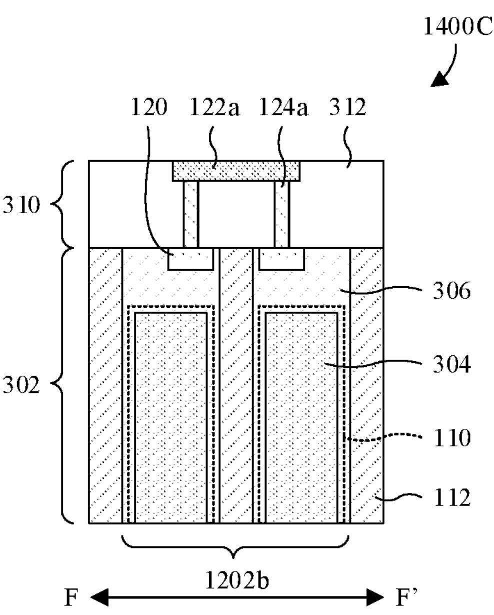

With reference to FIGS. 14A-14C, various views 1400A-1400C of some embodiments of the first portion 102*a* of the pixel 102 of FIG. 12 are provided. FIG. 14A illustrates a top layout view 1400A, and FIGS. 14B and 14C illustrate cross-sectional views 1400B, 1400C. The cross-sectional view 1400B of FIG. 14B may, for example, be taken along line E-E' in FIG. 14A, and the cross-sectional view 1400C of FIG. 14C may, for example, be taken along line F-F' in FIG. 14A. Further, the cross-sectional view 300C of FIG. 3C may, for example, be the same for the image sensor of FIG. 12, whereby the cross-sectional view 300C of FIG. 3C may, for example, be taken along line B-B' in FIG. 14A.

Figure 15A:
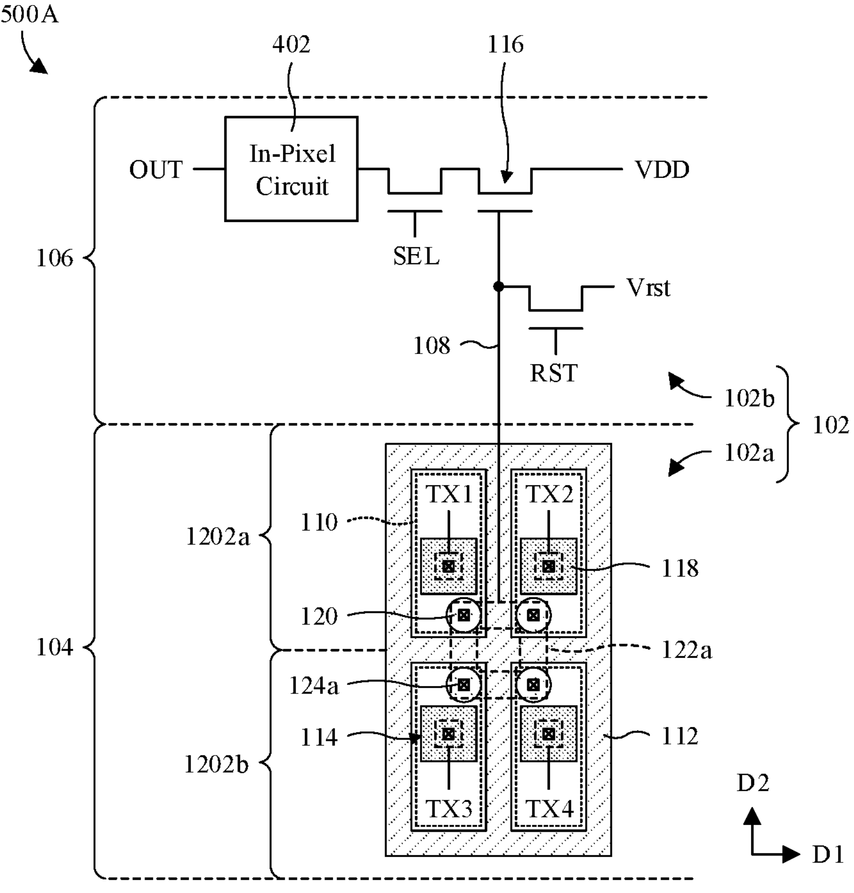
FIGS. 15A and 15B illustrate schematic views of some alternative embodiments of the image sensor of FIG. 12 in which the pixel further comprises an in-pixel circuit.
Figure 15B:
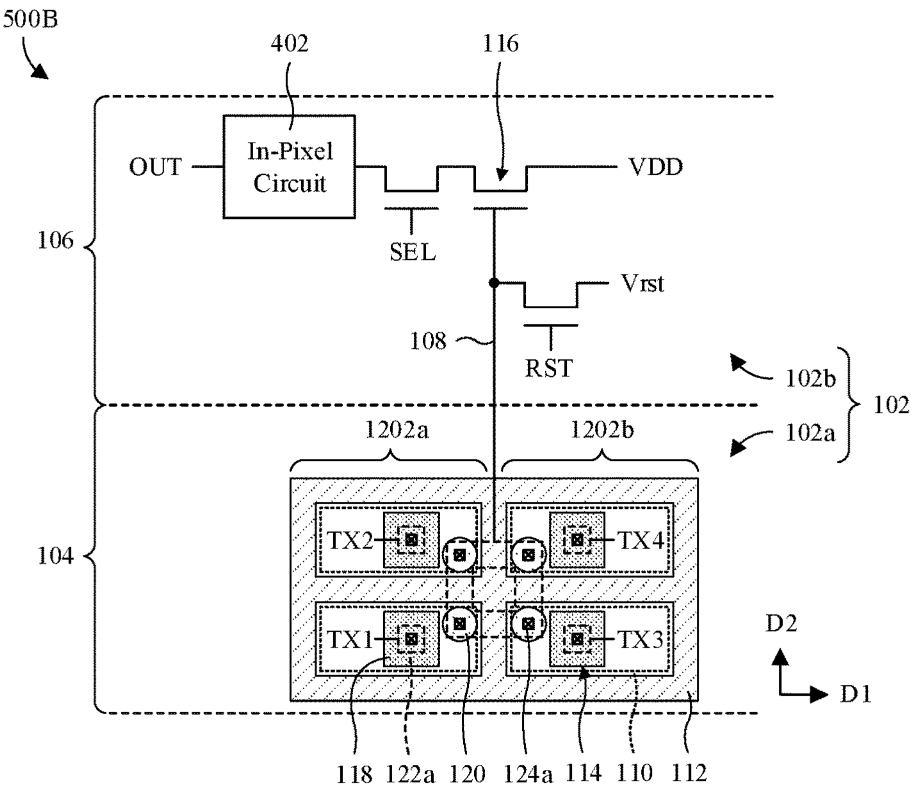

With reference to FIGS. 15A and 15B, schematic views 1500A, 1500B of some alternative embodiments of the image sensor of FIG. 12 are provided in which the pixel 102 further comprises the in-pixel circuit 402 at the second IC die 106.

In FIG. 15A, the first portion 102*a* of the pixel 102 has a horizontal orientation as in FIG. 12. When a pixel array is made up of pixels in the horizontal orientation (e.g., each pixel is as in FIG. 12 or 15A), the pixel array is readout a single row at a time according to a rolling shutter readout scheme. In FIG. 15B, the first portion 102*a* of the pixel 102 instead has a vertical orientation. When a pixel array is made up of pixels in the vertical orientation (e.g., each pixel is as in FIG. 15B), the pixel array is readout two adjoining rows at a time.

Figure 16A:
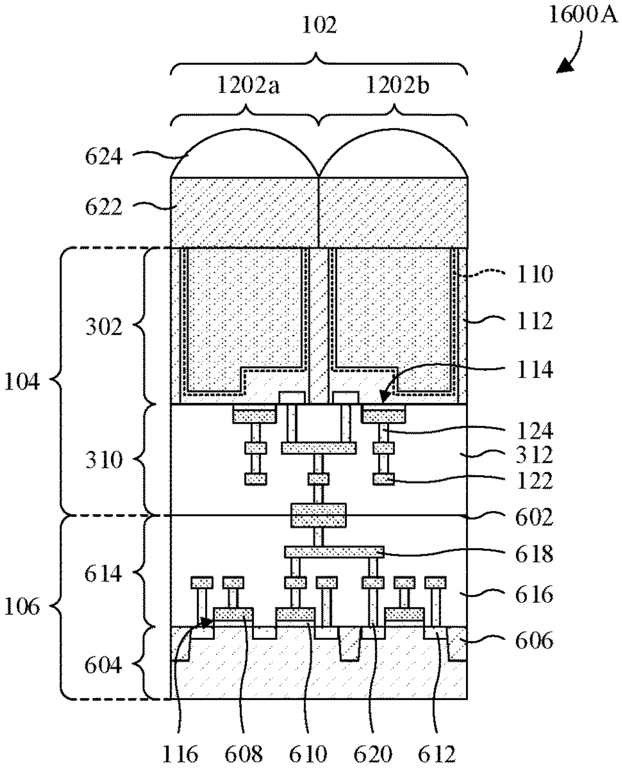
FIGS. 16A and 16B illustrate various views of some embodiments of the image sensor of FIG. 12.
Figure 16B:
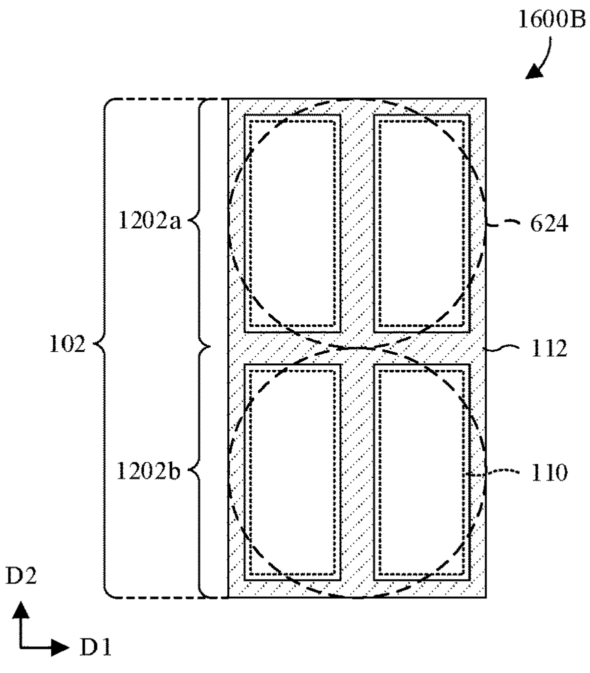

With reference to FIGS. 16A and 16B, various views 1600A, 1600B of some embodiments of the image sensor of FIG. 12 are provided. FIG. 16A provides a cross-sectional view 1600A, and FIG. 16B provides a top layout view 1600B. As best seen in FIG. 16A, a plurality of color filters 622 and a plurality of micro lens 624 respectively overlie the plurality of photodetectors 110. Further, as best seen in FIG. 16B, the two photodetectors of each of the plurality of sub-pixels 1202*a*, 1202*b* are covered by a common color filter and a common micro lens. The plurality of color filters 622 and the plurality of micro lens 624 may, for example, be as their counterparts are described with regard to FIGS. 6A and 6B.

Figure 17:
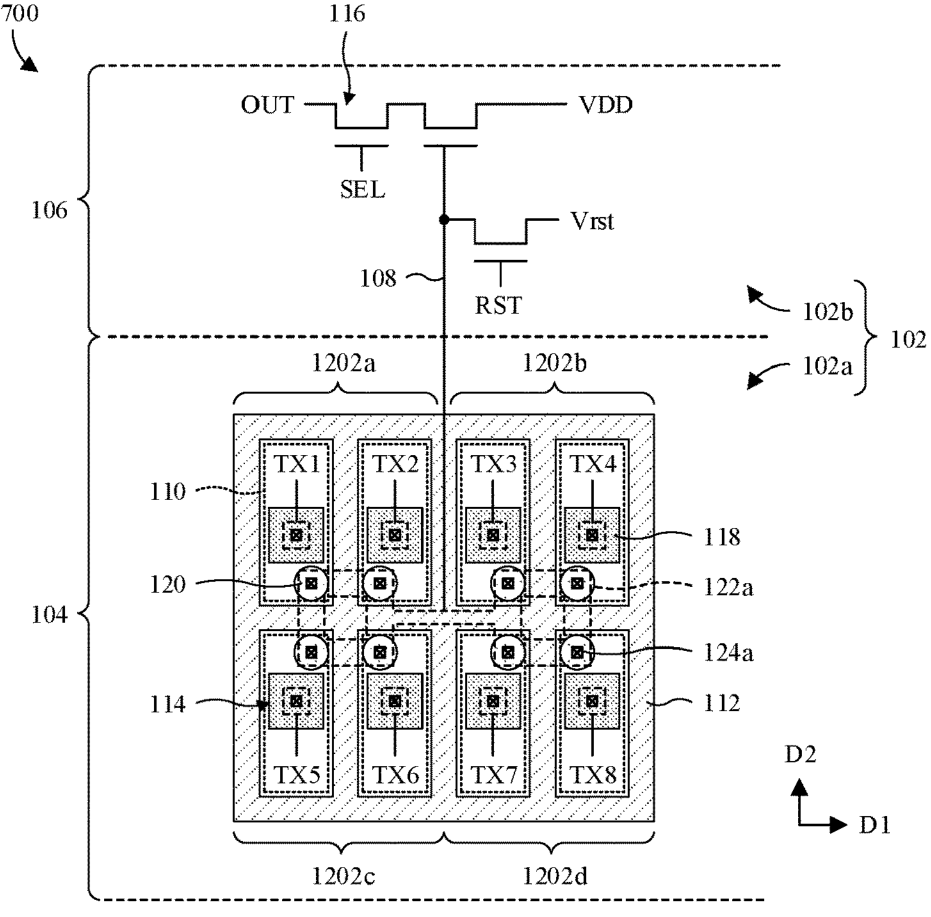
FIG. 17 illustrates a schematic view of some alternative embodiments of the image sensor of FIG. 1 in which the pixel has six more photodetectors.

With reference to FIG. 17, a schematic view 1700 of some alternative embodiments of the image sensor of FIG. 1 is provided in which the plurality of photodetectors 110 has a total of eight photodetectors arranged in two rows and four columns. As a result, the pixel 102 may also be referred to as an octo-PD pixel or a multi-PD pixel.

The first row of photodetectors form a first sub-pixel 1202*a* and a second sub-pixel 1202*b*, and the second row of photodetectors form a third sub-pixel 1202*c* and a fourth sub-pixel 1202*d*. The first sub-pixel 1202*a*, the second sub-pixel 1202*b*, the third sub-pixel 1202*c*, and the fourth sub-pixel 1202*d* (collectively the plurality of sub-pixels 1202*a*-1202*d*) each comprise two photodetectors arranged with a dual-PD layout similar to the pixels 102 of FIGS. 1 and 7. Accordingly, the plurality of sub-pixels 1202*a*-1202*d* may also be referred to as dual-PD sub-pixels and the pixel 102 may be said to have a dual-PD layout.

The plurality of first pixel transistors 114 comprises a first transfer transistor TX1, a second transfer transistor TX2, a third transfer transistor TX3, a fourth transfer transistor TX4, a fifth transfer transistor TX5, a sixth transfer transistor TX6, a seventh transfer transistor TX7, and an eighth transfer transistor TX8 corresponding to and respectively bordering the plurality of photodetectors 110. The plurality of FDNs 120 comprise an FDN for each of the plurality of photodetectors 110. Further, the plurality of FDNs 120 are electrically coupled together by the plurality of first-level wires 122*a* and the plurality of first-level vias 124*a*. The plurality of second pixel transistors 116 are shared amongst the plurality of sub-pixels 1202*a*-1202*d*.

The DTI structure 112 individually and continuously surrounds the plurality of photodetectors 110. Further, the DTI structure 112 is a full DTI structure in that the DTI structure 112 extends fully through a semiconductor substrate in which the plurality of photodetectors 110 are arranged. Accordingly, the DTI structure 112 completely separates the plurality of photodetectors 110 from each other.

Figure 18:
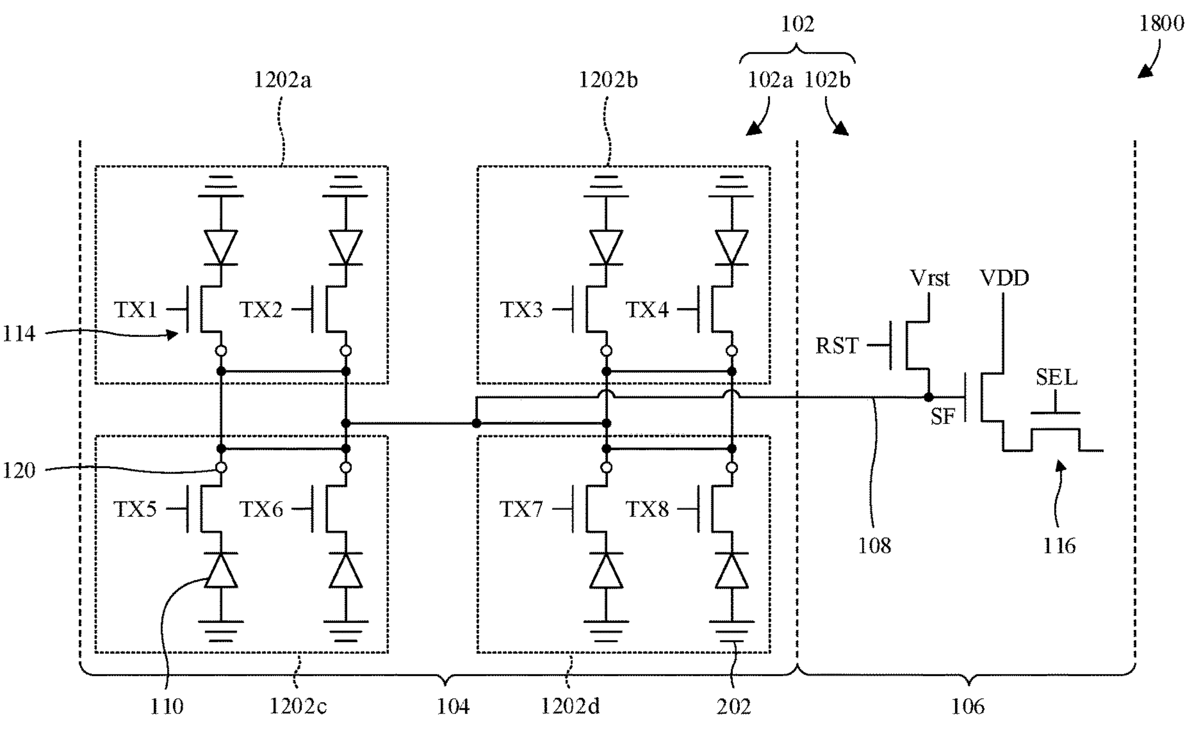
FIG. 18 illustrates a circuit diagram of some embodiments of the image sensor of FIG. 17.

With reference to FIG. 18, a circuit diagram 1800 of some embodiments of the image sensor of FIG. 17 is provided.

Figure 19A:
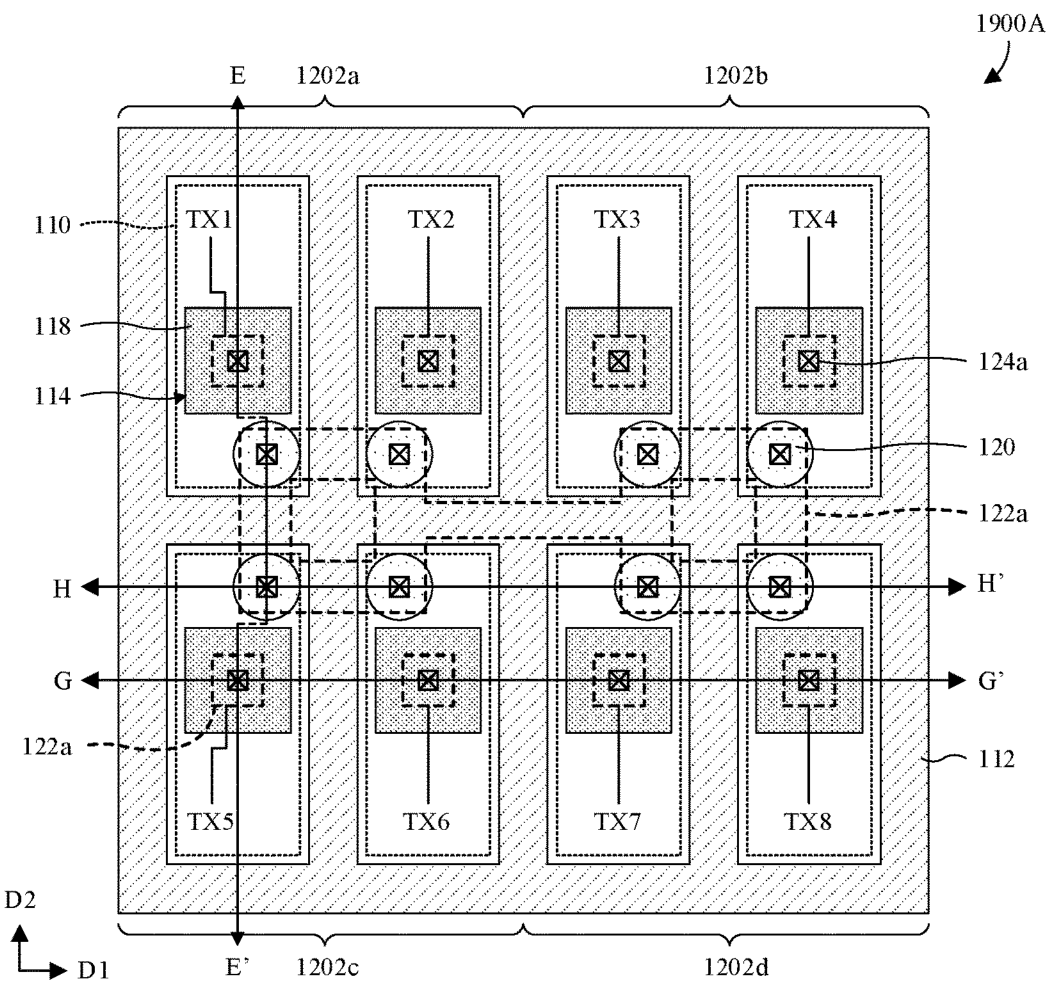
FIGS. 19A-19C illustrate various views of some embodiments of a first portion of the pixel of FIG. 17 at the first IC die.
Figure 19B:
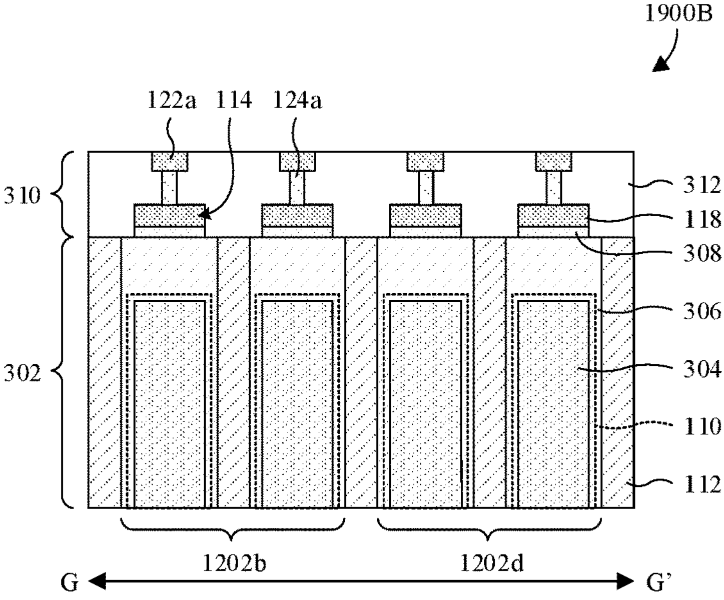
Figure 19C:
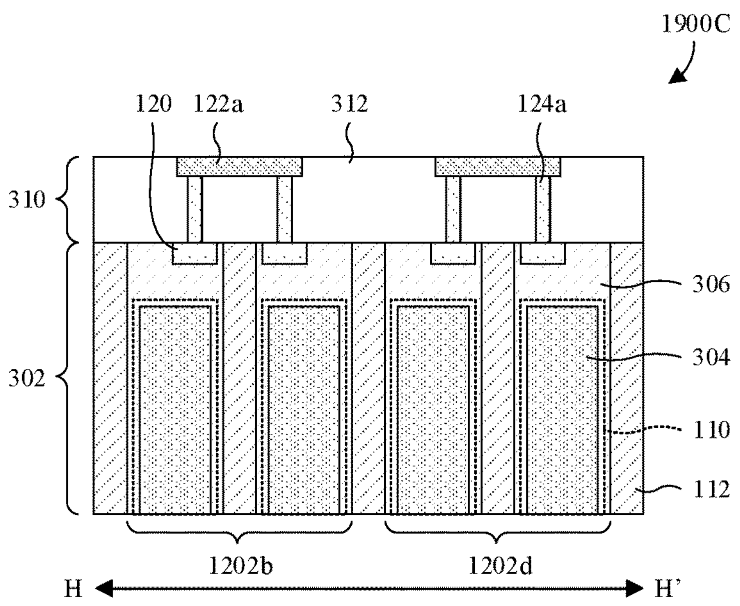

With reference to FIGS. 19A-19C, various views 1900A-1900C of some embodiments of the first portion 102*a* of the pixel 102 of FIG. 17 are provided. FIG. 19A illustrates a top layout view 1900A, and FIGS. 19B and 19C illustrate cross-sectional views 1900B, 1900C. The cross-sectional view 1900B of FIG. 19B may, for example, be taken along line G-G' in FIG. 19A, and the cross-sectional view 1900C of FIG. 19C may, for example, be taken along line H-H' in FIG. 19A. Further, the cross-sectional view 1400B of FIG. 14B may, for example, be the same for the image sensor of FIG. 17, whereby the cross-sectional view 1400B of FIG. 14B may, for example, be taken along line E-E' in FIG. 19A.

Figure 20A:
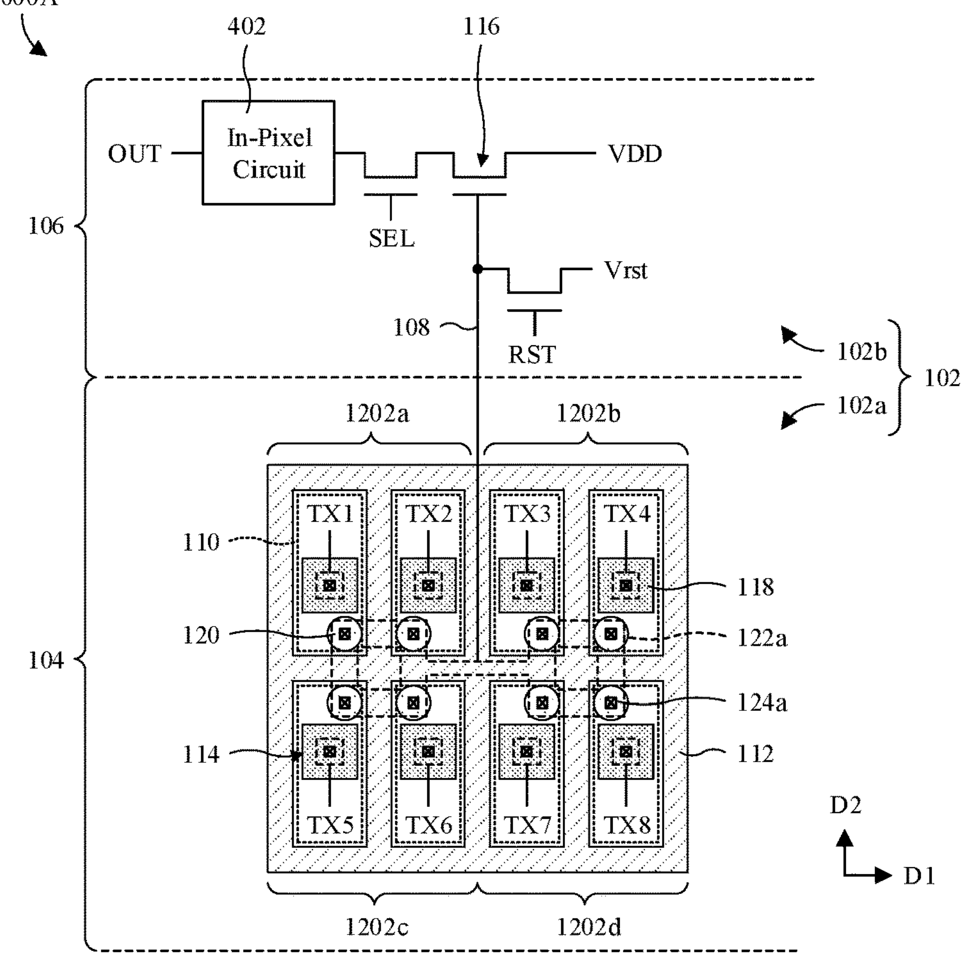
FIGS. 20A and 20B illustrate schematic views of some alternative embodiments of the image sensor of FIG. 17 in which the pixel further comprises an in-pixel circuit.
Figure 20B:
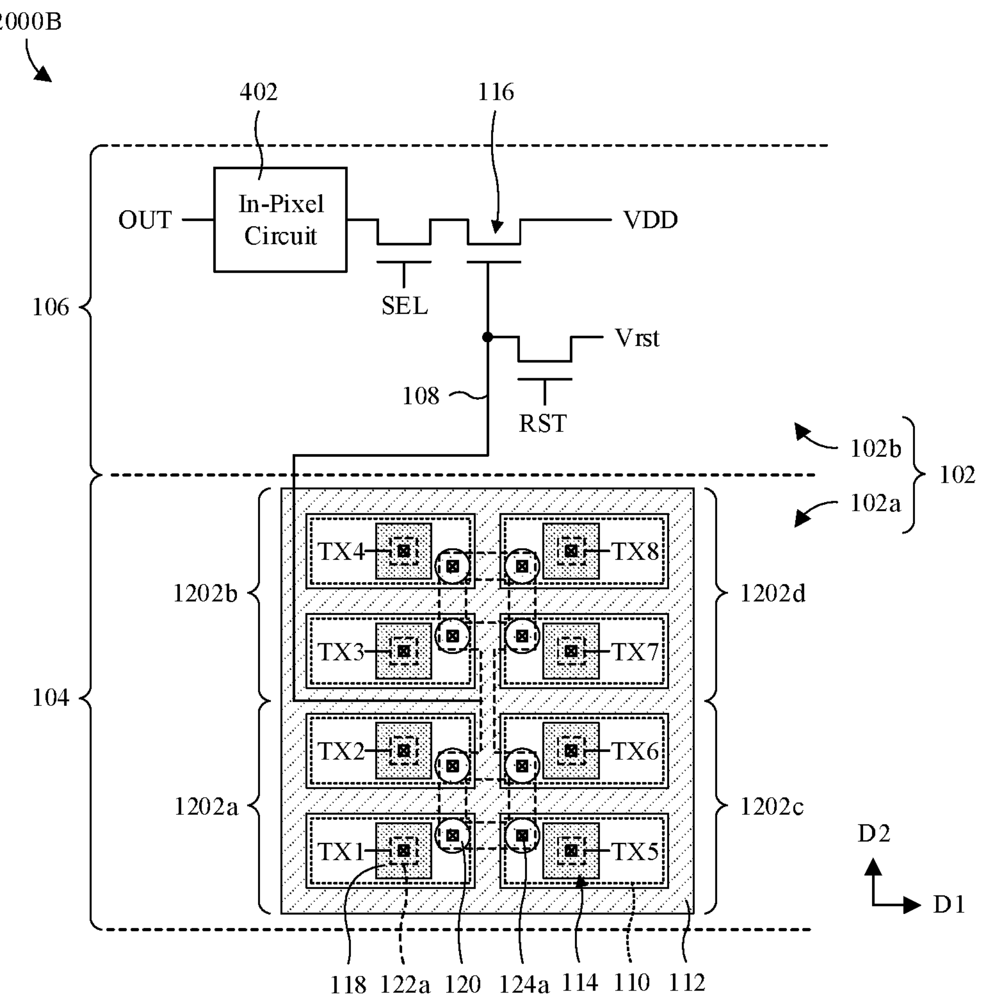

With reference to FIGS. 20A and 20B, schematic views 2000A, 2000B of some alternative embodiments of the image sensor of FIG. 17 are provided in which the pixel 102 further comprises the in-pixel circuit 402 at the second IC die 106.

In FIG. 20A, the first portion 102*a* of the pixel 102 has a horizontal orientation as in FIG. 17. When a pixel array is made up of pixels in the horizontal orientation (e.g., each pixel is as in FIG. 17 or 20A), the pixel array is read out a single row at a time according to a rolling shutter readout scheme. In FIG. 20B, the first portion 102*a* of the pixel 102 instead has a vertical orientation. When a pixel array is made up of pixels in the vertical orientation (e.g., each pixel is as in FIG. 20B), the pixel array is readout two adjoining rows at a time.

Figure 21A:
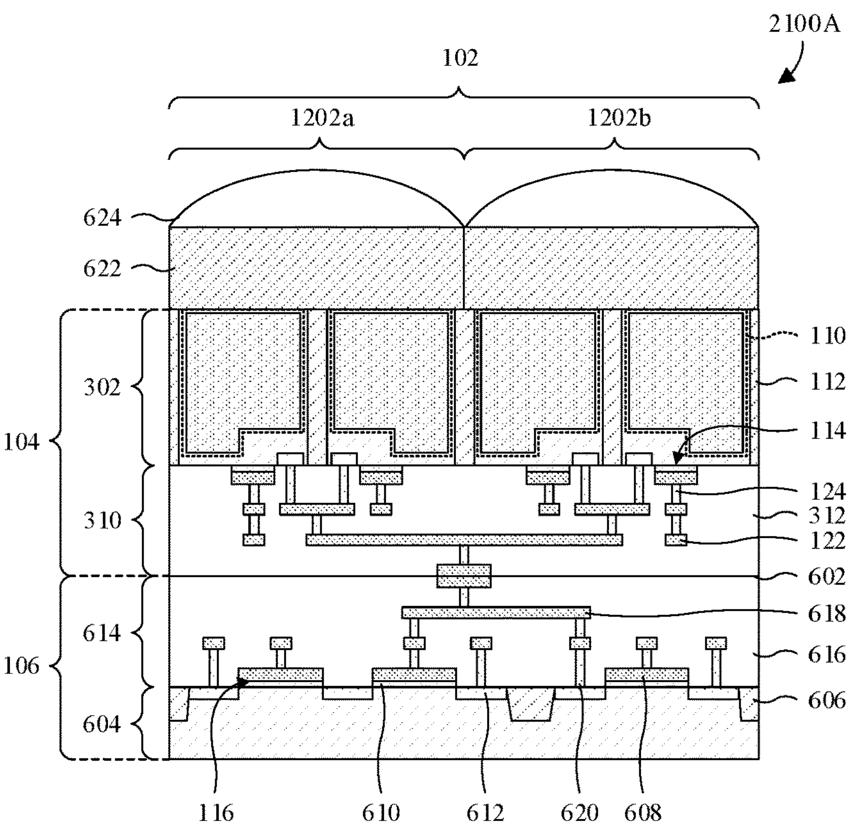
FIGS. 21A and 21B illustrate various views of some embodiments of the image sensor of FIG. 17.
Figure 21B:
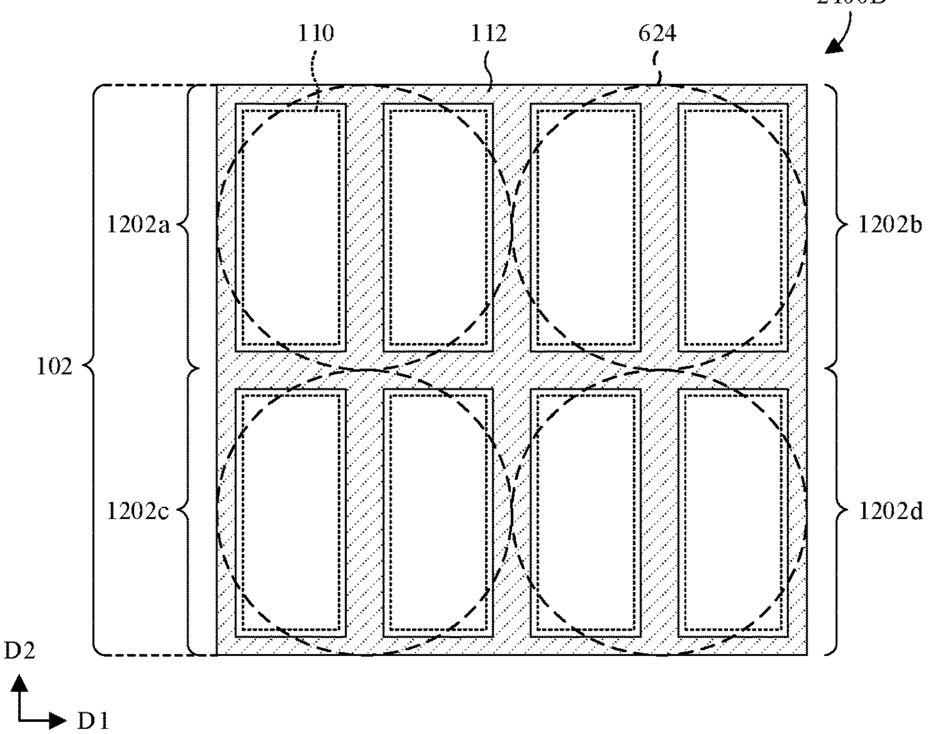

With reference to FIGS. 21A and 21B, various views 2100A, 2100B of some embodiments of the image sensor pixel of FIG. 17 are provided. FIG. 21A provides a cross-sectional view 2100A, and FIG. 21B provides a top layout view 2100B. As best seen in FIG. 21A, a plurality of color filters 622 and a plurality of micro lens 624 respectively overlie the plurality of photodetectors 110. As best seen in FIG. 21B, the two photodetectors of each of the plurality of sub-pixels 1202*a*-1202*d* are covered by a common color filter and a common micro lens. The plurality of color filters 622 and the plurality of micro lens 624 may, for example, be as their counterparts are described with regard to FIGS. 6A and 6B.

Figures 22, 23A:
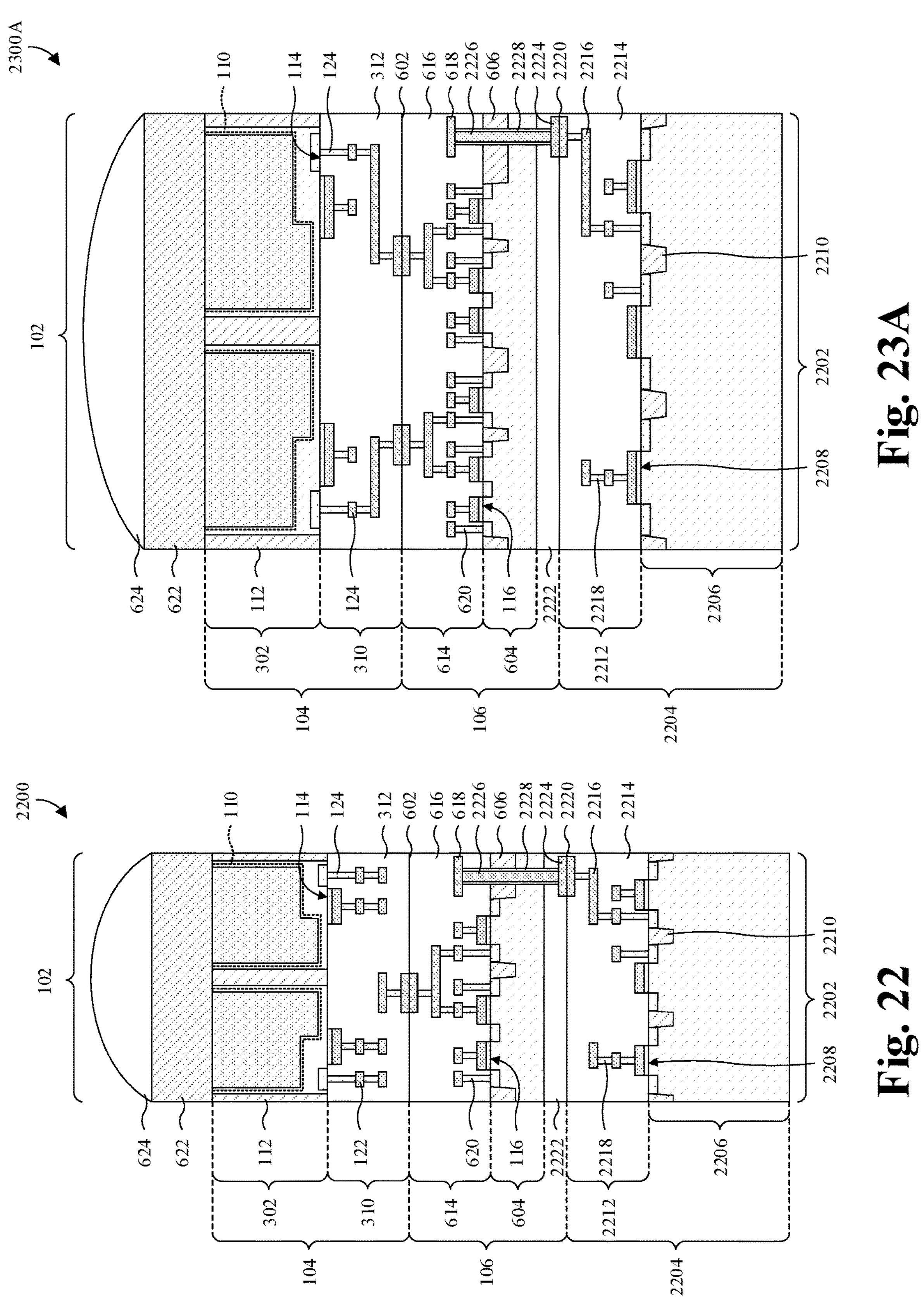
FIG. 22 illustrates a cross-sectional view of some embodiments of the image sensor of FIG. 1 in which the image sensor further comprises an application-specific IC (ASIC).
FIGS. 23A-23C illustrate cross-sectional views of some alternative embodiments of the image sensor of FIG. 22.

Thus far, the present disclosure has focused on the pixel 102. However, it is to be appreciated that the pixel 102 may be electrically coupled to an application-specific IC (ASIC). With reference to FIG. 22, a cross-sectional view 2200 of some embodiments of the image sensor of FIG. 1 is provided in which the image sensor further comprises an ASIC 2202 at a third IC die 2204 that underlies and is stacked with the second IC die 106.

The ASIC 2202 is configured to control operation of the pixel 102 and is shared amongst multiple instances of the pixel 102 when the pixel 102 repeats in a plurality of rows and a plurality of columns. The ASIC 2202 may, for example, comprise a row circuit, a column circuit, an analog-to-digital converter (ADC), a controller circuit, a digital-to-analog circuit (DAC), some other suitable circuit, the like, or any combination of the foregoing. Further, the ASIC 2202 may, for example, be formed by logic devices, including input/output (I/O) devices, core devices, the like, or any combination of the foregoing.

The third IC die 2204 comprises a third semiconductor substrate 2206 on which a plurality of logic devices 2208 are arranged to form the ASIC 2202. In some embodiments, the plurality of logic devices 2208 are MOSFETs, FinFETs, GAA FETs, nanosheet field-effect transistors, the like, or any combination of the foregoing. Further, the plurality of logic devices 2208 may, for example, be P-type field-effect transistors (FETs) and/or N-type FETs. The plurality of logic devices 2208 are separated from each by a STI structure 2210. The STI structure 2210 comprises a dielectric material, such as, for example, silicon oxide and/or the like. The third semiconductor substrate 2206 may, for example, be or comprise a bulk silicon substrate, a SOI substrate, or some other suitable type of semiconductor substrate.

A third interconnect structure 2212 overlies and electrically couples to the plurality of logic devices 2208. The third interconnect structure 2212 is in a third interconnect dielectric layer 2214. The third interconnect structure 2212 comprises a plurality of wires 2216 and a plurality of vias 2218 that are alternatingly stacked to form conductive paths leading from the plurality of logic devices 2208. The plurality of wires 2216 and the plurality of vias 2218 may, for example, be or comprise copper, aluminum, aluminum copper, tungsten, some other suitable metal(s) and/or conductive material(s), or any combination of the foregoing.

The second IC die 106 is bonded to the third IC die 2204 at an additional bond interface 2220. The additional bond interface 2220 may, for example, comprise a conductor-to-conductor bond interface and a dielectric-to-dielectric bond interface. The conductor-to-conductor bond interface may, for example, be metal-to-metal or the like.

To facilitate bonding between the second IC die 106 and the third IC die 2204, the second IC die 106 further comprises a backside dielectric layer 2222 and a backside pad 2224. The backside dielectric layer 2222 underlies the second semiconductor substrate 604 and directly contacts the third interconnect dielectric layer 2214 at the additional bond interface 2220. The backside pad 2224 is recessed into a bottom of the backside dielectric layer 2222 and directly contacts a corresponding one of the wires 2216 at the additional bond interface 2220.

A through substrate via (TSV) 2226 extends from the backside pad 2224 to the second interconnect structure 614 through the second semiconductor substrate 604. The TSV 2226 is conductive and is separated from the second semiconductor substrate 604 by a TSV dielectric liner 2228. The backside pad 2224 and/or the TSV 2226 may, for example, be or comprise copper, aluminum, aluminum copper, tungsten, some other suitable metal(s) and/or conductive material(s), or any combination of the foregoing.

Figures 23B, 23C:
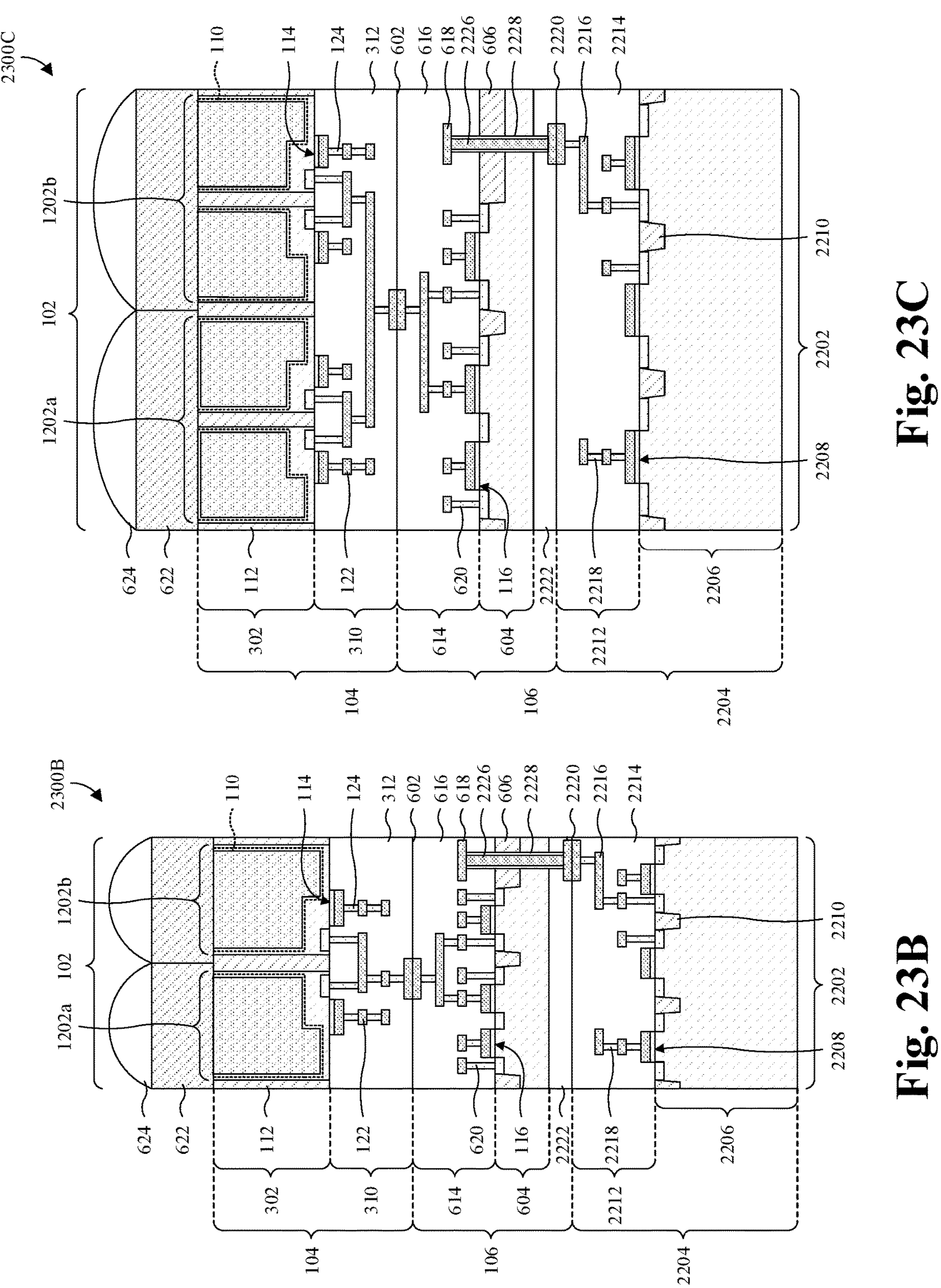

With reference to FIGS. 23A-23C, cross-sectional views 2300A-2300C of some alternative embodiments of the image sensor of FIG. 22 are provided. FIG. 23A employs embodiments of the pixel 102 as described with regard to FIG. 7. FIG. 23B employs embodiments of the pixel 102 as described with regard to FIG. 12. FIG. 23C employs embodiments of the pixel 102 as described with regard to FIG. 17.

Figure 24:
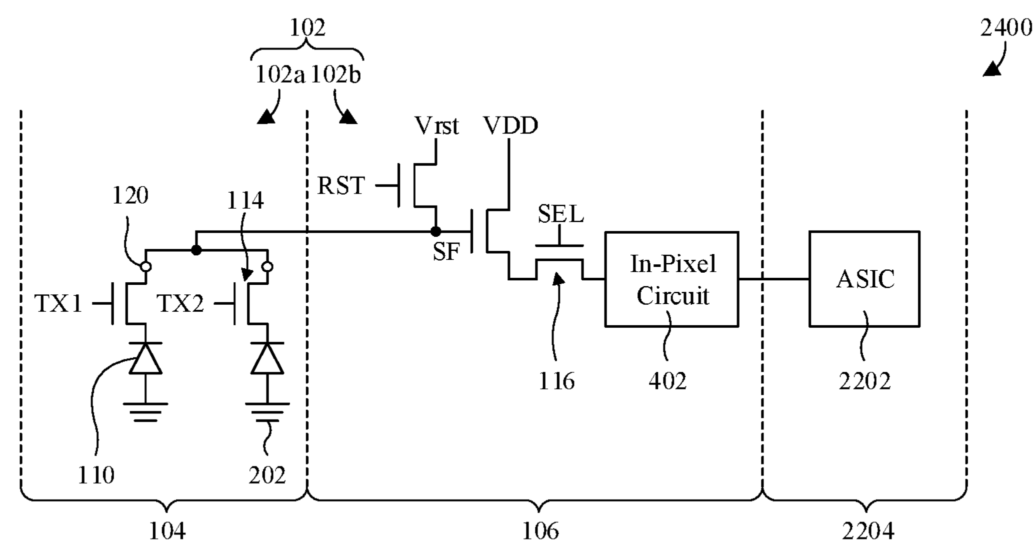
FIG. 24 illustrates a circuit diagram of some embodiments of the image sensor of FIG. 22.

With reference to FIG. 24, a circuit diagram 2400 of some embodiments of the image sensor of FIG. 22 is provided in which the pixel 102 comprises the in-pixel circuit 402. In alternative embodiments, the in-pixel circuit 402 may be omitted and the select transistor SEL electrically couples directly to the ASIC 2202.

Figure 25A:
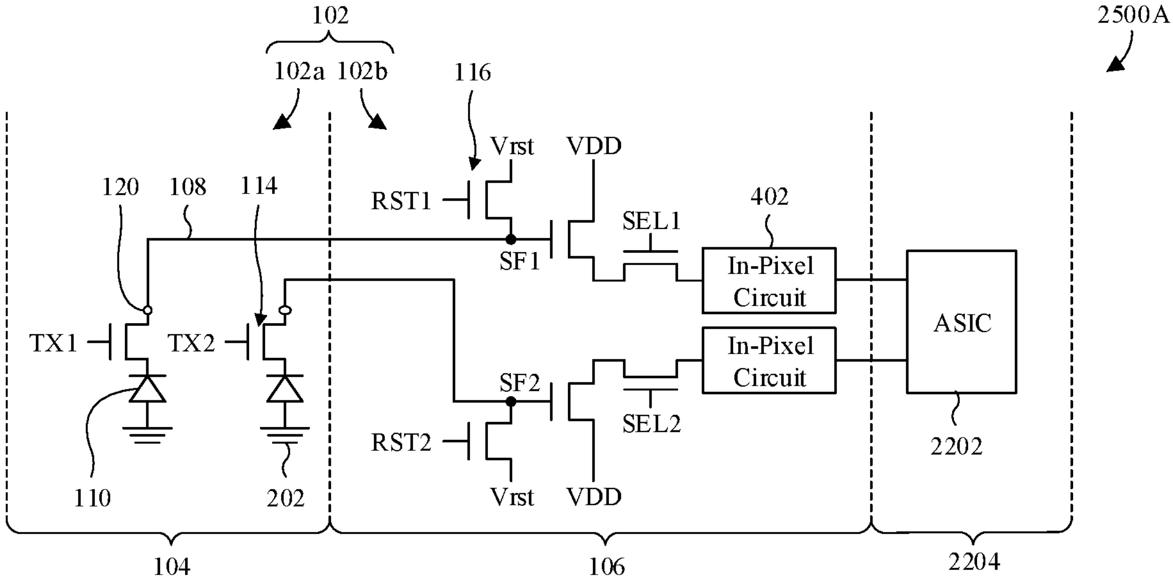
FIGS. 25A-25C illustrate circuit diagrams of some alternative embodiments of the image sensor of FIG. 24.
Figure 25B:
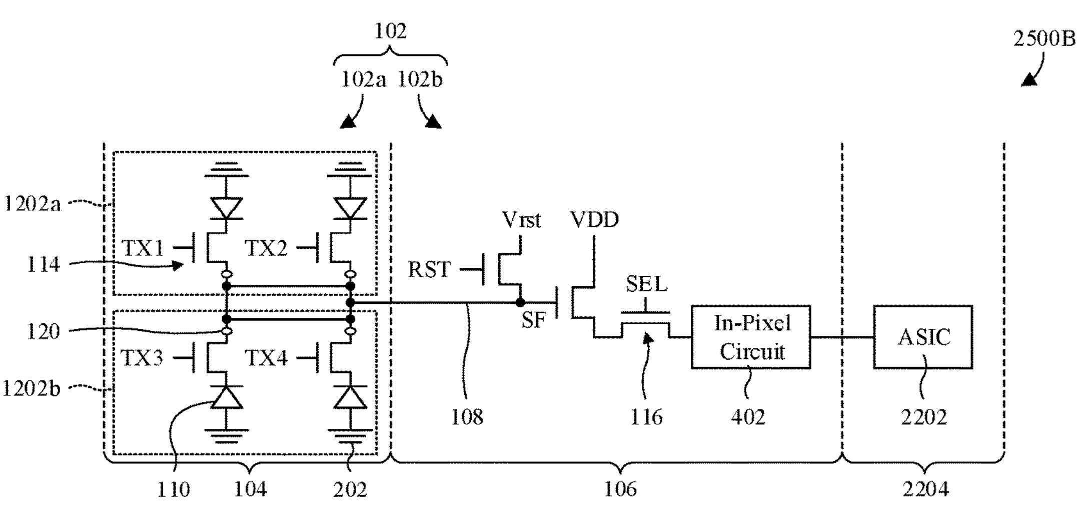
Figure 25C:
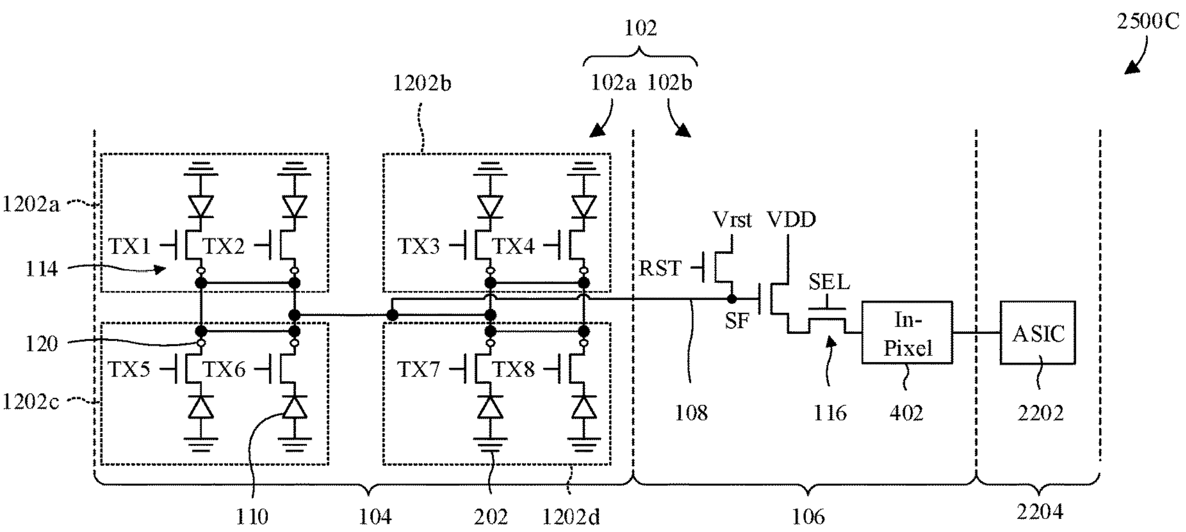

With reference to FIGS. 25A-25C, circuit diagrams 2500A-2500C of some alternative embodiments of the image sensor of FIG. 24 are provided. FIG. 25A employs embodiments of the pixel 102 as described with regard to FIG. 8 and may, for example, correspond to the image sensor of FIG. 23A. FIG. 25B employs embodiments of the pixel 102 as described with regard to FIG. 13 and may, for example, correspond to the image sensor of FIG. 23B. FIG. 25C employs embodiments of the pixel 102 as described with regard to FIG. 18 and may, for example, correspond to the image sensor of FIG. 23C.

Figure 26A:
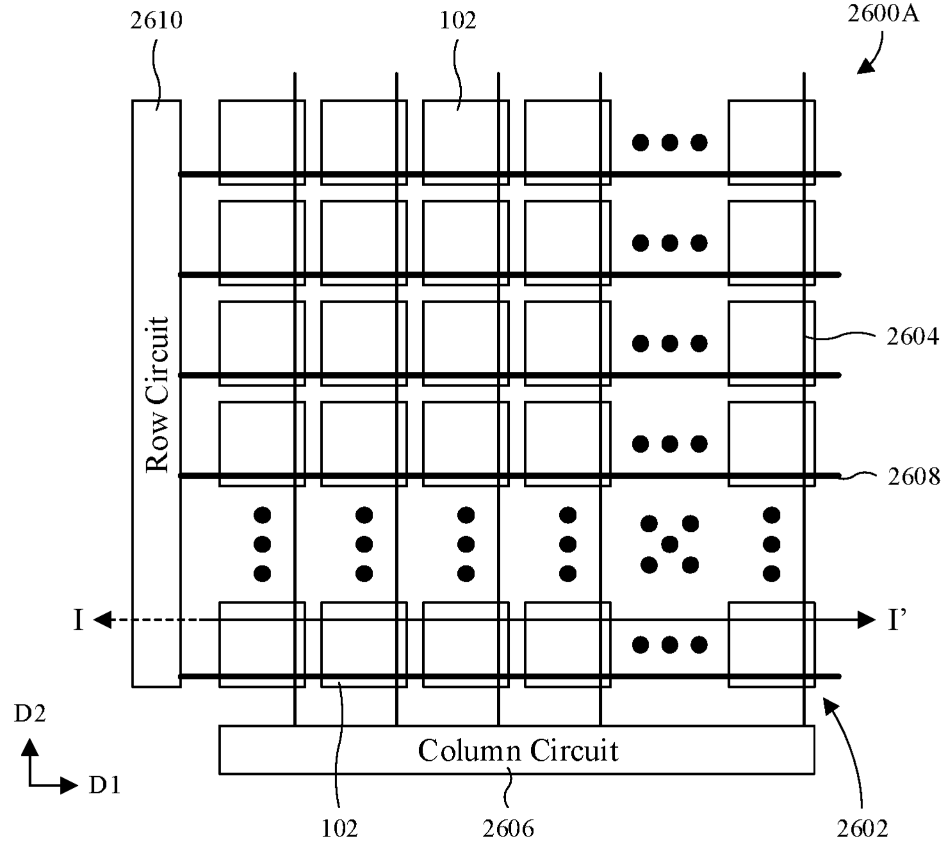
FIGS. 26A and 26B illustrate various views of some embodiments of an image sensor comprising a pixel array according to aspects of the present disclosure.
Figure 26B:
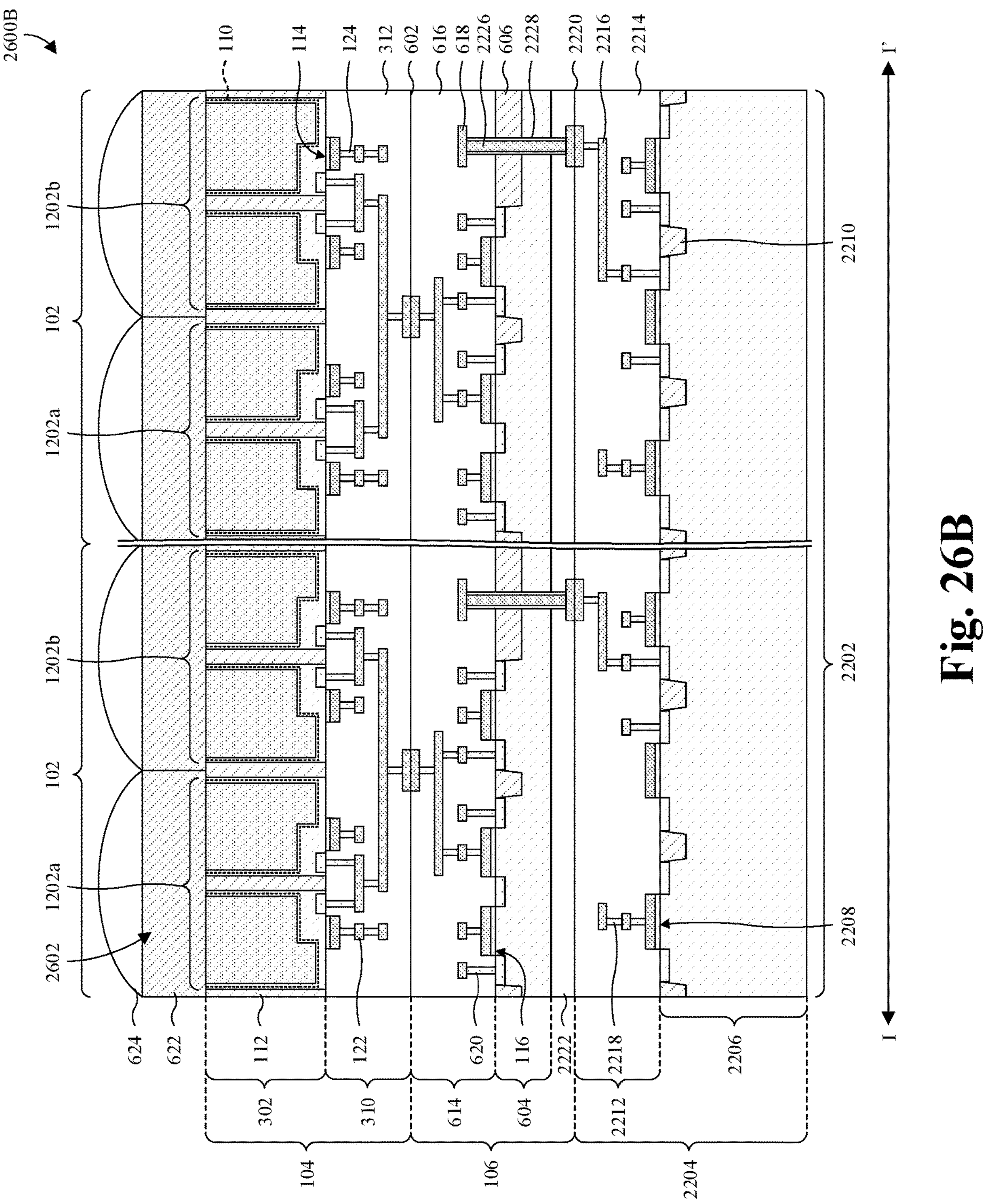

With reference to FIGS. 26A and 26B, various views 2600A, 2600B of some embodiments of an image sensor comprising a pixel array 2602 according to aspects of the present disclosure are provided. FIG. 26A provides a top layout view 2600A, whereas FIG. 26B provides a cross-sectional view 2600B along solid portions of line I-I' in FIG. 26A. The pixel array 2602 comprises a plurality of pixels 102 in a plurality of rows (e.g., 5 or more rows) and a plurality of columns (e.g., 5 or more columns).

Focusing on FIG. 26A, a plurality of column lines 2604 extend across the pixel array 2602 from a column circuit 2606 to electrically couple the column circuit 2606 to the plurality of pixels 102. The plurality of column lines 2604 are elongated in parallel along the columns of the pixel array 2602. Further, the plurality of column lines 2604 are individual to the columns and each electrically couples to the pixels in the individual column. Such electrical coupling may, for example, be at output terminals (e.g., the output terminal OUT of FIG. 1, the first output terminal OUT1 of FIG. 7, etc.) of the plurality of pixels 102. The column circuit 2606 facilitates readout of the pixel array 2602 and outputs data read from the pixel array 2602. The column circuit 2606 may, for example, comprise a column decoder, sense amplifiers, correlated double samplers (CDSs), the like, or any combination of the foregoing.

In some embodiments, each of the plurality of column lines 2604 represents a single conductive line. In alternative embodiments, each of the plurality of column lines 2604 represents two or more conductive lines. In some embodiments, the plurality of column lines 2604 are formed by the second interconnect structure 614 in FIG. 26B.

A plurality of row lines 2608 extend across the pixel array 2602 from a row circuit 2610 to electrically couple the row circuit 2610 to the plurality of pixels 102. The plurality of row lines 2608 are elongated in parallel along the rows of the pixel array 2602. Further, the plurality of row lines 2608 are individual to the rows and each electrically couples to the pixels in the individual row. Such electrical coupling may, for example, be at gates (e.g., of the first pixel transistors 114) of the plurality of pixels 102. The row circuit 2610 facilitates readout of the pixel array 2602 and may, for example, comprise a row decoder and/or the like.

In some embodiments, each of the plurality of row lines 2608 represents a single conductive line. In alternative embodiments, each of the plurality of row lines 2608 represents two or more conductive lines. In some embodiments, the plurality of row lines 2608 are formed by the second interconnect structure 614 in FIG. 26B.

As best seen in FIG. 26B, the plurality of pixels 102 are each individually as illustrated as in FIG. 23C. However, in alternative embodiments, the plurality of pixels 102 are each individually as in any one or combination of FIG. 1 to FIG. 25C. Further, the image sensor comprises the ASIC 2202, which may, for example, implement or otherwise comprise the column circuit 2606 and/or the row circuit 2610.

As described above, the plurality of pixels 102 may have a horizontal orientation in a top layout view or a vertical orientation in a top layout view. For example, the pixels 102 of FIGS. 1, 5A, 7, 10A, 12, 15A, 17, and 20A have the horizontal orientation, whereby the photodetectors 110 are paired in a horizontal dimension (in top layout) into dual-PD pixels or dual-PD sub-pixels. On the other hand, the pixels 102 of FIGS. 5B, 10B, 15B, and 20B have the vertical orientation, whereby the photodetectors 110 are paired in a vertical dimension (in top layout) into dual-PD pixels or dual-PD sub-pixels. The horizontal dimension corresponds to the first dimension D1, which is the dimension along which the plurality of row lines 2608 are elongated in parallel to the row circuit 2610. The vertical dimension corresponds to the second dimension D2, which is the dimension along which the plurality of column lines 2604 are elongated in parallel to the column circuit 2606.

When the pixel array 2602 is made up of pixels with the horizontal orientation, the pixel array 2602 is readout a single photodetector row at a time. On the other hand, when the pixel array 2602 is made up of pixels with the vertical orientation, the pixel array 2602 is readout two adjoining photodetector rows at a time. Note that a photodetector row is to be contrasted with a pixel row. A pixel row corresponds to a row of pixels, whereas a photodetector row corresponds to a row of photodetectors. Such a distinction is made because each of the plurality of pixels 102 may contribute to one or more photodetector rows depending on embodiment.

Figure 27:
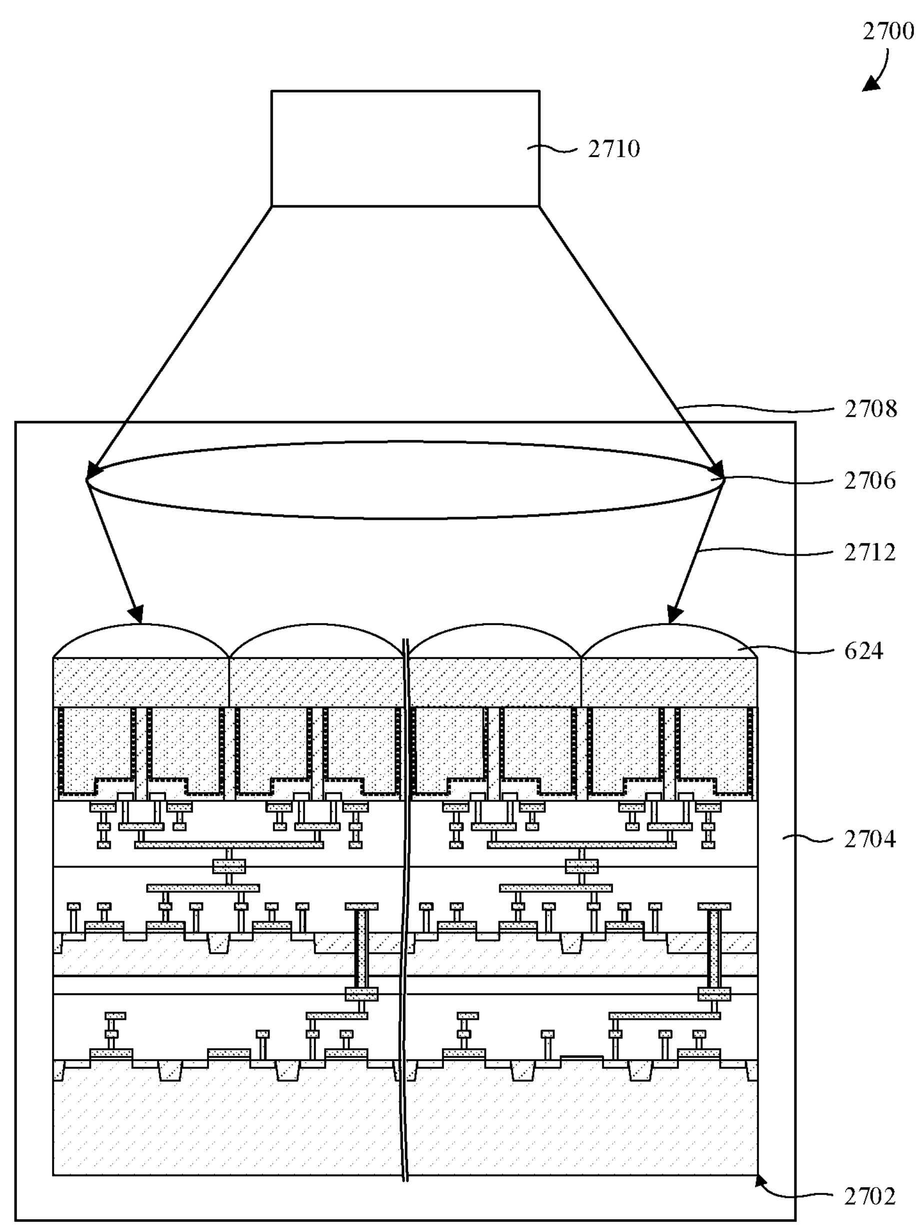
FIG. 27 illustrates a cross-sectional view of some embodiments of a camera system comprising the image sensor of FIGS. 26A and 26B.

With reference to FIG. 27, a cross-sectional view 2700 of some embodiments of a camera system comprising the image sensor of FIGS. 26A and 26B (labeled as 2702) is provided. The image sensor 2702 is in a housing 2704 and underlies a lens 2706. The lens 2706 is in the housing 2704 and is at a top of the housing 2704. Further, the lens 2706 is configured to focus radiation 2708 from an optical scene 2710 into focused radiation 2712. Such focusing may, for example, be achieved by moving the lens 2706 towards and away from the image sensor 2702 until the focused radiation 2708 is properly focused on the image sensor 2702.

Whether the focused radiation 2708 is properly focused on the image sensor 2702 may, for example, be determined by measuring the focused radiation 2712 separately at left and right photodetectors underlying a given micro lens 624. When phases of the two resulting signals are the same, focused radiation 2712 is properly focused. This may be extended to each left-right pair of photodetectors for faster, more accurate focusing.

With reference to FIGS. 28A and 28B, 29, 30A and 30B, 31-35, 36A and 36B, and 37-43, a series of views of some embodiments of a method for forming an image sensor in which a pixel has a dual-PD layout and spans a first IC die and a second IC die. Figures labeled with a suffix of "B" correspond to top layout views. Figures labeled with a suffix of "A", or with no letter suffix, correspond to cross-sectional views. Further, figures labeled with a suffix of "A" correspond to like numbered figures with a suffix of "B" and are taken along line J-J', line K-K', or line L-L' (whichever is present) in like number figures with a suffix of "B".

Figures 28A, 28B:
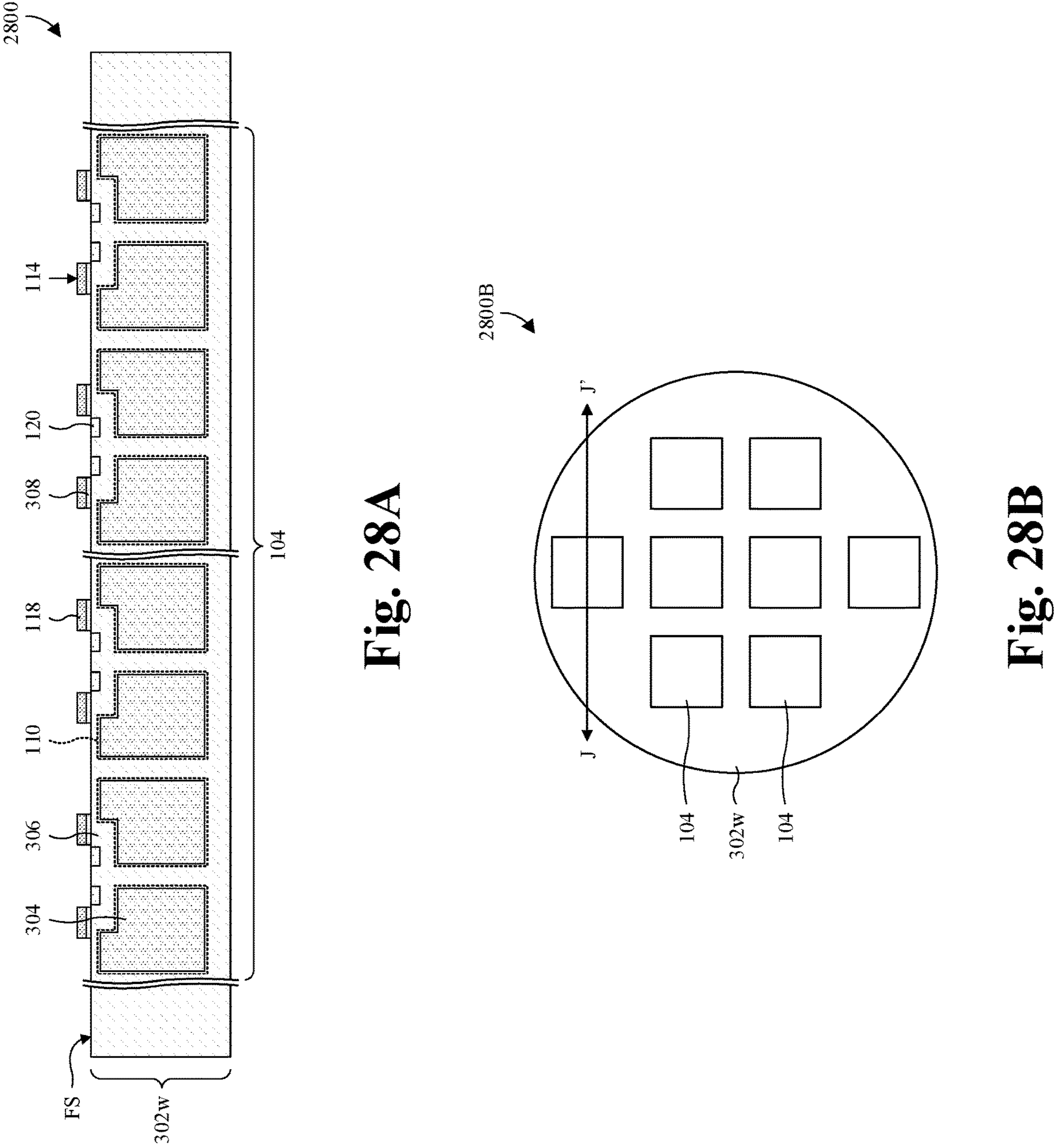
FIGS. 28A and 28B, 29, 30A and 30B, 31-35, 36A and 36B, and 37-43 illustrate a series of views of some embodiments of a method for forming an image sensor comprising a pixel that has a dual-PD layout and that spans a first IC die and a second IC die.

As illustrated by FIGS. 28A and 28B to FIG. 29, a first IC die 104 is formed repeating across a first wafer 302*w* with a die layout. FIG. 28B corresponds to a top layout view 2800B, whereas FIGS. 28A and 29 correspond to cross-sectional views 2800A, 2900 along line J-J' in FIG. 28B. The first wafer 302*w* may, for example, be a semiconductor wafer or the like and may, for example, also be known as a first substrate or the like.

Focusing on FIG. 28A, a plurality of photodetectors 110 are formed in a frontside FS of the first wafer 302*w*. The plurality of photodetectors 110 comprise individual collector regions 304 in the first wafer 302*w*. The collector regions 304 have a first doping type (e.g., N-type or P-type) and are surrounded by a well or bulk region 306 of the first wafer 302*w*, which has a second doping type (e.g., P-type or N-type) opposite the first doping type. The plurality of photodetectors 110 may, for example, be or comprise pinned photodiodes or the like.

Additionally, a plurality of FDNs 120 are formed in the frontside FS of the first wafer 302*w*, and a plurality of first pixel transistors 114 are formed on the frontside FS of the first wafer 302*w*. The plurality of FDNs 120 correspond to doped regions of the first wafer 302*w*, which share a doping type with the collector regions 304. Further, the plurality of FDNs 120 are individual to and respectively overlie the plurality of photodetectors 110.

The plurality of first pixel transistors 114 are individual to and respectively border the plurality of photodetectors 110. The plurality of first pixel transistors 114 comprise individual gate electrodes 118, individual gate dielectric layers 308, and individual pairs of source/drain regions. The gate electrodes 118 respectively overlie the gate dielectric layers 308 to form gate stacks. First source/drain regions of the plurality of first pixel transistors 114 are formed by the collector regions 304, which are on first sides of the gate stacks. Second source/drain regions of the plurality of first pixel transistors 114 are formed by the plurality of FDNs 120, which are on second sides of the gate stacks respectively opposite the first sides.

Figures 29, 30A:
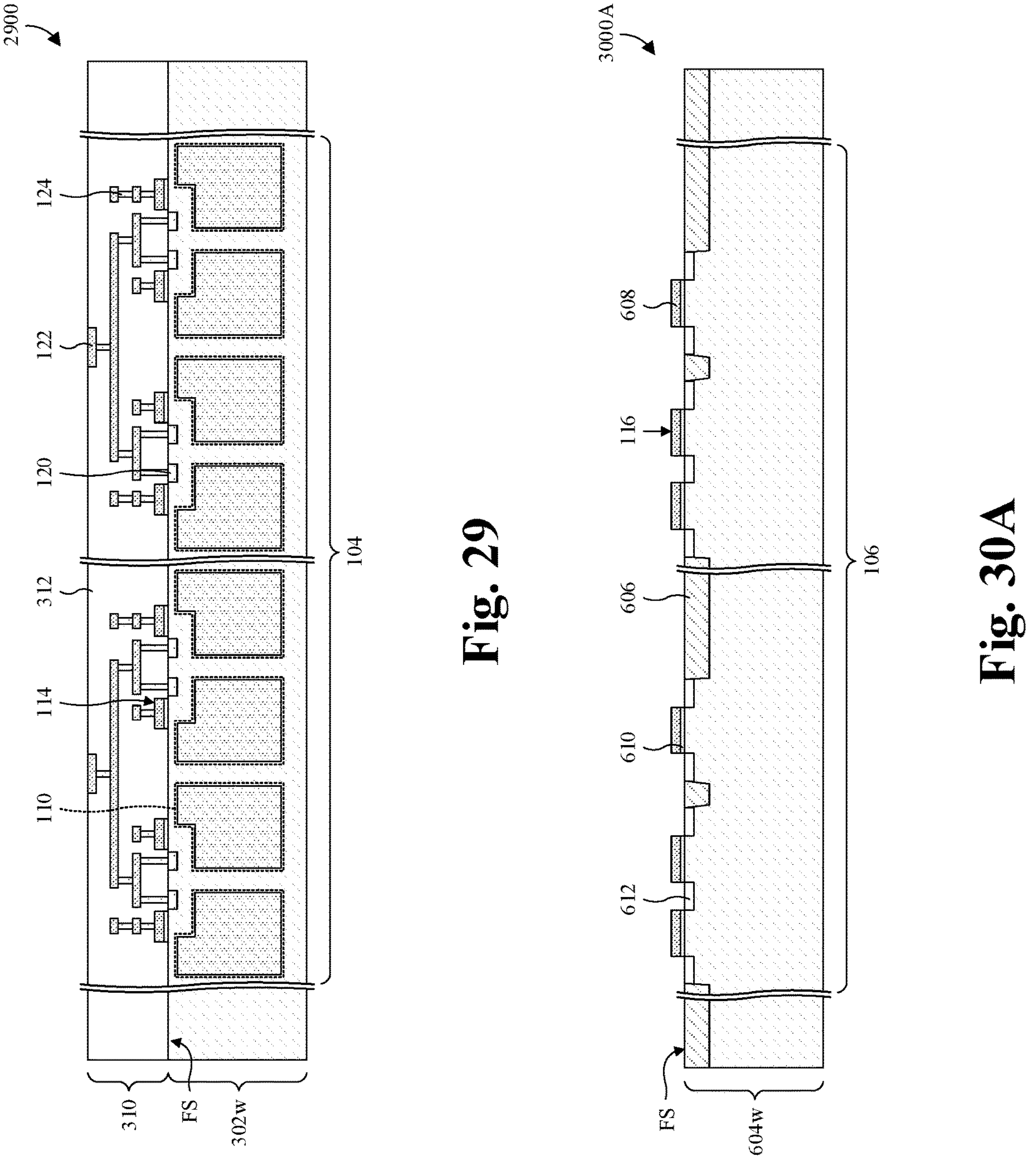

Focusing on FIG. 29, a first interconnect dielectric layer 312 and a first interconnect structure 310 are formed on the frontside FS of the first wafer 302*w*. The first interconnect dielectric layer 312 covers the plurality of first pixel transistors 114. The first interconnect structure 310 is in the first interconnect dielectric layer 312, electrically coupled to the plurality of first pixel transistors 114. The first interconnect structure 310 comprises a plurality of wires 122 and a plurality of vias 124. The plurality of wires 122 and the plurality of vias 124 are grouped respectively into wire levels and via levels that are alternatively stacked to form conductive paths leading from the plurality of first pixel transistors 114.

Figures 30B, 31:
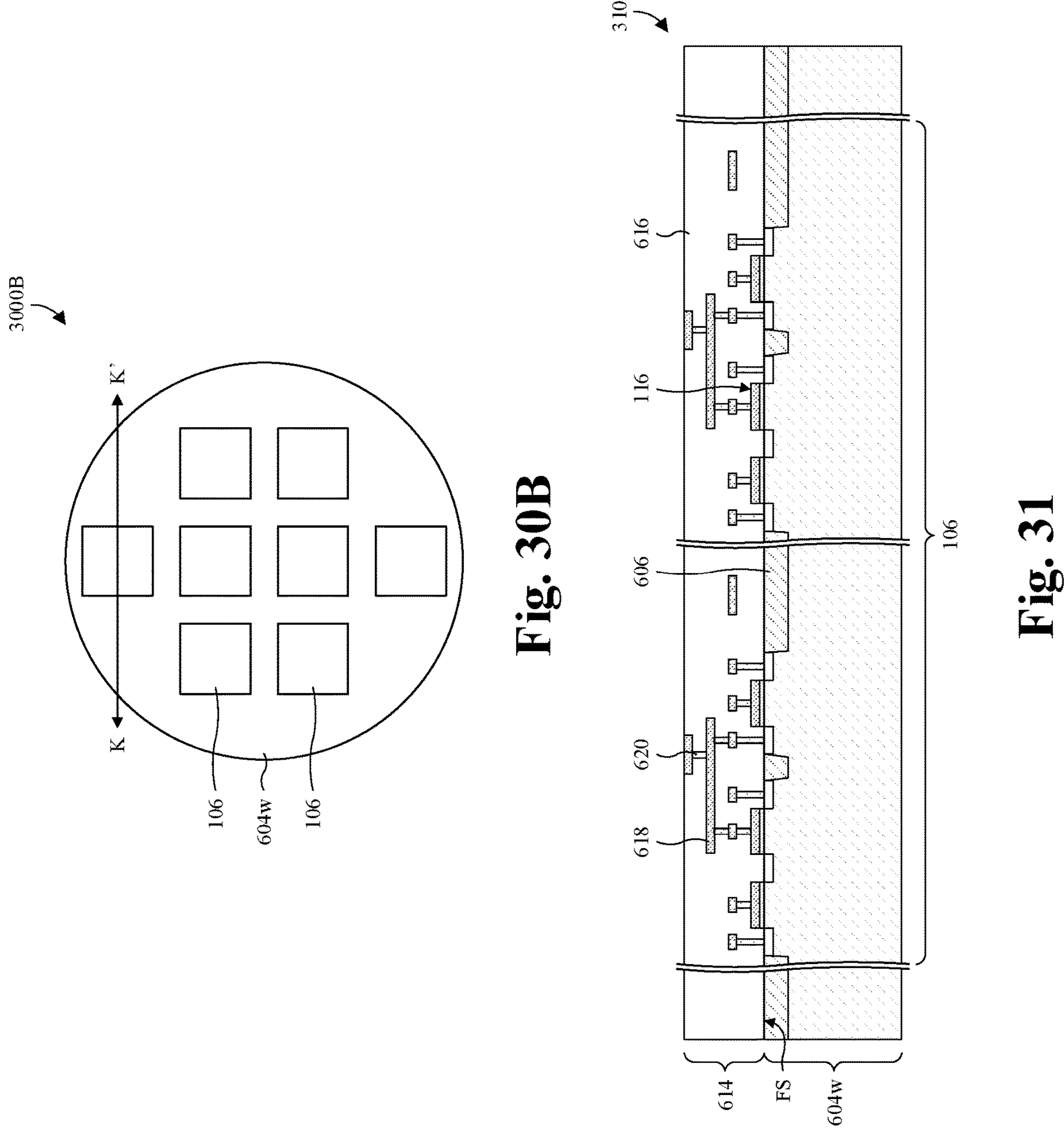

As illustrated by FIGS. 30A and 30B to FIG. 31, a second IC die 106 is formed repeating across a second wafer 604*w* with a die layout, which is the same as the die layout that the first IC die 104 repeats across the first wafer 302*w* with. FIG. 30B corresponds to a top layout view 3000B, whereas FIGS. 30A and 31 correspond to cross-sectional views 3000A, 3100 along line K-K' in FIG. 30B. The second wafer 604*w* may, for example, be a semiconductor wafer or the like and may, for example, also be known as a second substrate or the like.

Focusing on FIG. 30A, a plurality of second pixel transistors 116 and an STI structure 606 are formed on the frontside FS of the second wafer 604*w*. The STI structure 606 separates the plurality of second pixel transistors 116 from each other. The plurality of second pixel transistors 116 comprise individual gate electrodes 608, individual gate dielectric layers 610, and individual source/drain regions 612. The gate electrodes 608 respectively overlie the gate dielectric layers 610 to form gate stacks between corresponding source/drain regions.

Focusing on FIG. 31, a second interconnect dielectric layer 616 and a second interconnect structure 614 are formed on the frontside FS of the second wafer 604*w*. The second interconnect dielectric layer 616 covers the plurality of second pixel transistors 116. The second interconnect structure 614 is in the second interconnect dielectric layer 616, electrically coupled to the plurality of second pixel transistors 116. The second interconnect structure 614 comprises a plurality of wires 618 and a plurality of vias 620. The plurality of wires 618 and the plurality of vias 620 are grouped respectively into wire levels and via levels that are alternatively stacked to form conductive paths leading from the plurality of second pixel transistors 116.

Figure 32:
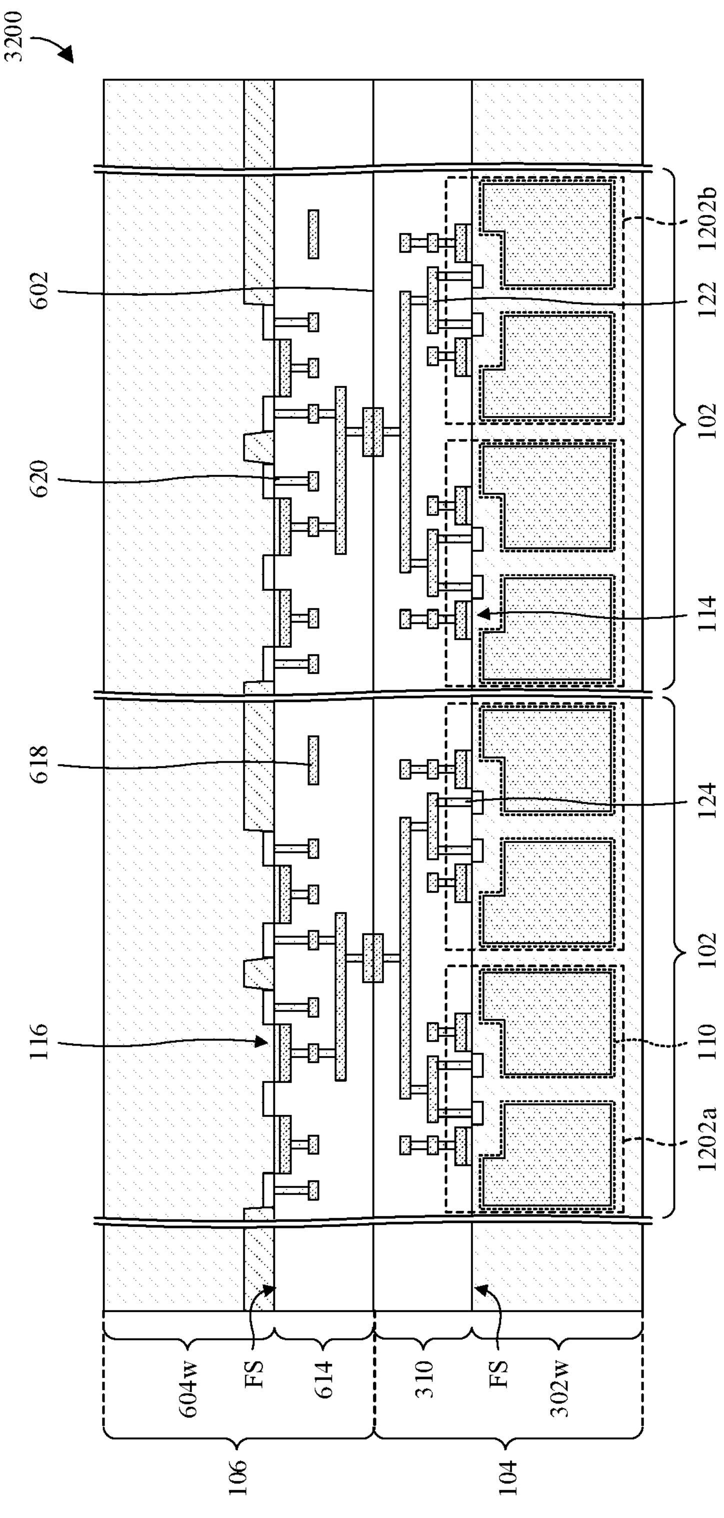

As illustrated by a cross-sectional view 3200 of FIG. 32, the second wafer 604*w* is vertically flipped and bonded to the first wafer 302*w* at a bond interface 602 to form a two-tier semiconductor stack. Because the frontsides FS of the first and second wafers 302*w*, 604*w* face each other, such bonding is frontside to frontside. Further, because the first IC die 104 and the second IC die 106 have the same die layout, the second IC die 106 bonds to the first IC die 104 at the bond interface 602.

The bond interface 602 may, for example, comprise a conductor-to-conductor bond interface and a dielectric-to-dielectric bond interface. The conductor-to-conductor bond interface may, for example, correspond to a bond interface between wires of the first interconnect structure 310 and wires of the second interconnect structure 614. The dielectric-to-dielectric bond interface may, for example, correspond to a bond interface between the first interconnect dielectric layer 312 and the second interconnect dielectric layer 616.

The bonding forms a plurality of pixels 102 with a dual-PD layout. The plurality of pixels 102 are as their counterpart is in any one or combination of FIGS. 17 to 21B. As such, the plurality of pixels 102 each comprise a plurality of dual-PD sub-pixels, including a first sub-pixel 1202*a* and a second sub-pixel 1202*b*. In alternative embodiments, the first IC die 104 and the second IC die 106 are formed the plurality of pixels 102 are as in any one or combination of FIGS. 1 to 6B, any one or combination of FIGS. 7 to 11B, or any one or combination of FIGS. 12 to 16B.

Because the plurality of first pixel transistors 114 and the plurality of second pixel transistors 116 (collectively the plurality of pixel transistors 114, 116) are split amongst the first IC die 104 and the second IC die 106, the first IC die 104 does not accommodate all of the plurality of pixel transistors 114, 116. As such, area of the first IC die 104 that would otherwise be used by the plurality of second pixel transistors 116 may be used by the plurality of photodetectors 110. This allows the plurality of photodetectors 110 to be larger than they would otherwise be, which allows enhanced performance (e.g., FWC or the like) and/or scaling down.

Figures 33, 34:
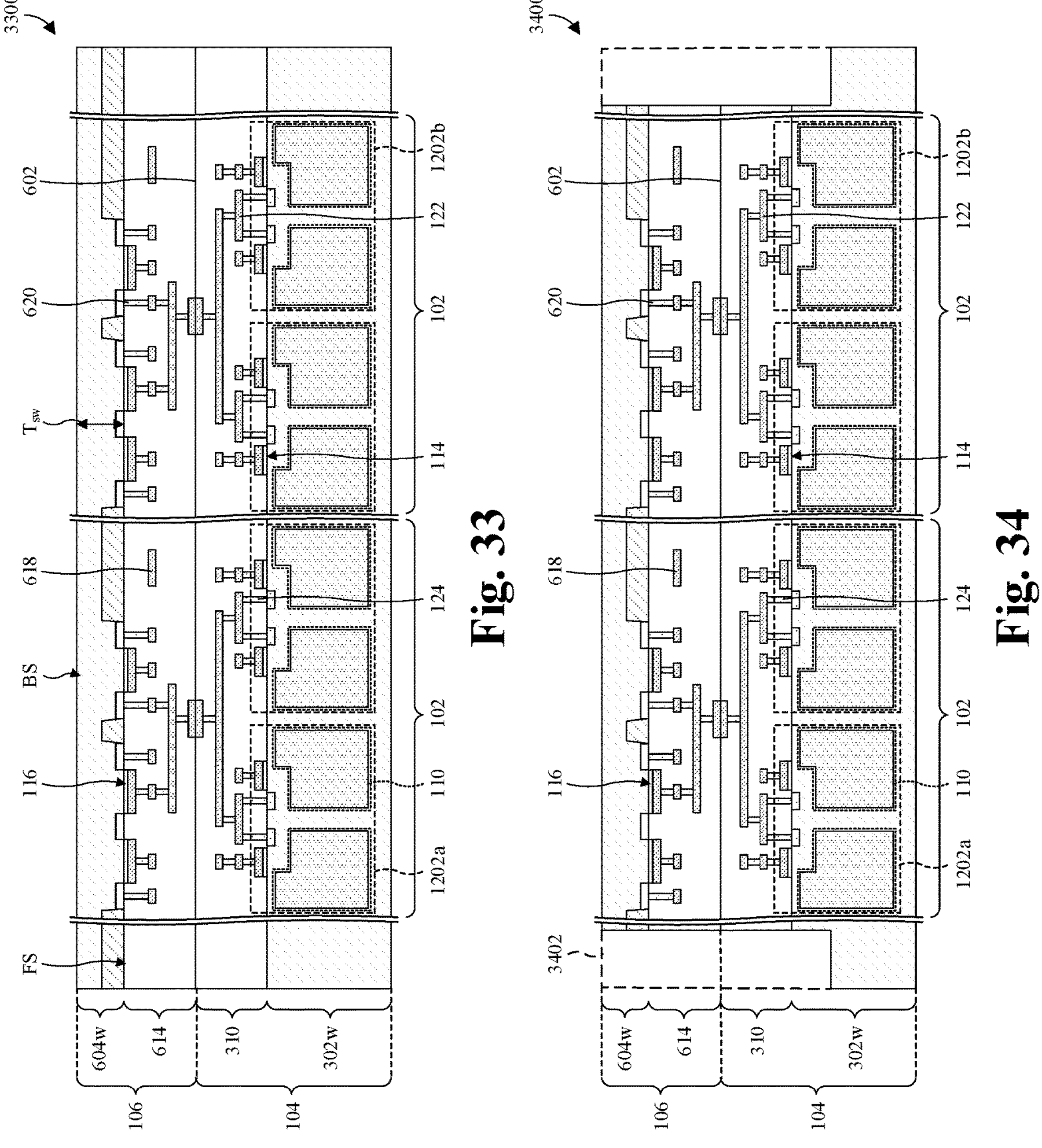

As illustrated by a cross-sectional view 3300 of FIG. 33, the second wafer 604*w* is thinned from a backside BS of the second wafer 604*w*, which is opposite the frontside FS of the second wafer 604*w*. As such, a thickness $T_{sw}$ of the second wafer 604*w* is reduced. The thinning may, for example, be performed by chemical mechanical polishing (CMP), grinding, etching, some other suitable process, or any combination of the foregoing.

As illustrated by a cross-sectional view 3400 of FIG. 34, the two-tier semiconductor stack of FIG. 33 undergoes trimming in which edge portions 3402 are removed. The trimming may, for example, be performed by grinding, etching, some other suitable process, or any combination of the foregoing.

Figures 35, 36A:
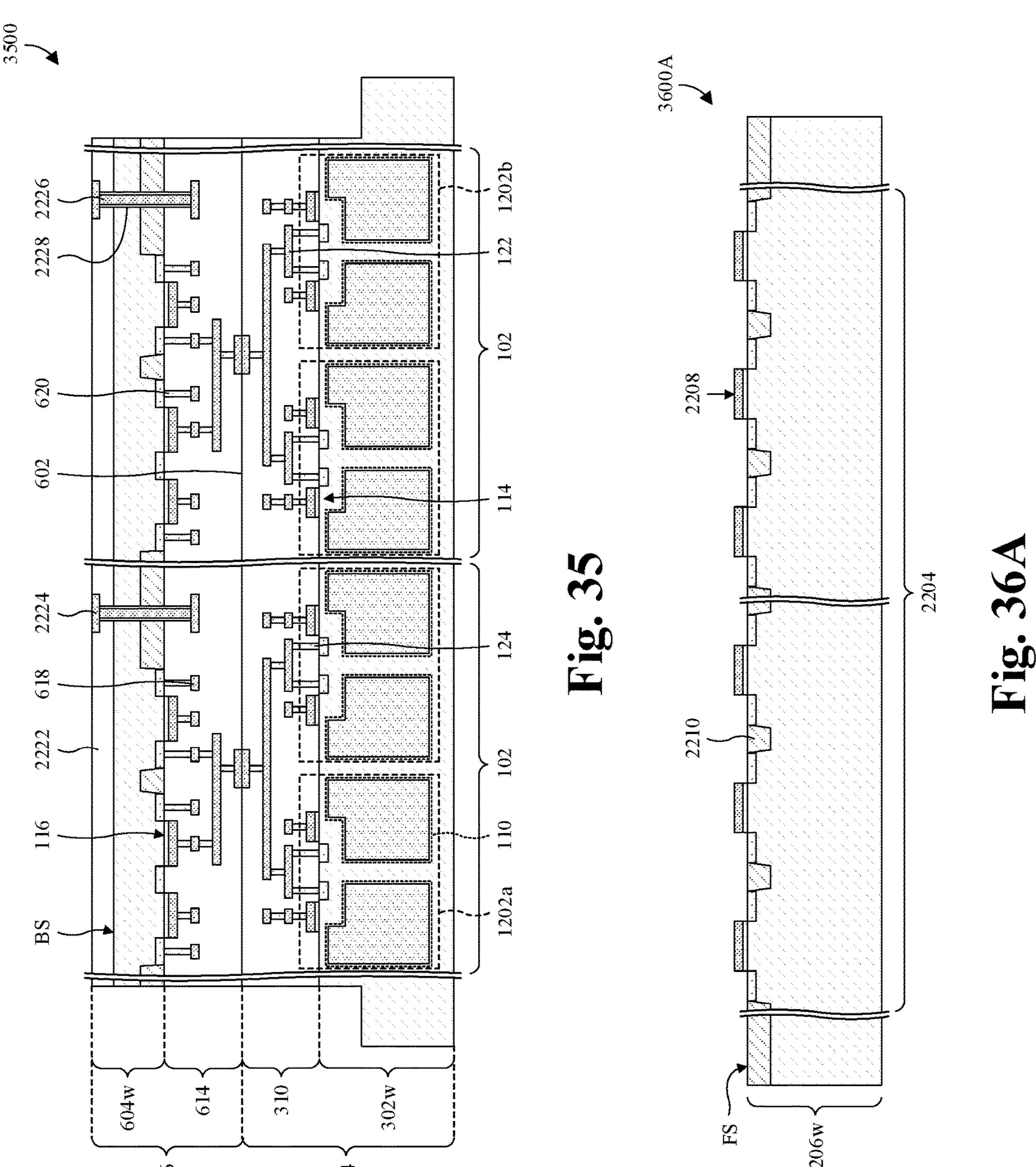

As illustrated by a cross-sectional view 3500 of FIG. 35, a plurality of TSVs 2226, a plurality of backside pads 2224, and a backside dielectric layer 2222 are formed on a backside BS of the second wafer 604*w*. The plurality of backside pads 2224 are recessed into a top of the backside dielectric layer 2222. Further, the plurality of backside pads 2224 are individual to and respectively overlie the plurality of pixels 102. The plurality of TSVs 2226 extend respectively from the plurality of backside pads 2224, through the second wafer 604*w*, to the second interconnect structure 614. Further, the plurality of TSVs 2226 are separated from the second wafer 604*w* by individual TSV dielectric liners 2228.

Figures 36B, 37:
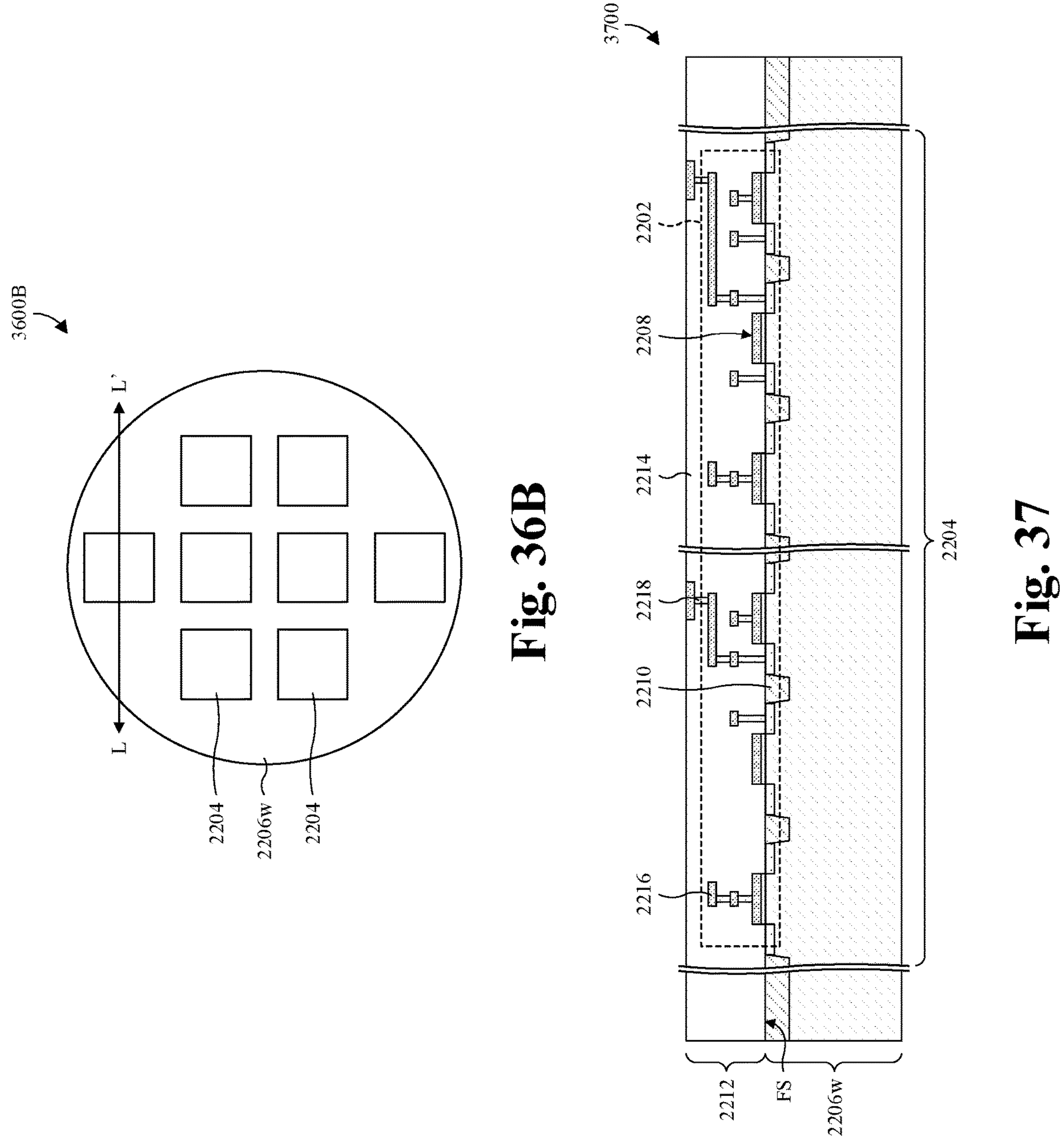

As illustrated by FIGS. 36A and 36B to FIG. 37, a third IC die 2204 is formed repeating across a third wafer 2206*w* with a die layout, which is the same as the die layout that the second IC die 106 repeats across the second wafer 604*w* with. FIG. 36B corresponds to a top layout view 3600B, whereas FIGS. 36A and 37 correspond to cross-sectional views 3600A, 3700 along line L-L' in FIG. 36B. The third wafer 2206*w* may, for example, be a semiconductor wafer or the like and may, for example, also be known as a third substrate or the like.

Focusing on FIG. 36A, a plurality of logic devices 2208 and an STI structure 2210 are formed on the frontside FS of the third wafer 2206*w*. The STI structure 2210 separates the plurality of logic devices 2208 from each other. In some embodiments, the plurality of logic devices 2208 comprise individual gate electrodes, individual gate dielectric layers, and individual source/drain regions. The gate electrodes respectively overlie the gate dielectric layers to form gate stacks between corresponding source/drain regions.

Focusing on FIG. 37, a third interconnect dielectric layer 2214 and a third interconnect structure 2212 are formed on the frontside FS of the third wafer 2206*w*. The third interconnect dielectric layer 2214 covers the plurality of logic devices 2208. The third interconnect structure 2212 is in the third interconnect dielectric layer 2214, electrically coupled to the plurality of logic devices 2208. The third interconnect structure 2212 comprises a plurality of wires 2216 and a plurality of vias 2218. The plurality of wires 2216 and the plurality of vias 2218 are grouped respectively into wire levels and via levels that are alternatively stacked to form conductive paths leading from the plurality of logic devices 2208.

The third interconnect structure 2212, together with the plurality of logic devices 2208, form an ASIC 2202. As seen hereafter, the ASIC 2202 is subsequently electrically coupled to the plurality of pixels 102. The ASIC 2202 is configured to control operation of the plurality of pixels 102, which may, for example, be in array. The ASIC 2202 may, for example, comprise a row circuit, a column circuit, an ADC, a controller circuit, a DAC, some other suitable circuit, the like, or any combination of the foregoing.

Figure 38:
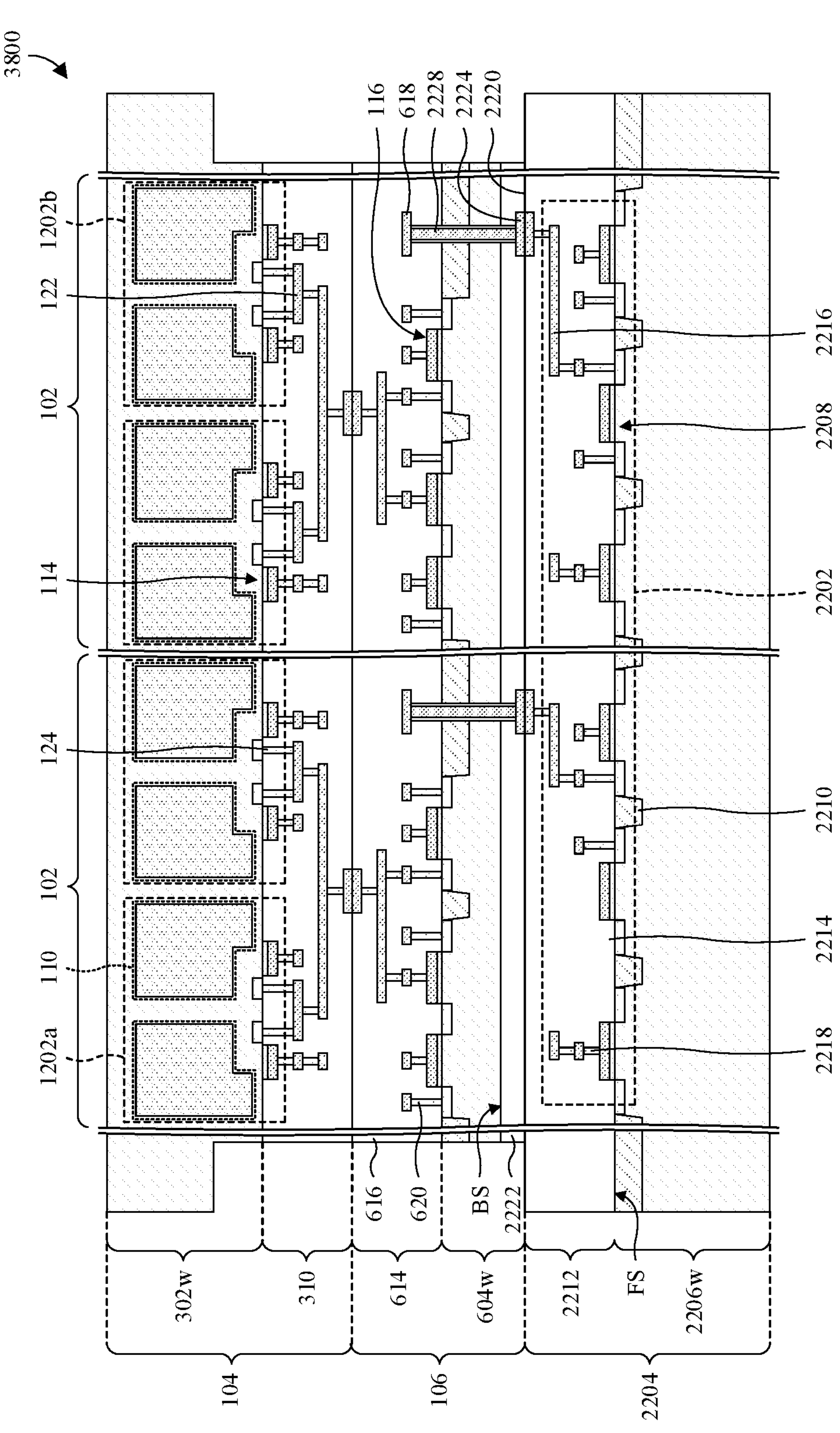

As illustrated by a cross-sectional view 3800 of FIG. 38, the two-tier semiconductor stack of FIG. 35 is vertically flipped and bonded to the third wafer 2206*w* at an additional bond interface 2220 to form a three-tier semiconductor stack. Because the backside BS of the second wafer 604*w* faces the frontside FS of the third wafer 2206*w*, such bonding is backside to frontside. Further, because the second IC die 106 and the third IC die 2204 have the same die layout, the third IC die 2204 bonds to the second IC die 106 at the additional bond interface 2220, thereby electrically coupling the ASIC 2202 to the plurality of pixels 102.

The additional bond interface 2220 may, for example, comprise a conductor-to-conductor bond interface and a dielectric-to-dielectric bond interface. The conductor-to-conductor bond interface may, for example, correspond to a bond interface between wires of the third interconnect structure 2212 and the backside pads 2224. The dielectric-to-dielectric bond interface may, for example, correspond to a bond interface between the third interconnect dielectric layer 2214 and the backside dielectric layer 2222.

Figure 39:
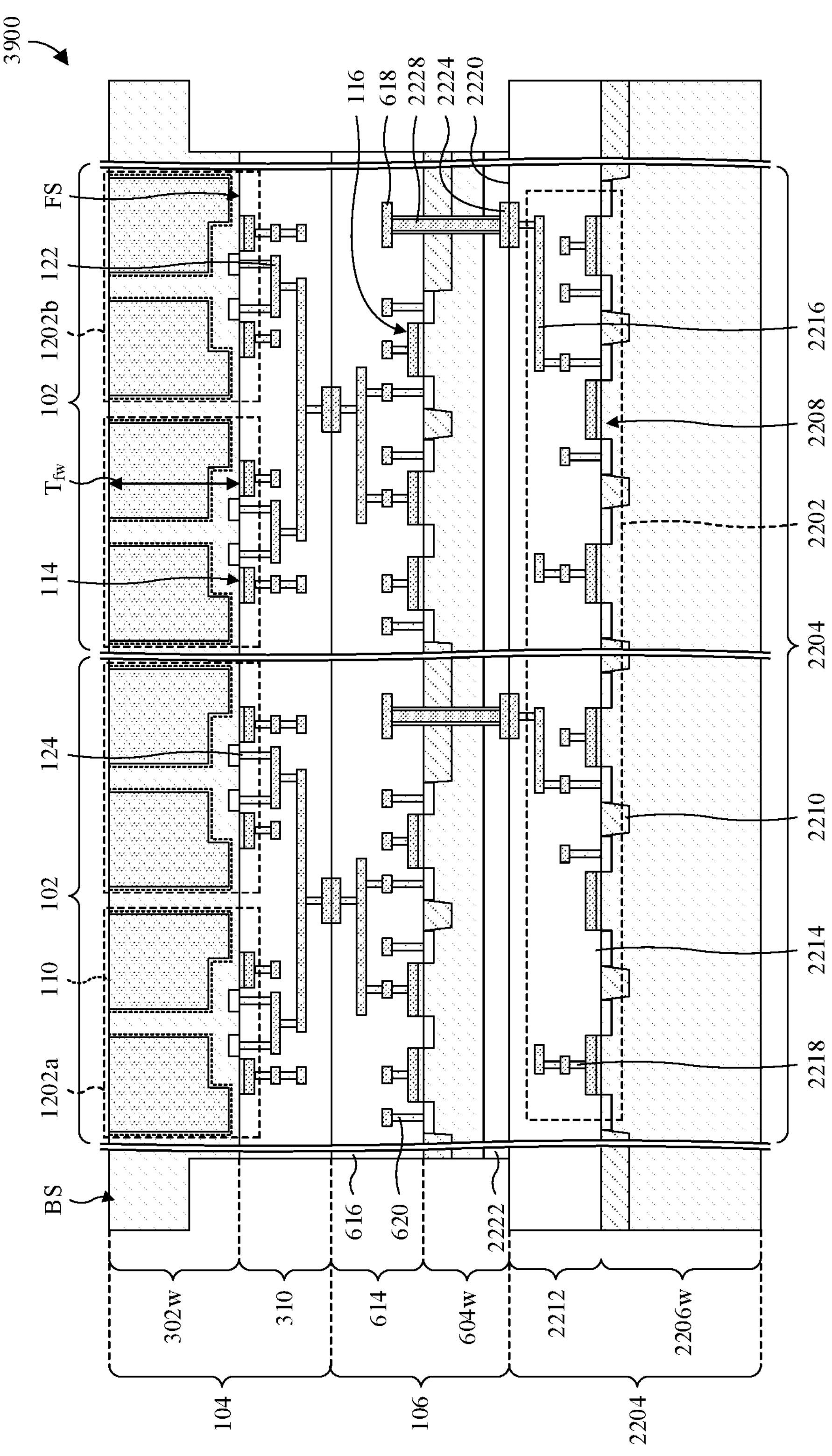

As illustrated by a cross-sectional view 3900 of FIG. 39, the first wafer 302*w* is thinned from a backside BS of the first wafer 302*w*, which is opposite the frontside FS of the first wafer 302*w*. As such, a thickness $T_{fw}$ of the first wafer 302*w* is reduced. The thinning may, for example, be performed by CMP, grinding, etching, some other suitable process, or any combination of the foregoing.

Figure 40:
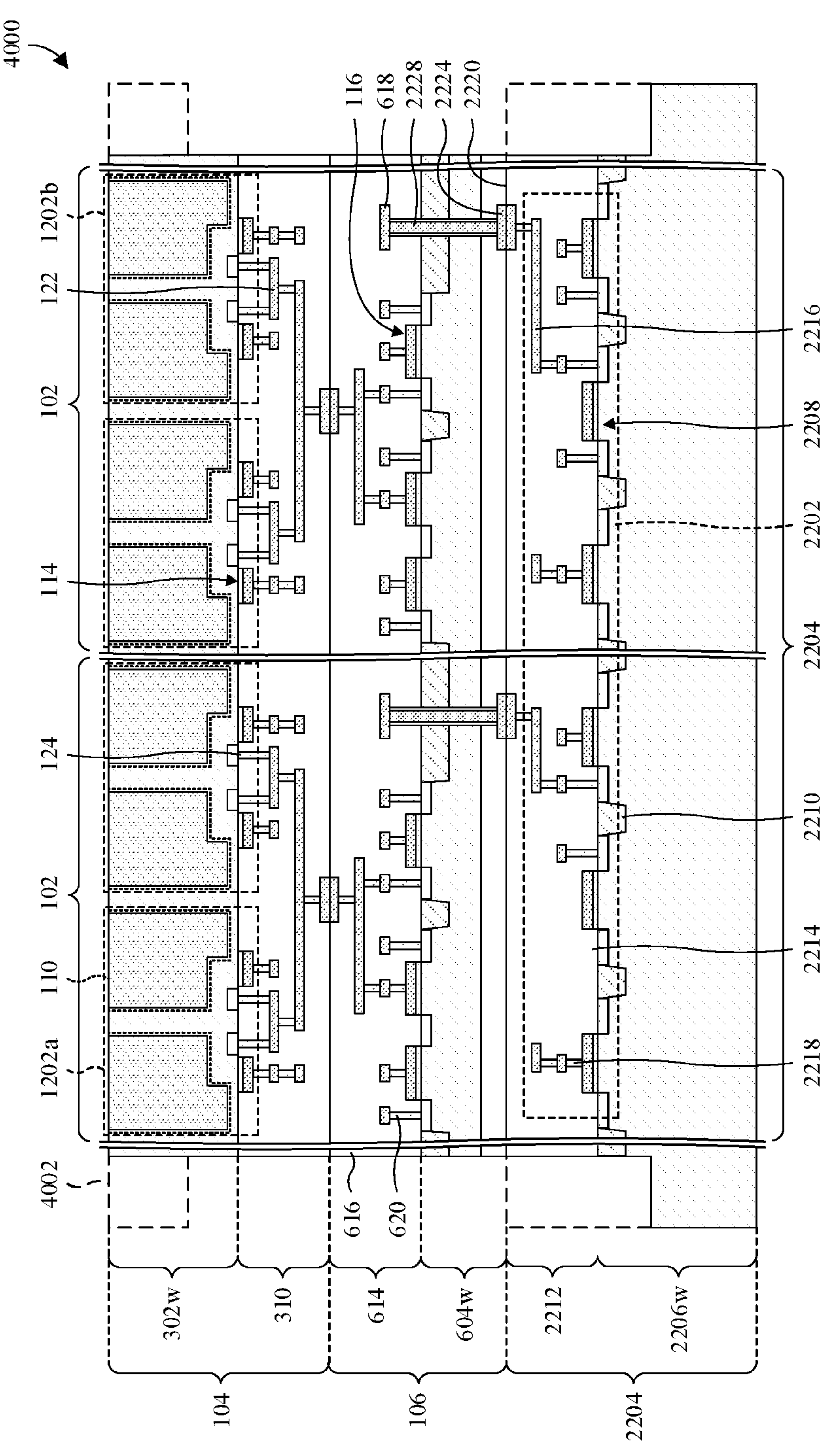

As illustrated by a cross-sectional view 4000 of FIG. 40, the three-tier semiconductor stack of FIG. 39 undergoes trimming in which edge portions 4002 are removed. The trimming may, for example, be performed by grinding, etching, some other suitable process, or any combination of the foregoing.

Figure 41:
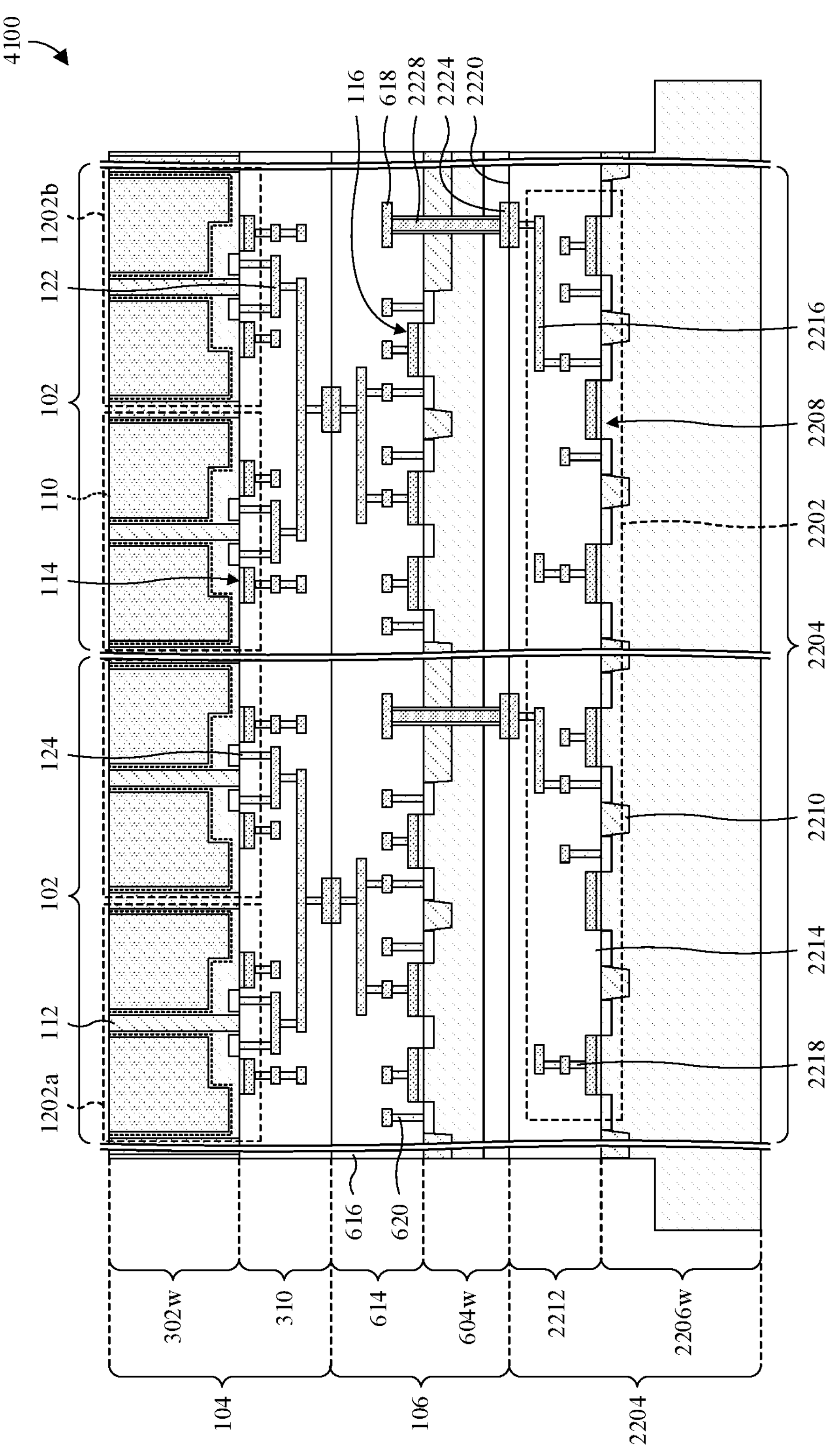

As illustrated by a cross-sectional view 4100 of FIG. 41, a DTI structure 112 is formed extending through the first wafer 302*w* to completely separate the plurality of photodetectors 110 from each other. The DTI structure 112 individually and continuously surrounds the plurality of photodetectors 110. In other words, the DTI structure 112 extends continuously in a closed path around each photodetector to individually surround that photodetector. Further, the DTI structure 112 is a full DTI structure in that the DTI structure 112 extends fully through the first wafer 302*w*.

Because the DTI structure 112 completely separates the plurality of photodetectors 110 from each other, the DTI structure 112 is devoid of an opening or cut between the plurality of photodetectors 110. Accordingly, the DTI structure 112 may provide perfect or near perfect electrical and/or optical isolation between the plurality of photodetectors 110. This reduces crosstalk between the plurality of photodetectors 110, which may, for example, enhance performance (e.g., FWC or the like) of the plurality of photodetectors 110.

The DTI structure 112 is or comprises dielectric material and, in some embodiments, comprises metal. The metal may, for example, be or comprise tungsten and/or the like. The dielectric material may, for example, be or comprise a high k dielectric material, silicon oxide (e.g., $SiO_2$), some other suitable material, or any combination of the foregoing. The dielectric material may, for example, include fixed charge (e.g., fixed negative charge or the like). The fixed charge may, for example, repel mobile charge carriers (e.g., electrons or holes) to improve electrical isolation between the plurality of photodetectors 110.

In some embodiments, the first IC die 104 is devoid of an implant isolation region separating the plurality of photodetectors 110 from each other. This may, for example, be enabled by inclusion of fixed charge in the DTI structure 112. As such, area that would otherwise be used by the implant isolation region may be used by the plurality of photodetectors 110. This allows the plurality of photodetectors 110 to be larger than they would otherwise be, which allows enhanced performance (e.g., FWC or the like) and/or scaling down.

Figure 42:
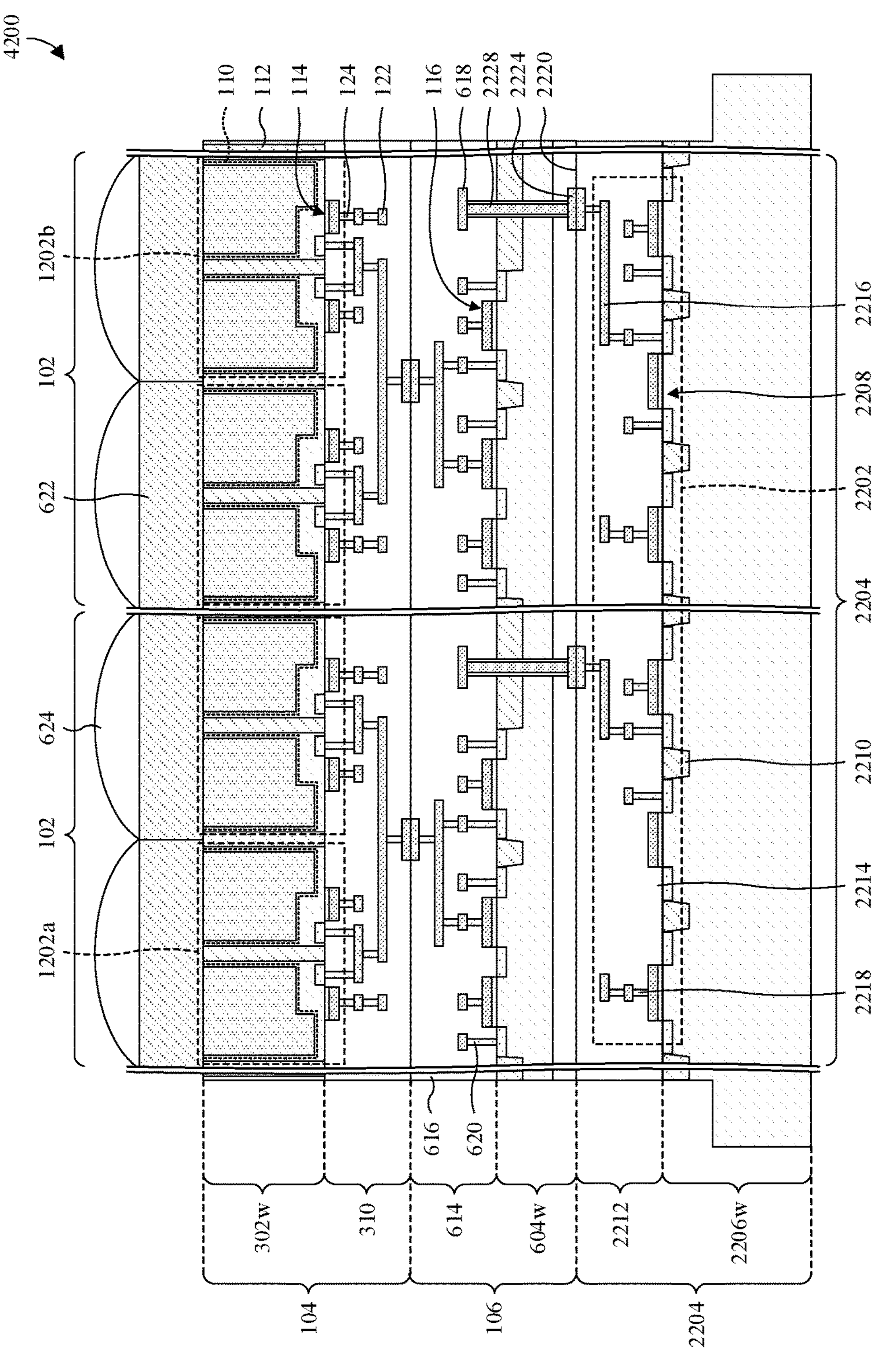

As illustrated by a cross-sectional view 4200 of FIG. 42, a plurality of color filters 622 and a plurality of micro lenses 624 are formed. Each of the plurality of color filters 622 overlies a corresponding one of the plurality of dual-PD sub-pixels, and each of the plurality of micro lenses 624 overlies a corresponding one of the plurality of color filters 622. As above, each of the plurality of pixels 102 includes a first sub-pixel 1202*a* and a second sub-pixel 1202*b*. The plurality of color filters 622 are configured to transmit first color wavelengths while blocking second color wavelengths. The plurality of micro lenses 624 are configured to focus incident radiation on the plurality of photodetectors 110 to enhance quantum efficiency.

Figure 43:
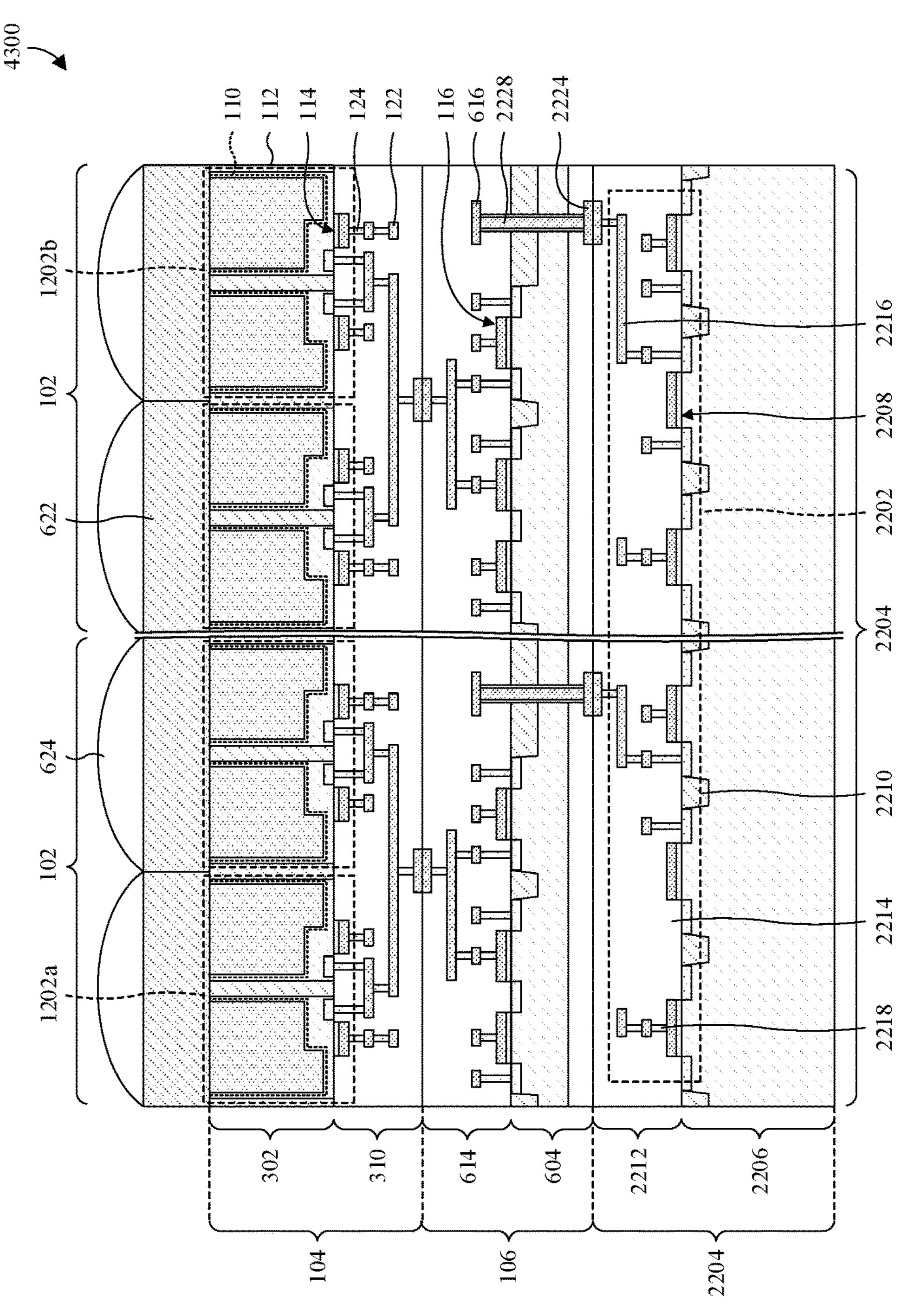

As illustrated by a cross-sectional view 4300 of FIG. 43, the three-tier semiconductor stack of FIG. 42 undergoes dicing to separate each instance of the image sensor from each other instance of the image sensor. FIG. 43 illustrates a single instance of the image sensor. The image sensor is a three-dimensional IC die comprising an instance of the first IC die 104, an instance of the second IC die 106, and an instance of the third IC die 2204 that are stacked and bonded together. Further, the dicing segments the first wafer 302*w*, the second wafer 604*w*, and the third wafer 2206*w*. The first wafer 302*w* is segmented into a first semiconductor substrate 302 for each instance of the image sensor. The second wafer 604*w* is segmented into a second semiconductor substrate 604 for each instance of the image sensor. The third wafer 2206*w* is segmented into a third semiconductor substrate 2206 for each instance of the image sensor. The dicing may, for example, be performed by a die saw and/or the like.

In some embodiments, after the dicing, the image sensor is integrated onto a circuit substrate with or without one or more other logic dies. For example, the image sensor may be mounted to a circuit substrate and then wire bonded to the circuit substrate. The circuit substrate and the wire bonding may, for example, provide electrical coupling to the one or more other logic dies, which may also be mounted on the circuit substrate.

While FIGS. 28A and 28B, 29, 30A and 30B, 31-35, 36A and 36B, and 37-43 are described with reference to a method, it will be appreciated that the structures shown in these figures are not limited to the method but rather may stand alone separate of the method. While FIGS. 28A and 28B, 29, 30A and 30B, 31-35, 36A and 36B, and 37-43 are described as a series of acts, it will be appreciated that the order of the acts may be altered in other embodiments. While FIGS. 28A and 28B, 29, 30A and 30B, 31-35, 36A and 36B, and 37-43 illustrate and describe as a specific set of acts, some acts that are illustrated and/or described may be omitted in other embodiments. Further, acts that are not illustrated and/or described may be included in other embodiments.

Figure 44:
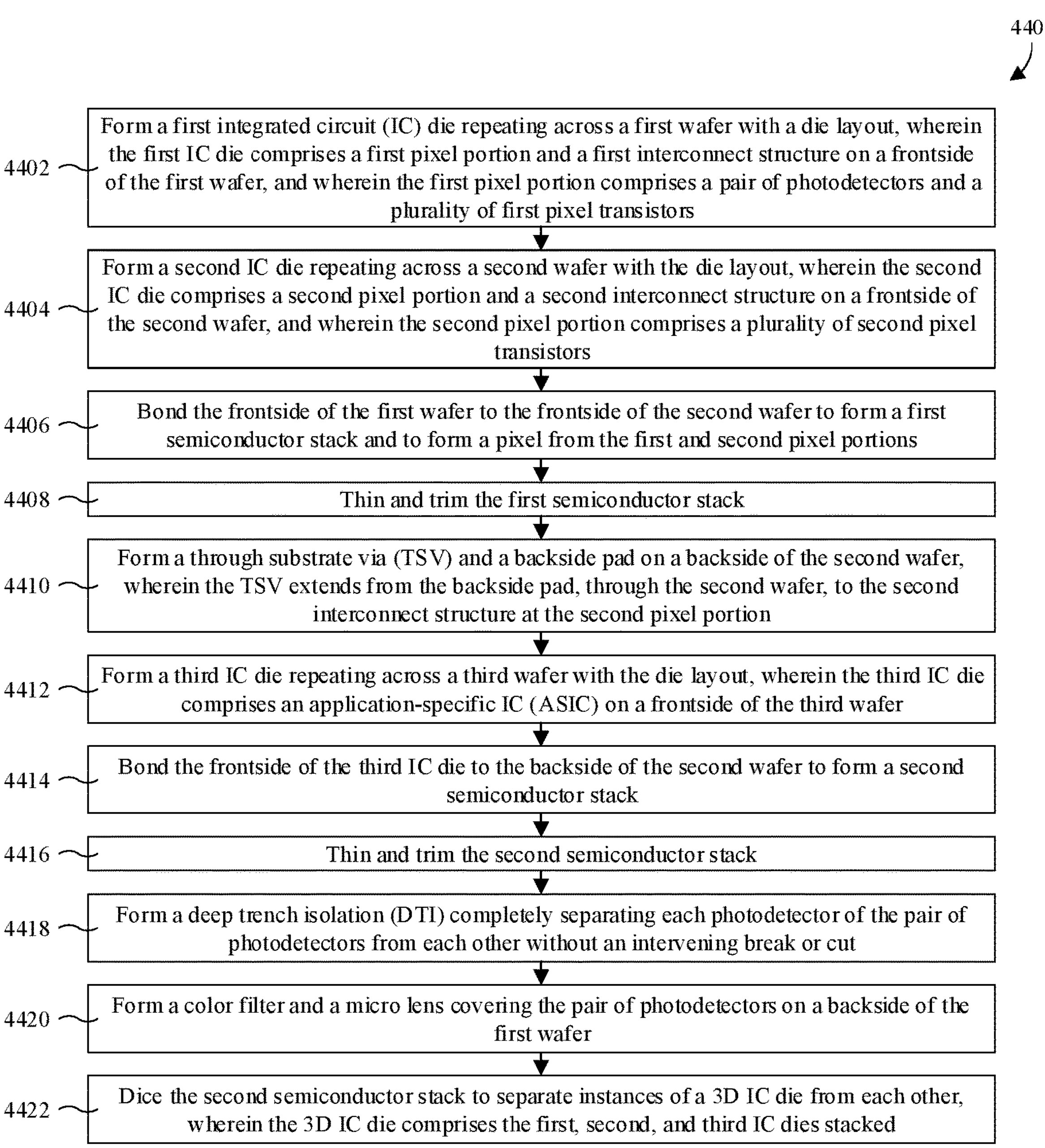
FIG. 44 illustrates a block diagram of some embodiments of the method of FIGS. 28A and 28B, 29, 30A and 30B, 31-35, 36A and 36B, and 37-43.

With reference to FIG. 44, a block diagram 4400 of some embodiments of the method of FIGS. 28A and 28B, 29, 30A and 30B, 31-35, 36A and 36B, and 37-43 is provided.

At act 4402, a first IC die is formed repeating across a first wafer with a die layout. The first IC die comprises a first pixel portion and a first interconnect structure on a frontside of the first wafer, and wherein the first pixel portion comprises a pair of photodetectors and a plurality of first pixel transistors. See, for example, FIGS. 28A and 28B to FIG. 29.

At act 4404, a second IC die is formed repeating across a second wafer with the die layout, wherein the second IC die comprises a second pixel portion and a second interconnect structure on a frontside of the second wafer, and wherein the second pixel portion comprises a plurality of second pixel transistors. See, for example, FIGS. 30A and 30B to FIG. 31.

At act 4406, the frontside of the first wafer is bonded to the frontside of the second wafer to form a first semiconductor stack and to form a pixel from the first and second pixel portions. See, for example, FIG. 32.

At act 4408, the first semiconductor stack is thinned and trimmed. See, for example, FIGS. 33 and 34.

At act 4410, a TSV and a backside pad are formed on a backside of the second wafer, wherein the TSV extends from the backside pad, through the second wafer, to the second interconnect structure at the second pixel portion. See, for example, FIG. 35.

At act 4412, a third IC die is formed repeating across a third wafer with the die layout, wherein the third IC die comprises an ASIC on a frontside of the third wafer. See, for example, FIGS. 36A and 36B to FIG. 37.

At act 4414, the frontside of the third IC die is bonded to the backside of the second wafer to form a second semiconductor stack. See, for example, FIG. 38.

At act 4416, the second semiconductor stack is thinned and trimmed. See, for example, FIGS. 39 and 40.

At act 4418, a DTI structure is formed completely separating each photodetector of the pair of photodetectors from each other without an intervening break or cut. See, for example, FIG. 41.

At act 4420, a color filter and a micro lens are formed covering the pair of photodetectors on a backside of the first wafer. See, for example, FIG. 42.

At act 4422, the second semiconductor stack is diced to separate instances of a 3D IC die from each other, wherein the 3D IC die comprises the first, second, and third IC dies stacked. See, for example, FIG. 43.

While the block diagram 4400 of FIG. 44 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides an image sensor, including: a first IC die; a second IC die stacked with the first IC die; a pixel spanning the first and second IC dies, wherein the pixel includes a plurality of photodetectors and a plurality of first pixel transistors in the first IC die, and further includes a plurality of second pixel transistors in the second IC die, and wherein the plurality of first pixel transistors are individual to and respectively border the plurality of photodetectors; and a DTI structure separating the plurality of photodetectors from each other. In some embodiments, the first IC die includes a semiconductor substrate in which the plurality of photodetectors are arranged, wherein the DTI structure extends completely through the semiconductor substrate and individually surrounds each of the plurality of photodetectors. In some embodiments, the image sensor further includes a third IC die stacked with the first IC die and the second IC die, such that the second IC die is between and bonded to the first IC die and the third IC die. In some embodiments, the first and second IC dies include individual semiconductor substrates and individual interconnect structures, wherein the individual interconnect structures are between the individual semiconductor substrates and directly contact at a bond interface, and wherein the individual interconnect structures include individual stacks of wires and vias. In some embodiments, the plurality of first pixel transistors includes a transfer transistor, wherein the first IC die includes: a conductive wire overlapping with and spaced from the transfer transistor; and a conductive via extending from the conductive wire to the transfer transistor. In some embodiments, the pixel includes one or more sub-pixels, each sub-pixel including an adjoining pair of photodetectors from the plurality of photodetectors. In some embodiments, the pixel repeats in a plurality of rows and a plurality of columns, wherein the second IC die includes a plurality of column lines extending from a column circuit and elongated in parallel in a direction, wherein the column circuit includes a column decoder and sense amplifiers, and wherein the adjoining pair of photodetectors of each sub-pixel border in the direction. In some embodiments, the plurality of first pixel transistors have individual first source/drain regions respectively defined by the plurality of photodetectors, and further have individual second source/drain regions, wherein the first IC die includes an interconnect structure that electrically couples the individual second source/drain regions together.

In some embodiments, the present disclosure provides another image sensor, including: a first semiconductor substrate; a pair of photodetectors bordering in the first semiconductor substrate; a trench isolation structure in the first semiconductor substrate, wherein the trench isolation structure extends through the first semiconductor substrate and extends in separate closed paths to individually surround the pair of photodetectors; a pair of first pixel transistors respectively bordering the pair of photodetectors on an underside of the first semiconductor substrate; a second semiconductor substrate underlying the pair of first pixel transistors; a plurality of second pixel transistors atop the second semiconductor substrate; and a plurality of wires and a plurality of vias alternatingly stacked between the pair of first pixel transistors and the plurality of second pixel transistors; wherein the pair of photodetectors, the pair of first pixel transistors, and the plurality of second pixel transistors are individual to and form a pixel. In some embodiments, the pixel has a total number of transistors on the first semiconductor substrate, and further has a total number of photodetectors in the first semiconductor substrate, wherein the total number of transistors is a same as the total number of photodetectors. In some embodiments, the first semiconductor substrate is devoid of an implant isolation region isolating the pair of photodetectors from each other. In some embodiments, each of the pair of first pixel transistors includes a source/drain region, wherein the plurality of vias include a via individual to and extending from the source/drain region of each of the pair of first pixel transistors. In some embodiments, the image sensor further includes: an additional pair of photodetectors bordering in the first semiconductor substrate; and an additional pair of first pixel transistors respectively bordering the additional pair of photodetectors on an underside of the first semiconductor substrate; wherein the additional pair of photodetectors and the additional pair of first pixel transistors are individual to and further form the pixel. In some embodiments, the plurality of wires include a wire electrically coupled to a source/drain region of each of the pair of first pixel transistors and a source/drain region of each of the additional pair of first pixel transistors.

In some embodiments, the present disclosure provides a method for forming an image sensor, including: forming a first IC die, including: forming a plurality of photodetectors in a first substrate; and forming a plurality of first pixel transistors on the first substrate, individual to and respectively bordering the plurality of photodetectors, wherein plurality of photodetectors and the plurality of first pixel transistors form a first pixel portion; forming a second IC die, including: forming a plurality of second pixel transistors on a second substrate, wherein the second pixel transistors form a second pixel portion; bonding the first IC die and the second IC die together such that the first pixel portion and the second pixel portion are stacked and electrically coupled together to form a pixel; and forming a DTI structure extending through the first substrate and separating the plurality of photodetectors from each other after the bonding. In some embodiments, the forming of the first IC die further includes: forming an interconnect structure overlying and electrically coupled to the plurality of first pixel transistors, wherein the interconnect structure includes a plurality of wires and a plurality of vias alternatingly stacked. In some embodiments, the forming of the first IC die includes repeatedly forming the first pixel portion, wherein the forming of the second IC die includes repeatedly forming the second pixel portion. In some embodiments, the bonding includes bonding conductors respectively of the first and second IC dies together at an interface and bonding dielectric layers respectively of the first and second IC dies together at the interface. In some embodiments, the method further includes: forming a third IC die, including: forming a plurality of logic devices on a third substrate; and forming an interconnect structure overlying and electrically coupled the logic devices, wherein the logic devices and the interconnect structure form an ASIC; and bonding the second IC die and the third IC die together, such that the second IC die is between the first IC die and the third IC die and such that the ASIC is electrically coupled to the pixel. In some embodiments, the forming of the DTI structure includes forming a metal core lined by a dielectric liner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, comprising:
- forming a first integrated circuit (IC) die, comprising:
  - forming a plurality of photodetectors in a first substrate;
  - forming a plurality of first pixel transistors on the first substrate, individual to and respectively bordering the plurality of photodetectors, wherein the plurality of photodetectors and the plurality of first pixel transistors form a first pixel portion; and
  - forming an interconnect structure overlying the plurality of first pixel transistors and electrically coupling individual source/drain regions of the plurality of first pixel transistors together;
- forming a second IC die, comprising:
  - forming a plurality of second pixel transistors on a second substrate, wherein the second pixel transistors form a second pixel portion;
- bonding the first IC die and the second IC die together such that the first pixel portion and the second pixel portion are stacked and electrically coupled together to form a pixel; and
- forming a deep trench isolation (DTI) structure extending through the first substrate and separating the plurality of photodetectors from each other after the bonding.

2. The method according to claim 1, wherein the bonding comprises bonding conductors respectively of the first and second IC dies together at an interface and bonding dielectric layers respectively of the first and second IC dies together at the interface.

3. The method according to claim 1, further comprising:
- forming a third IC die, comprising:
  - forming a plurality of logic devices on a third substrate; and
  - forming an interconnect structure overlying and electrically coupled to the logic devices, wherein the logic devices and the interconnect structure form an application-specific integrated circuit (ASIC); and
  - bonding the second IC die and the third IC die together, such that the second IC die is between the first IC die and the third IC die and such that the ASIC is electrically coupled to the pixel.

4. The method according to claim 1, wherein the forming of the DTI structure comprises forming a metal core lined by a dielectric liner.

5. The method according to claim 1, further comprising:
- forming a micro lens overlying the plurality of photodetectors on an opposite side of the first substrate as the second IC die.

6. The method according to claim 1, wherein the interconnect structure comprises a conductive wire and a plurality of conductive vias extending from the conductive wire respectively to the individual source/drain regions of the plurality of first pixel transistors.

7. The method according to claim 6, wherein the conductive wire has a ring-shaped top geometry.

8. A method for forming an image sensor, comprising:
- forming a first semiconductor structure, which comprises a pair of photodetectors in a first substrate;
- forming a second semiconductor structure, which comprises a plurality of pixel transistors on a second substrate;
- bonding the first semiconductor structure and the second semiconductor structure together, such that the pair of photodetectors and the plurality of pixel transistors form a pixel;
- forming a trench isolation structure extending completely through the first substrate and completely separating the pair of photodetectors from each other; and
- forming a color filter shared by and overlying both of the pair of photodetectors on an opposite side of the first substrate as the second semiconductor structure.

9. The method according to claim 8, wherein the method further comprises:
- performing a first planarization into the second substrate after the bonding and before the forming of the trench isolation structure to reduce a thickness of the second substrate.

10. The method according to claim 9, wherein the method further comprises:

performing a second planarization into the first substrate after the first planarization and before the forming of the trench isolation structure to reduce a thickness of the first substrate.

11. The method according to claim 8, wherein the first semiconductor structure further comprises a pair of transfer transistors that further form the pixel and that are individual to and respectively border the pair of photodetectors, wherein the pair of photodetectors comprise individual collector regions buried in the first substrate and having a same doping type as individual source/drain regions of the pair of transfer transistors, and wherein the method further comprises:

performing a planarization into the first substrate before the forming of the trench isolation structure to expose the pair of collector regions.

12. The method according to claim 8, wherein the pair of photodetectors comprise a first photodetector and a second photodetector that are formed bordering each other and having individual top profiles stepping down towards a width-wise center between the first and second photodetectors, and wherein the trench isolation structure is formed extending completely through the first substrate at the width-wise center.

13. The method according to claim 8, wherein the first semiconductor structure further comprises a pair of transfer transistors further forming the pixel and individual to and respectively bordering the pair of photodetectors, and wherein the forming of the first semiconductor structure comprises forming a ring-shaped conductive wire overlying and electrically coupled to individual source/drain regions of the pair of transfer transistors.

14. The method according to claim 13, wherein the first semiconductor structure further comprises an additional pair of photodetectors in the first substrate and an additional pair of transfer transistors, wherein the additional pair of photodetectors and the additional pair of transfer transistors further form the pixel, and wherein the forming of the first semiconductor structure further comprises forming an additional ring-shaped conductive wire overlying and electrically coupled to individual source/drain regions of the additional pair of transfer transistors.

15. A method for forming an image sensor, comprising:

forming a first integrated circuit (IC) die comprising a plurality of photodetectors and a plurality of transfer transistors, wherein the plurality of photodetectors and source/drain regions of the plurality of transfer transistors are in a first substrate;

forming a second IC die comprising a plurality of pixel transistors on a second substrate;

bonding the second IC die to the first substrate to form a pixel that comprises the plurality of photodetectors, the plurality of transfer transistors, and the plurality of pixel transistors;

forming a third IC die comprising a plurality of logic transistors;

bonding the third IC die to the second IC die on an opposite side of the second IC die as the first IC die; and forming a trench isolation structure extending through the first substrate after the bonding of the third IC die, wherein the trench isolation structure separates the source/drain regions of the plurality of transfer transistors from each other.

16. The method according to claim 15, wherein the first IC die repeats across a first wafer, the second IC die repeats across a second wafer, and the third IC die repeats across a third wafer, and wherein the bonding of the second IC die and the bonding of the third IC die correspond to wafer-to-wafer bonding.

17. The method according to claim 16, further comprising:

dicing the first, second, and third wafers to separate the first, second, and third IC dies from remainders of the first, second, and third wafers.

18. The method according to claim 16, further comprising:

performing a first trimming process to remove edge portions of the second wafer, such that a width of the second wafer is less than a width of the first wafer, wherein the first trimming process is performed before the bonding of the third IC die; and performing a second trimming process to remove edge portions of the first wafer, such that a width of the first wafer is less than a width of the third wafer, wherein the second trimming process is performed before the forming of the trench isolation structure.

19. The method according to claim 15, wherein the plurality of photodetectors comprise individual collector regions formed buried in the first substrate, and wherein the plurality of transfer transistors are formed respectively overlying the individual collector regions and having individual source/drain regions with a same doping type as the individual collector regions.

20. The method according to claim 19, wherein the individual source/drain regions are formed respectively overlying the individual collector regions.

* * * * *